(12) United States Patent
Brown et al.

(10) Patent No.: US 9,397,382 B2
(45) Date of Patent: Jul. 19, 2016

(54) LOGARITHMIC AMPLIFIER WITH UNIVERSAL DEMODULATION CAPABILITIES

(71) Applicant: DockOn AG, Zurich (CH)

(72) Inventors: Forrest Brown, Carson City, NV (US); Patrick Rada, San Jose, CA (US); Alexandre Dupuy, San Diego, CA (US)

(73) Assignee: DOCKON AG, Zurich (CH)

( * ) Notice: Subject to any disclaimer, the term of this patent is extended or adjusted under 35 U.S.C. 154(b) by 0 days.

(21) Appl. No.: 14/214,437

(22) Filed: Mar. 14, 2014

(65) Prior Publication Data

US 2014/0266420 A1    Sep. 18, 2014
US 2016/0173050 A9    Jun. 16, 2016

Related U.S. Application Data

(60) Provisional application No. 61/789,829, filed on Mar. 15, 2013.

(51) Int. Cl.
*H03D 11/08* (2006.01)
*H01P 5/19* (2006.01)
(Continued)

(52) U.S. Cl.
CPC .. *H01P 5/19* (2013.01); *H01Q 7/00* (2013.01); *H01Q 21/0075* (2013.01); *H03D 1/08* (2013.01);
(Continued)

(58) Field of Classification Search
CPC ............. H03D 11/00–11/08; H03D 1/00; H03D 1/02; H03D 1/06; H03D 1/18; H03D 2200/0098; H03G 7/001; H03G 7/06; G06G 7/24

USPC ............. 329/347, 349, 352, 353, 369, 367; 327/350; 331/174; 455/336
See application file for complete search history.

(56) References Cited

U.S. PATENT DOCUMENTS 1,424,065 A    7/1922   Armstrong
2,363,651 A    11/1944  Crosby
(Continued)

FOREIGN PATENT DOCUMENTS

EP    1384281 A2   1/2004
GB    2354329 A    3/2001
(Continued)

OTHER PUBLICATIONS

Insam, "Designing Super-Regenerative Receivers", Electronics World, Apr. 2002, retrieved from http://www.eix.co.uk/Articles/Radio/Welcome.htm.*

(Continued)

*Primary Examiner* — Ryan Johnson
(74) *Attorney, Agent, or Firm* — Baker & Hostetler LLP

(57) ABSTRACT

A logarithmic amplifier (LDA) is described that includes an amplifier configured to oscillate a modulated input signal, a feedback establishing a 180 degree phase shift between the amplifier input and the output and maintaining oscillation of the input signal, a parallel resonant circuit connected to the amplifier output causing the amplifier to resonate at or around a center frequency, and a controller connected to the amplifier input cyclically terminating oscillation of the input signal each time a pre-determined threshold of current is detected, the controller including a low pass filter configured to generate a second output signal having a repetition frequency. The LDA may be used for AM with or without a PLL and/or a superhetrodyne. The LDA may be implemented as a mixer and used for phase demodulation. The LDA may be used for phase demodulation. The LDA may be used in place of a low noise amplifier.

30 Claims, 45 Drawing Sheets

(51) Int. Cl.
*H03D 1/08* (2006.01)
*H03D 11/04* (2006.01)
*H01Q 7/00* (2006.01)
*H01Q 21/00* (2006.01)
*H03D 1/18* (2006.01)
*H03D 7/02* (2006.01)
*H03D 7/12* (2006.01)
*H03D 7/16* (2006.01)
*H03F 3/191* (2006.01)
*H03F 1/08* (2006.01)
*H03F 3/04* (2006.01)

(52) U.S. Cl.
CPC . *H03D 1/18* (2013.01); *H03D 7/02* (2013.01); *H03D 7/12* (2013.01); *H03D 7/165* (2013.01); *H03D 7/166* (2013.01); *H03D 11/04* (2013.01); *H03D 11/08* (2013.01); *H03F 1/08* (2013.01); *H03F 3/04* (2013.01); *H03F 3/191* (2013.01); *H03D 2200/0043* (2013.01); *H03D 2200/0098* (2013.01); *H03F 2200/165* (2013.01); *H03F 2200/294* (2013.01)

(56) References Cited

U.S. PATENT DOCUMENTS

| | | |
|---|---|---|
| 2,644,081 A | 6/1953 | Donald |
| 3,092,779 A | 6/1963 | De Niet |
| 3,199,031 A | 8/1965 | Harris et al. |
| 3,320,530 A | 5/1967 | Pearman |
| 3,337,807 A * | 8/1967 | Brown ............ 455/336 |
| 3,602,819 A | 8/1971 | Abbott et al. |
| 3,668,535 A | 6/1972 | Lansdowne |
| 3,724,954 A | 4/1973 | Dreyfoos, Jr. |
| 3,791,272 A | 2/1974 | Nobusawa |
| 3,965,426 A | 6/1976 | Ringland |
| 4,034,298 A | 7/1977 | McFadyen et al. |
| 4,042,883 A | 8/1977 | Rae |
| 4,160,953 A | 7/1979 | Matsuura et al. |
| 4,393,514 A * | 7/1983 | Minakuchi et al. ........... 455/336 |
| 4,510,624 A | 4/1985 | Thompson et al. |
| 4,609,994 A | 9/1986 | Bassim et al. |
| 4,660,192 A | 4/1987 | Pomatto |
| 4,882,768 A | 11/1989 | Obana et al. |
| 4,972,512 A | 11/1990 | Garskamp |
| 4,979,186 A | 12/1990 | Fullerton |
| 5,479,442 A | 12/1995 | Yamamoto |
| 5,621,756 A | 4/1997 | Bush et al. |
| 5,771,026 A | 6/1998 | Stengel |
| 5,789,996 A | 8/1998 | Borodulin |
| 5,995,814 A | 11/1999 | Yeh |
| 6,035,002 A | 3/2000 | Schleifer |
| 6,054,900 A | 4/2000 | Ishida et al. |
| 6,389,275 B1 | 5/2002 | Kawashima et al. |
| 6,420,937 B1 | 7/2002 | Akatsuka et al. |
| 6,421,535 B1 | 7/2002 | Dickerson et al. |
| 6,518,856 B1 | 2/2003 | Casale et al. |
| 6,538,528 B2 | 3/2003 | Louzir et al. |
| 6,574,287 B1 * | 6/2003 | Swaminathan et al. ...... 375/320 |
| 6,668,165 B1 * | 12/2003 | Cloutier ........................ 455/336 |
| 6,668,619 B2 | 12/2003 | Yang et al. |
| 6,670,849 B1 | 12/2003 | Damgaard et al. |
| 7,215,936 B2 | 5/2007 | Sadowski |
| 7,400,904 B2 | 7/2008 | Cornwall et al. |
| 7,423,931 B2 | 9/2008 | Martin et al. |
| 7,567,099 B2 | 7/2009 | Edwards et al. |
| 7,612,616 B2 | 11/2009 | Deng |
| 7,751,857 B2 | 7/2010 | Beumer et al. |
| 7,751,996 B1 | 7/2010 | Ardizzone et al. |
| 7,819,022 B2 | 10/2010 | Hope |
| 7,848,384 B2 | 12/2010 | Pelissier et al. |
| 7,911,235 B2 | 3/2011 | Brown |
| 8,040,204 B2 | 10/2011 | Brown |
| 8,064,864 B2 | 11/2011 | Rofougaran |
| 8,144,065 B2 | 3/2012 | Brown |
| 8,149,173 B2 | 4/2012 | Brown |
| 8,164,532 B1 | 4/2012 | Brown |
| 8,265,769 B2 | 9/2012 | Denison |
| 8,326,340 B2 | 12/2012 | Nalbantis et al. |
| 8,364,098 B2 | 1/2013 | Ridgers |
| 8,368,485 B2 | 2/2013 | Brown |
| 8,462,031 B2 | 6/2013 | Belot et al. |
| 8,542,768 B2 | 9/2013 | Kim et al. |
| 8,644,776 B1 | 2/2014 | Nobbe et al. |
| 8,676,521 B2 | 3/2014 | Vennelakanti et al. |
| 2002/0109607 A1 | 8/2002 | Cumeralto et al. |
| 2004/0229585 A1 | 11/2004 | Lu et al. |
| 2004/0240588 A1 | 12/2004 | Miller |
| 2005/0009480 A1 | 1/2005 | Vakilian et al. |
| 2005/0069051 A1 | 3/2005 | Lourens |
| 2005/0270172 A1 | 12/2005 | Bailey et al. |
| 2006/0028297 A1 | 2/2006 | Kang et al. |
| 2006/0226897 A1 | 10/2006 | Ruijter |
| 2007/0030099 A1 | 2/2007 | Carpentier et al. |
| 2007/0066265 A1 | 3/2007 | May |
| 2007/0105521 A1 | 5/2007 | Granata |
| 2007/0139130 A1 | 6/2007 | Kim et al. |
| 2007/0207749 A1 | 9/2007 | Rozenblit et al. |
| 2008/0101185 A1 | 5/2008 | Rozenblit et al. |
| 2008/0176529 A1 | 7/2008 | Lau |
| 2008/0269841 A1 | 10/2008 | Grevious et al. |
| 2009/0079524 A1 | 3/2009 | Cyr et al. |
| 2009/0079607 A1 | 3/2009 | Denison et al. |
| 2009/0147837 A1 | 6/2009 | Lau |
| 2009/0322544 A1 | 12/2009 | McDowell |
| 2010/0080270 A1 | 4/2010 | Chen et al. |
| 2010/0152644 A1 | 6/2010 | Pesach et al. |
| 2010/0225417 A1 | 9/2010 | Mistretta et al. |
| 2010/0308999 A1 | 12/2010 | Chornenky |
| 2010/0313958 A1 | 12/2010 | Patel et al. |
| 2011/0007844 A1 | 1/2011 | Park et al. |
| 2011/0018777 A1 | 1/2011 | Brown |
| 2011/0037516 A1 | 2/2011 | Nejati et al. |
| 2011/0093220 A1 | 4/2011 | Yang et al. |
| 2011/0212692 A1 | 9/2011 | Hahn et al. |
| 2011/0234316 A1 | 9/2011 | Kim et al. |
| 2011/0301882 A1 | 12/2011 | Andersen |
| 2012/0019336 A1 | 1/2012 | Khan et al. |
| 2012/0106560 A1 | 5/2012 | Gumaste |
| 2012/0112852 A1 | 5/2012 | Manssen et al. |
| 2012/0121030 A1 | 5/2012 | Luo et al. |
| 2012/0164644 A1 | 6/2012 | Neely et al. |
| 2012/0190317 A1 | 7/2012 | Martineau et al. |
| 2012/0280754 A1 | 11/2012 | Gorbachov |
| 2013/0029350 A1 | 1/2013 | Cooper et al. |
| 2013/0059548 A1 | 3/2013 | Umeda et al. |
| 2013/0113666 A1 | 5/2013 | Orsi et al. |
| 2013/0128934 A1 | 5/2013 | Kang et al. |
| 2013/0222058 A1 | 8/2013 | Maniwa et al. |
| 2014/0150554 A1 | 6/2014 | Rada et al. |
| 2014/0154991 A1 | 6/2014 | Brown et al. |
| 2014/0171002 A1 | 6/2014 | Park et al. |
| 2014/0266962 A1 | 9/2014 | Dupuy et al. |
| 2014/0269972 A1 | 9/2014 | Rada et al. |
| 2014/0273898 A1 | 9/2014 | Brown et al. |
| 2014/0287704 A1 | 9/2014 | Dupuy et al. |

FOREIGN PATENT DOCUMENTS

| | | | |
|---|---|---|---|
| JP | 56-138340 A | | 10/1981 |
| JP | 56138342 A | * | 10/1981 |
| JP | S 60-249436 A | | 12/1985 |
| JP | 10-075273 A | | 3/1998 |
| WO | WO 00/35124 A2 | | 6/2000 |
| WO | WO 02/084782 A2 | | 10/2002 |
| WO | WO 2008/075066 A2 | | 6/2008 |
| WO | WO 2012/153147 A1 | | 11/2012 |

OTHER PUBLICATIONS

U.S. Appl. No. 14/213,529, filed Mar. 14, 2014, Rada et al.
U.S. Appl. No. 14/216,945, filed Mar. 17, 2014, Rada et al.
Sanders B.J.; "Radical Combiner Runs Circles Around Hybrids," MicroWaves; Nov. 1980; vol. 19, No. 12; p. 55-58.

(56) References Cited

OTHER PUBLICATIONS

Caloz et al.;"Metamaterials for High-Frequency Electronics"; Proceedings of the IEEE; vol. 93; No. 10; Oct. 2005; p. 1744-1752.

International Patent Application No. PCT/US2014/29832; Int'l Preliminary Report on Patentability; dated Mar. 11, 2015; 7 pages.
International Patent Application No. PCT/US2014/029577; Int'l Preliminary Report on Patentability; dated Jun. 19, 2015; 17 pages.

\* cited by examiner

LOGARITHMIC AMPLIFIER WITH UNIVERSAL DEMODULATION CAPABILITIES

CROSS REFERENCE TO RELATED APPLICATIONS

The present application claims the benefit of U.S. Provisional Application 61/789,829, filed Mar. 15, 2013, entitled "Frequency Selective Logarithmic Amplifier With Intrinsic Frequency Demodulation Capability," the contents of which are herein incorporated by reference in their entirety.

TECHNICAL FIELD

The present disclosure relates to regenerative selective logarithmic detector amplifiers (LDA).

BACKGROUND

The present disclosure relates to improvements to and novel applications for the LDA. The LDA was first described in U.S. Pat. No. 7,911,235.

The LDA of the present disclosure is similar in some respects to super-regenerative receivers (SRO) in terms of circuit topology. SROs are amplitude sensitive regeneration devices. SROs also have external quenching and high gain. The SRO was first described in U.S. Pat. No. 1,424,065. SROs typically suffer from poor selectivity and higher output noise when used for narrow band signals. SROs also may drift in temperature when the oscillator is LC based. The SRO receiver was quickly replaced by the super-heterodyne receiver for mainstream radio, because the latter has superior selectivity and sensitivity. However, the SRO is simple and low power, and has been used over many decades for remote control systems, short distance telemetry, and wireless security. Selectivity and drift limitations have been addressed through the use of surface acoustic wave (SAW) devices. In the first decade of the 21st century, there has been a renewed interest in SROs for use in low power receivers up to the GHz range, and for moderate to high data rate applications.

The receive sensitivity of an SRO at 1 MHz bandwidth is in the medium to high range, in the order of −80 dBm to −90 dBm. The dynamic range (minimum to maximum signal level range) of an SRO is medium, in the order of 20 to 60 dB. SROs are not able to demodulate phase modulation (PM) intrinsically or otherwise. SROs are not able to reduce noise. SROs can be placed anywhere in the receive chain, but with a loss of receive sensitivity, unless placed upfront. SROs are externally quenched (or synchronized). The amplification mode of an SRO is amplitude sensitive regeneration. The circuit topology is generally Colpitt oscillator-based. The gain of an SRO is high.

The present disclosure also has some similarities to DC or baseband log amps, which tend to provide logarithmic amplification over a wide dynamic range. Baseband log amps are based on multiple Gilbert cells, and typically provide a good linearity over a mid to large dynamic range at low to high frequencies. Simpler logarithmic amplifiers (e.g., DC log amps) are based on transistor logarithmic current versus voltage transfer characteristics, and address applications ranging from DC to low frequency.

The receive sensitivity of log amps at 1 MHz bandwidth is in the medium to high range, in the order of −80 dBm to −90 dBm. The dynamic range (minimum to maximum signal level range) of a log amp is high, in the order of 40 to 90 dB. Log amps are not able to demodulate PM directly or indirectly. Log amps are not able to reduce noise. Log amps are not used in the receive chain and do not involve quenching. The amplification mode of log amp is multiple amplification. The circuit topology is typically multi-stage Gilbert cells. The gain of a log amp is high to very high, in the order of 30 to 70 dB.

Hence, neither SROs nor log amps have the ability to intrinsically demodulate phase, amplitude and phase, frequency and amplitude and frequency with high skirt ratio, very high sensitivity and noise suppression, very high dynamic range, superior discrimination, and flexible placement in a receiver chain without drawback.

Additional methods have been developed to process a weak signal buried in noise, such as averaging, selective amplification, filtering, synchronized detection, spread spectrum and nonlinear RAMAN optic amplifier.

In averaging, noise is reduced over n periods; however the signal is not amplified. Also averaging requires an accurate trigger for reference, and this trigger may be noisy and problematic at low signal levels.

In selective amplification and/or filtering, the amplification and/or filtering are frequency dependent and stationary, so they do not provide any improvement over time in the frequency pass band, nor do they reduce the noise in that pass band. This is problematic if the bandwidth is large. Also, selective amplifiers have a limited noise rejection.

In synchronized detection, a phase lock loop (PLL) is required to lock it to the input signal, which selectivity implies a narrow band unless more complicated methods are used. This method may also be problematic at very low signal levels.

In Direct Sequence-Spread Spectrum (DS-SS), bits are spread over a wide frequency spectrum during the transmitting modulation process, and are eventually communicated over a lossy medium. The receiver dispreads energy and makes the demodulated signal appear much above the noise floor (e.g., GPS with a typical spreading factor of one thousand). This methods allows very high attenuation to be overcome, but this method requires a DS-SS transmitter that is not practical for many applications.

In a RAMAN distributed optic amplifier, the Signal-to-Noise-Ratio (SNR) can be improved and data can be transported through fiber optic lines over hundreds or thousands of kilometers with only minimum regeneration, but the solution is limited to optic applications.

SUMMARY

The present disclosure relates to a regenerative logarithmic detector amplifier (LDA), with integrated amplitude modulation (AM) and phase modulation (PM) with the adjunction of external circuitry such as a phase lock loop (PLL). It can receive wired or wireless AM, PM, or AM and PM signals with increased sensitivity, interference rejection, and bandwidth relative to prior art solutions. The LDA can also amplify signals while minimizing noise. The LDA utilizes integral hardware that improves the SNR of a AM input signal by restarting its cycle automatically, and without external means, whenever the input signal reaches a specific amplitude over time (threshold). The LDA circuit thereby converts AM input to an output stream of low intermediate frequency (IF) pulses, in which the instantaneous frequency modulates with the input wave (i.e., AM transposed to an IF band). This output stream is provided as a quasi-digital frequency-modulated signal. When AM modulated, the conversion is made through an intrinsic logarithmic scale and then output. The same frequency-modulated output can also be converted to baseband or demodulated (0 Hz to F_max) to a voltage varying with time via the adjunction of an analog frequency to amplitude converter, a peak detector or a digital counter, logic inverter, and digital rescaling circuit.

The LDA described herein can perform several functions, some simultaneously, including logarithmic amplification, signal regeneration, frequency conversion, noise filtering, interference rejection, and analog/digital amplitude/phase demodulation. In AM mode, the output frequency is proportional to the logarithm of the input voltage. By amplifying the signal while reducing noise over n cycles, as part of the non-conventional process of frequency transformation, the LDA acts as a regenerative receiver and amplifier. An intrinsic log function converts linear input to logarithmic output, making the detection possible at very low input levels, which allows for roughly 100 dB of usable dynamic range. The LDA can transcode an PM input to a different frequency. The LDA can use adjustable frequencies to handle various channels and circuit boards. The LDA receiver circuit provides very high sensitivity. The LDA is cost-effective, scalable, and capable of being integrated directly into IC chips. The LDA can accommodate analog, digital, and AM demodulation. Due to the LDA phase synchronous regeneration with the input signal, other types of demodulation such as PM are also feasible with the adjunction of additional circuitry, making the LDA useful in a wide range of practical applications.

Applications for the LDA are numerous. LDA technology can be integrated into nearly every electronic system that would benefit from higher sensitivity, higher dynamic range, lower power consumption, better interference rejection, increased bandwidth, better SNR, longer range, and/or cleaner amplification.

BRIEF DESCRIPTION OF THE DRAWINGS

Throughout the drawings, reference numbers may be reused to indicate correspondence between referenced elements. The drawings are provided to illustrate examples described herein and are not intended to limit the scope of the disclosure.

DETAILED DESCRIPTION OF ILLUSTRATIVE EMBODIMENTS

The LDA, as described in U.S. Pat. No. 7,911,235, which is incorporated by reference in its entirety herein, produces intermittent oscillations that are self-quenched when reaching a given threshold. It also embeds the circuitry to perform direct or indirect AM or PM demodulation. These factors, coupled with the fact that the regeneration gain is on the low side, permits the LDA to detect signals of small amplitude that are buried in noise. The LDA converts an analog or digital AM modulated signal and produces a train of almost constant amplitude and quasi-digital pulses in an intermediate frequency over a wide dynamic range. A digital frequency to voltage converter (VFC) may be used to convert the pulse frequency in a digital voltage word with simple processing. Alternatively, a simple analog VFC or peak detector may be used to demodulate the input signal to baseband with audio or video bandwidth. The LDA enables direct AM demodulation, high sensitivity and signal regeneration from noise level, high skirt ratio and quasi digital output data without the need of automatic frequency control (AFC).

Figure 1:
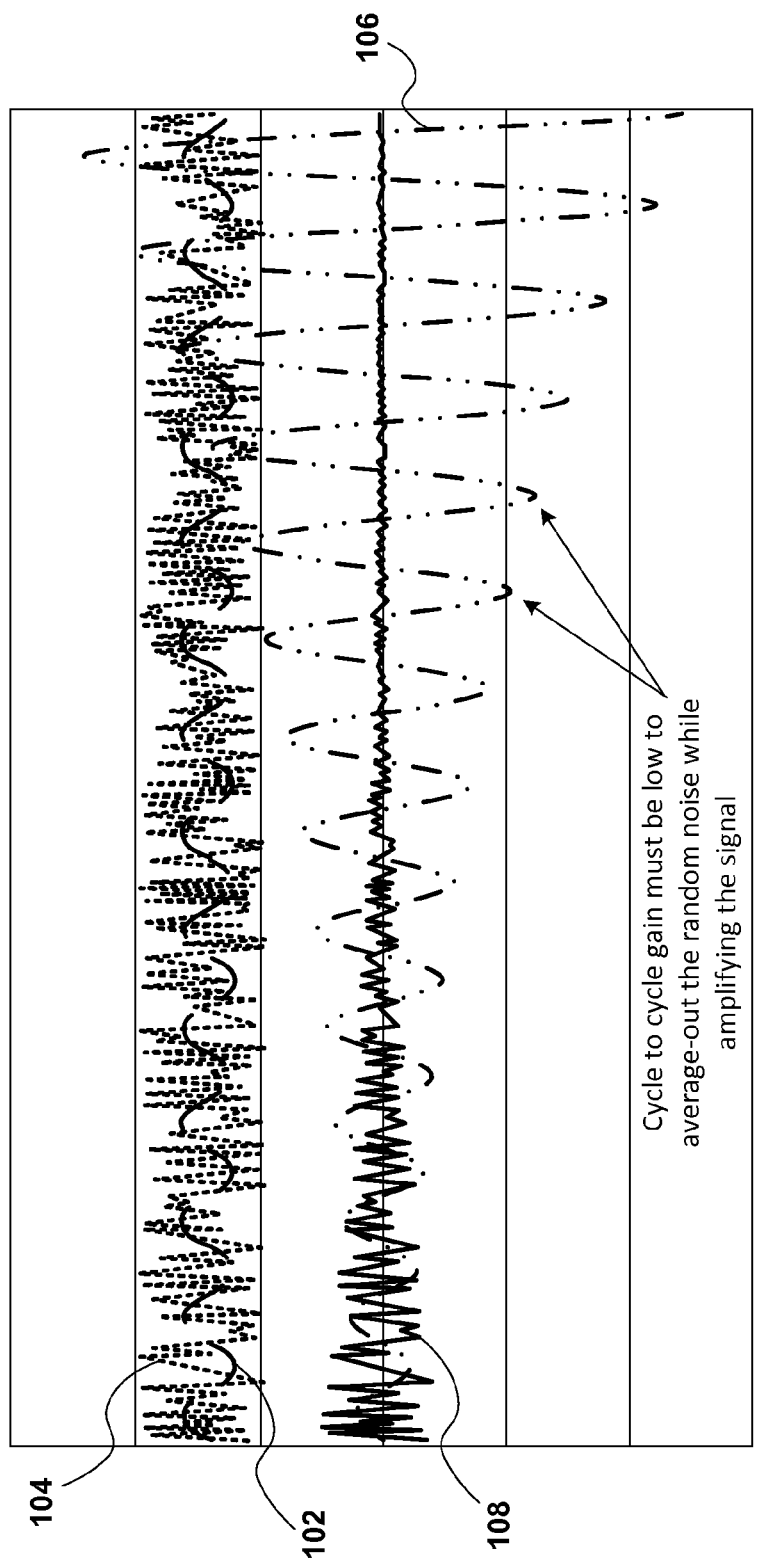
FIG. 1 is a signal graph illustrating operation effects of the LDA in accordance with an embodiment.

The operational effect of the LDA is further illustrated in FIG. 1. Assuming the LDA receives a low-level input signal 102 (the long dashed line illustrated at the top of FIG. 1) within its frequency capture bandwidth, masked by white Gaussian input noise 104 (the short dashed line illustrated at the top of FIG. 1), the LDA will regenerate and amplify the input signal 102 as output signal 106 over a number of periods (the dashed dot dot line at the bottom of FIG. 1), until reaching a threshold level. When the input threshold level is reached, the LDA generates an output pulse, and restarts its cycle. Because Gaussian noise is random and uncorrelated with the input signal 102, as the regenerated signal 106 increases, the noise 108 (the solid line illustrated at the bottom of FIG. 1) will be averaged out and kept about to the same value, therefore not amplified over a number of periods.

Figure 2:
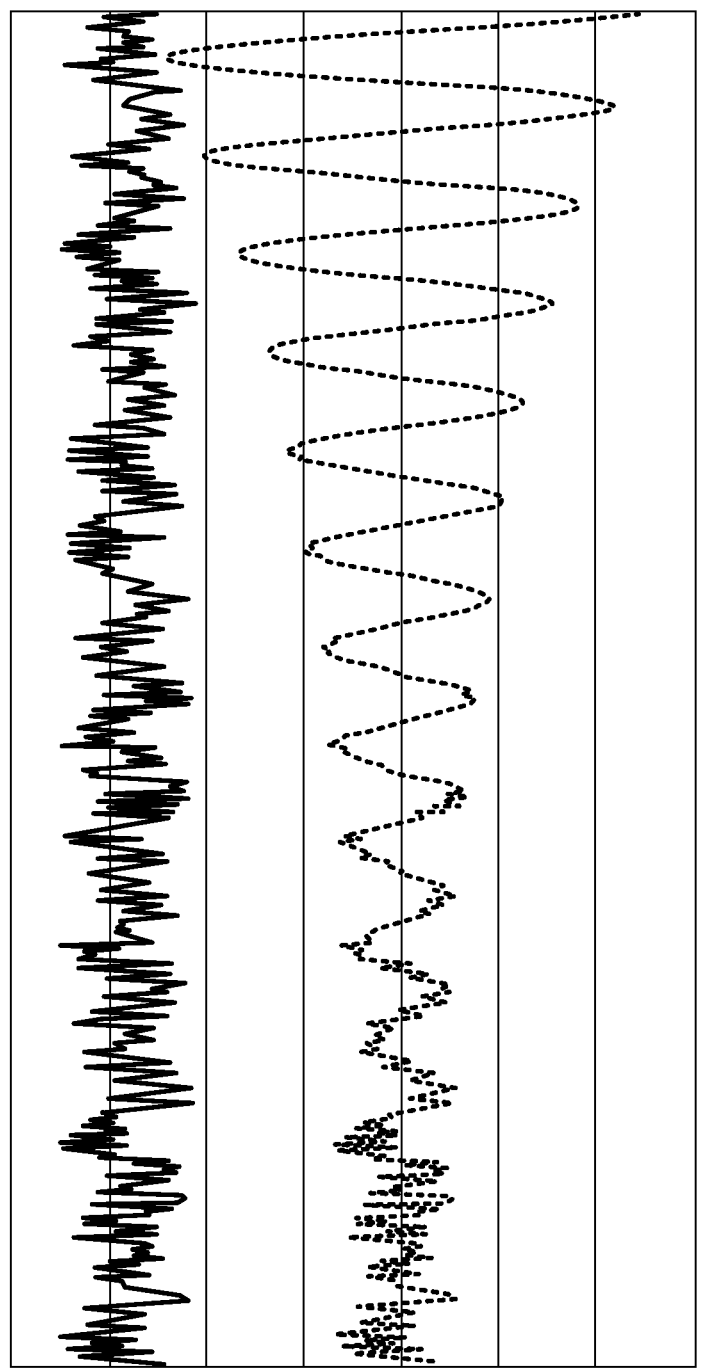
FIG. 2 is a signal graph further illustrating operation effects of the LDA in accordance with an embodiment.

When input signals to the LDA are combined over a number of periods (the solid line of FIG. 2), the resulting curve, as illustrated by the short dashed line of FIG. 2, represents a regenerated and amplified signal with reduced jitter over time. This effect is similar to a laser, such as a vertical cavity laser (VCSEL) in which photons are amplified in a cavity at a specific wavelength. In the case of the LDA, at a resonance frequency, a standing wave builds up energy constructively over time with the help of a synchronous amplifier. At the end of the buildup period, a discharge of higher energy is produced, and the process restarts.

Another example that explains the regeneration process, that takes place from the noise floor with the slow buildup of coherent energy (and reduction of amplitude jitter), is the following: Assume there is a large noisy room in which there are two similar mechanical forks, each having a high quality factor and identical resonance frequency, and each one at the other side of the room. Assume that the first fork (excitation source) is beating at a low and constant level. The second fork can barely "hear" the first one due to the high level of noise. After some time, the second fork will amplify and resonate at the tone frequency with high amplitude level irrespective of the noise level in the room due to its high quality factor, due to the weak coupling between both forks and finally due to its slow synchronous buildup of mechanical energy. The key here is "slow" in order to build up the signal but average out the random noise.

Figure 3A:
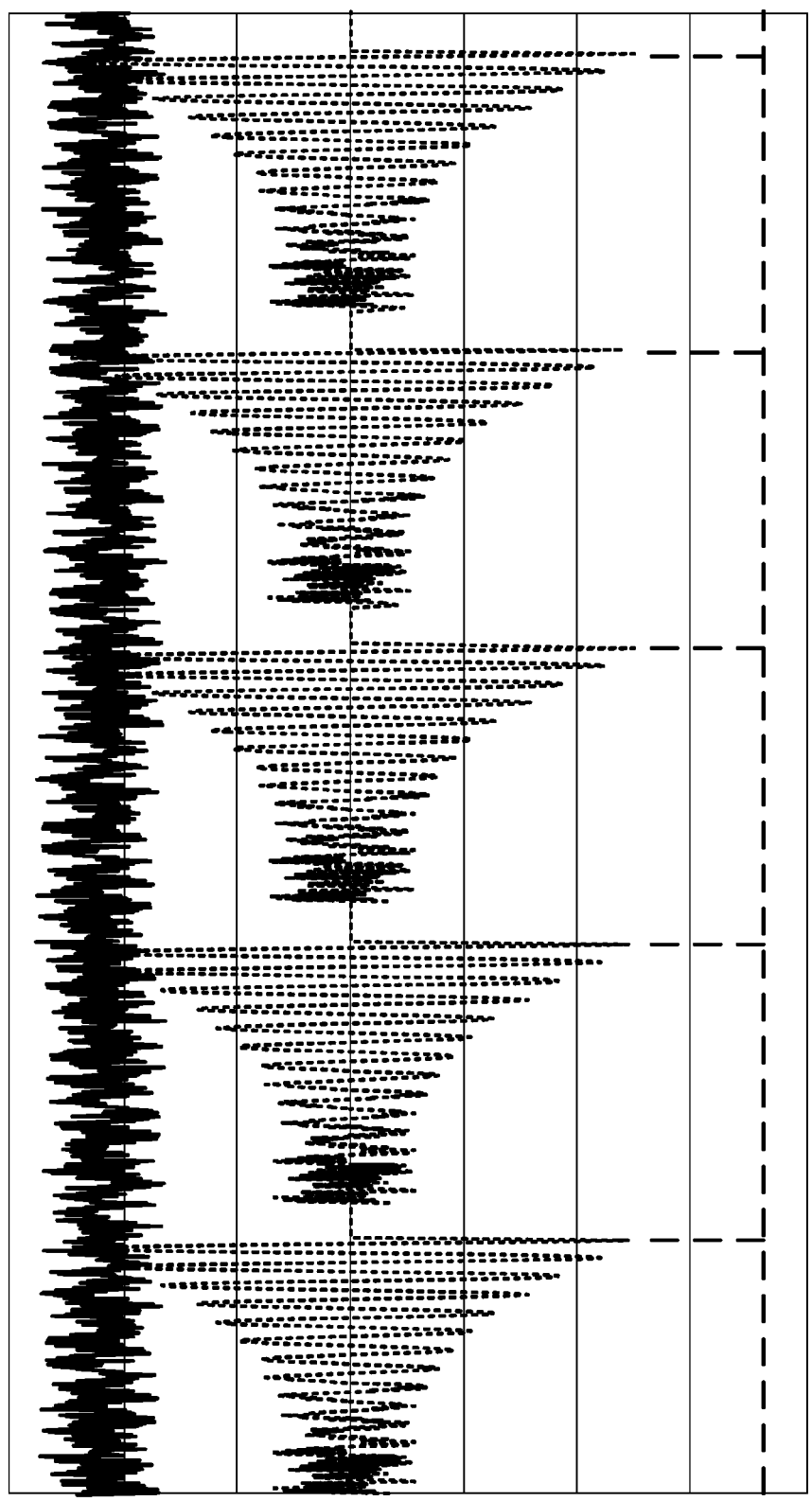
FIGS. 3A and 3B are signal graphs illustrating how longer time scales for the input effect the output frequency of the LDA in accordance with an embodiment.
Figure 3B:
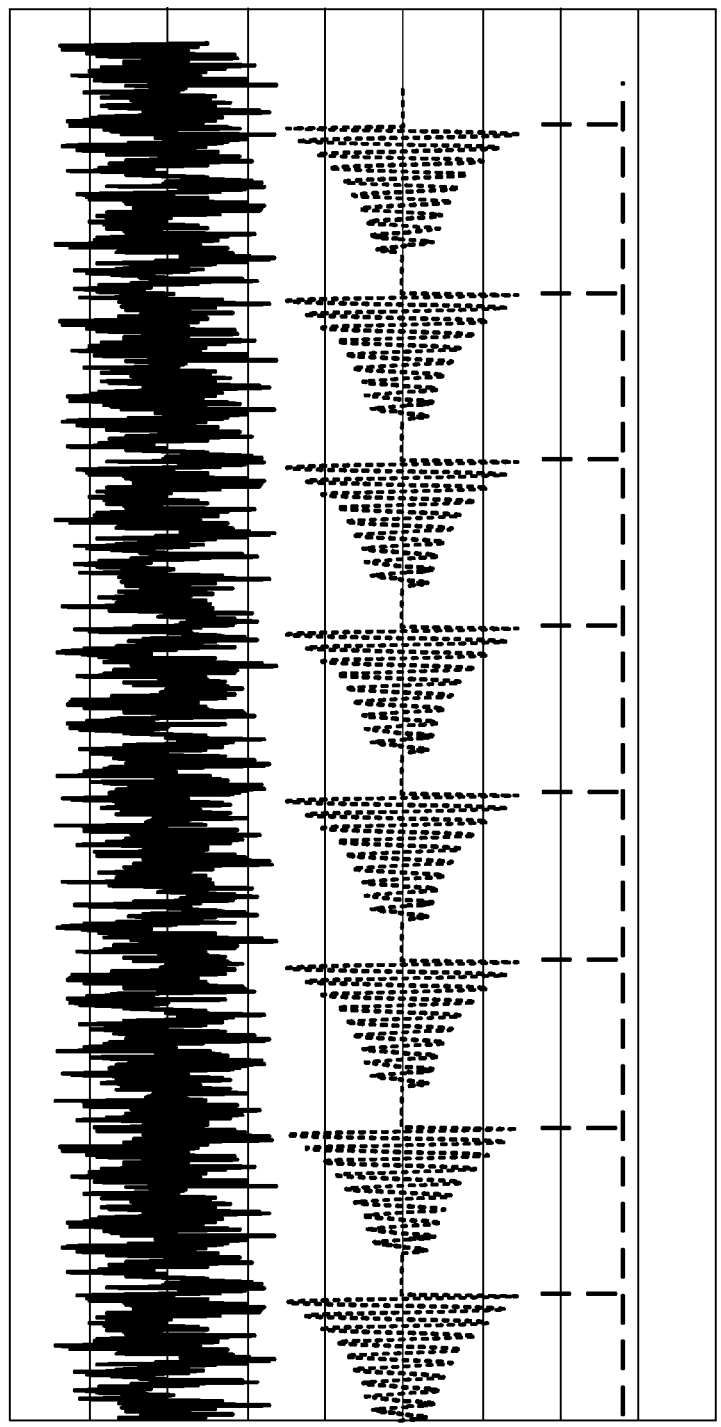

This principle is further illustrated in FIGS. 3A and 3B, which illustrate how a longer time scale for the input effects the output frequency. In both figures, the input signal (including noise) is shown as the solid line at the top of each figure and the regenerated output signal is shown as the short dashed line in the middle of each figure. The output repetition rate is shown as the long dashed line at the bottom of each figure. As will be noted, when the input signal is at a low level, the LDA needs a time (t1) to regenerate the signal and reach a constant threshold value. In the time window of FIG. 3A, five pulses are created during t1, while FIG. 3B shows a higher input signal and a corresponding faster regeneration time to reach the threshold, resulting in the LDA producing more pulses (eight pulses) in the same time window.

In addition, the output pulses are almost constant in amplitude for any low-to-high input signals, which is remarkable given the huge dynamic range involved.

As far as the AM mode is concerned, the output frequency of the LDA is proportional to the logarithm of the input voltage, which is represented as follows:

$$F_{OUT}(t) = F_0 + K*20 \log(V_{IN_{RMS}}(t)) \text{ (Hz)}$$

or $$F_{OUT}(t) = F_0 + K_2*(L_{IN_{dB}}(t)) \text{ (Hz)}$$

where:
$F_0$ is a minimum fix frequency,
$K, K_2$ are constant values,
$V_{IN\_RMS}(t)$ is the RMS value of the input signal $V_{IN}(t)$,
$L_{IN\_dB}(t)$ is the input level $L_{IN}(t)$ in dBm, and
$F_{OUT}(t)$ is the output frequency.

The ability of LDA technology to enhance the transport of information, in both wired and wireless systems, is based on the generation of an output frequency that can be easily converted into a pulse stream of data with logic levels. The information is in the frequency, not the amplitude domain. This approach increases the efficiency and lowers the noise in data communications over long wires, as well as wireless.

If desired, the output frequency can be converted into voltage modulation in analog or digital form. In this case, the output voltage after low pass filtering becomes:

$$V_{OUT_{RMS}}(t) = K_3 * 20 \log(V_{IN_{RMS}}(t)) \text{ (V)}$$

or $$V_{OUT_{RMS}}(t) = K_4 * L_{IN_{dB}}(t) \text{ (V)}$$

where:
$V_{OUT\_RMS}(t)$ is the output voltage, and
$K_3$, $K_4$ are constant values.

The LDA with PM or AM demodulation circuitry may be utilized in a wide range of different embodiments, including the following non-exhaustive list:

1. The LDA's ability to convert voltage modulated input signals to FM output signals in the IF range, and its use of logarithmic decompression, are particularly effective at reducing noise and expanding the dynamic range of weak signals relative to noise, making the LDA ideally suited to many applications, such as:
   a. splatter-prone radar; micro-signal medical devices like ultrasound, MRIs, and CAT scans; fish finders and sonar in general; and collision avoidance;
   b. signal analyzers, power meters, and RF transmitter amplifiers;
   c. wireless networks, such as Wi-Fi;
   d. simple, low power consumption frequency-to-digital converters based on LDAs, as a replacement for high resolution, fast, but expensive AD converters;
   e. pipeline metering and communication in the oil, water, and gas industries; and
   f. replacing expensive analog to digital converters (ADCs) with several possible configurations of LDAs, PLLs, digital counter, fast clock, digital inverter, and digital scaling.
2. The ability of LDAs to filter random noise from weaker signals gives the LDA the ability to extract, for example, a few dBs of signal from the noise floor for smart phone devices or cellular base station receivers. To further reduce the output power of cell phones (improved RF budget link), and thereby extend their battery life and range by a factor n, LDA technology can be integrated into mobile phones. Further, cell stations could use LDAs to recover weaker signals.
3. Since the LDA regenerates the input signal and actively reduces noise, the LDA can significantly increase the SNR ratio even if placed after the first or second block in an amplification chain.
4. LDAs can demodulate, directly, analog/digital AM, and other modulations such as ASK, OOK, and PSK. LDAs can also demodulate, analog/digital PM, quadratic phase shift keying (QPSK), and n-QAM modulations as well more complex schemes such as DS-SS (that uses BPSK or QPSK) and OFDM (that uses BPSK, QPSK, and n-QAM) with, in some cases, the addition of more circuitry such as PLL(s), mixer(s), synthesizer(s), splitter(s), combiner(s), amplifier(s) and filter(s), etc. In this context:
   a. Applications include Wi-Fi, GPS, LTE, and many other communication methods;
   b. LDAs can regenerate many types of low-level RF signals if tuned near or at the RF modulating frequency;
   c. LDAs can be used to simplify wireless digital receivers by replacing several functions of a standard digital receiver (RF to low intermediate frequency or to baseband with direct digital conversion); and
   d. In baseband microvolt sensors (e.g. audio bandwidth 20 Hz-20 KHz), the LDA can be used as a very low noise and high discrimination conversion gain amplifier with digital output.
5. The LDA's high sensitivity to weak signals buried in noise, and for wide dynamic signals (i.e., weak to high) that are in baseband or that have been earlier modulated, makes the LDA particularly well suited for medical industry applications, such as ultrasound.

Figure 4:
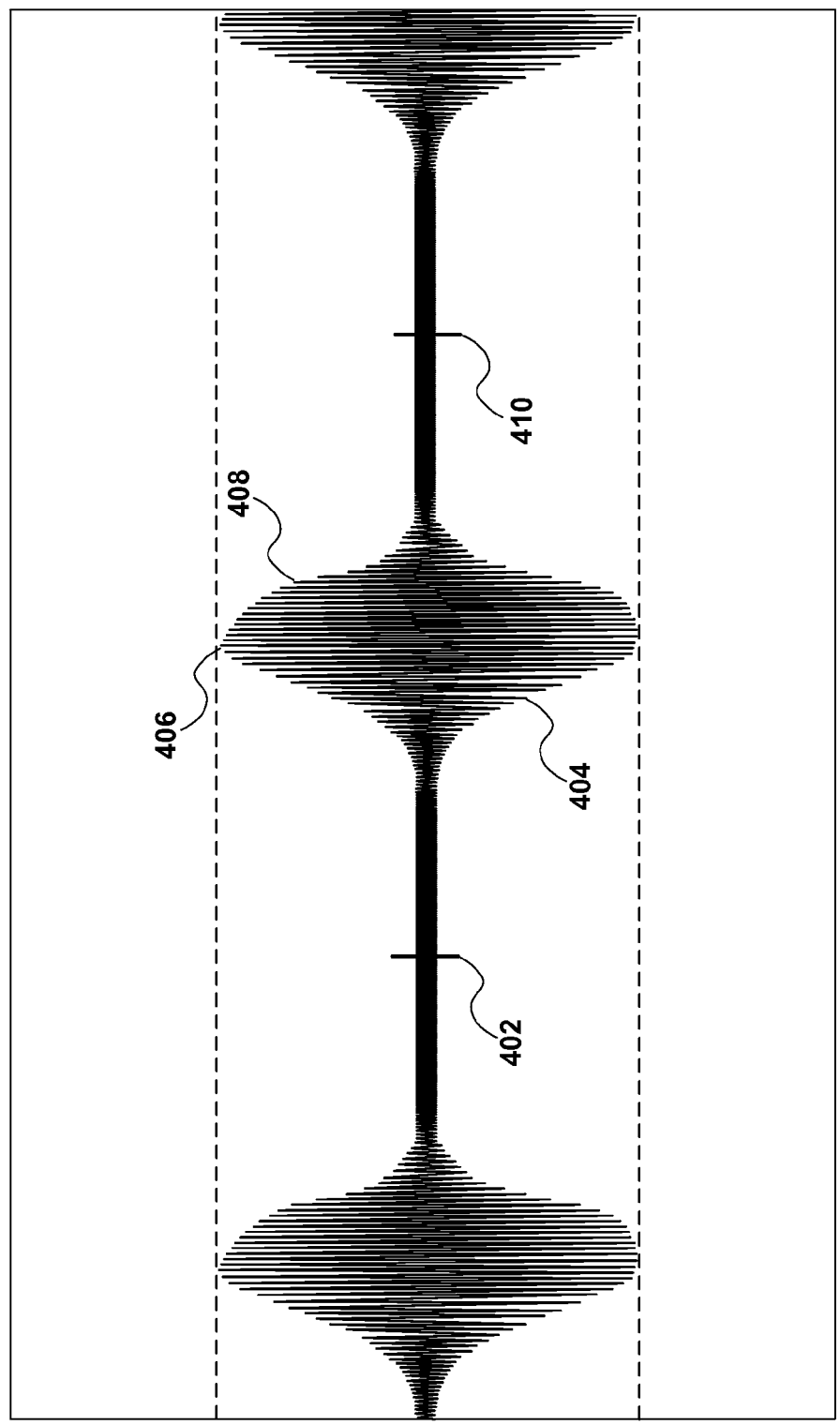
FIG. 4 is a signal graph further illustrating the non-linear oscillations and quenching cycle of the LDA in accordance with an embodiment.

Returning now to the description of the LDA and its basic operation, the LDA can be regarded roughly as a LC circuit with variable conductance, the latter varying cyclically from positive to negative. When negative, the oscillation builds up until reaching a threshold level where the oscillation is shunted progressively to zero, corresponding to the positive conductance cycle. This effect is illustrated in FIG. 4, which depicts the signal response of an LDA, where the regeneration process starts at point 402, where minimal detection is provided because the input signal is buried in noise. The nonlinear oscillations begin to build up at 404 until reaching a maximum regeneration at 406, at which point the oscillations are shunted, point 408, and the oscillations drop down so the signal is once again buried in noise for the start of the next quenching cycle, point 410.

Figure 5:
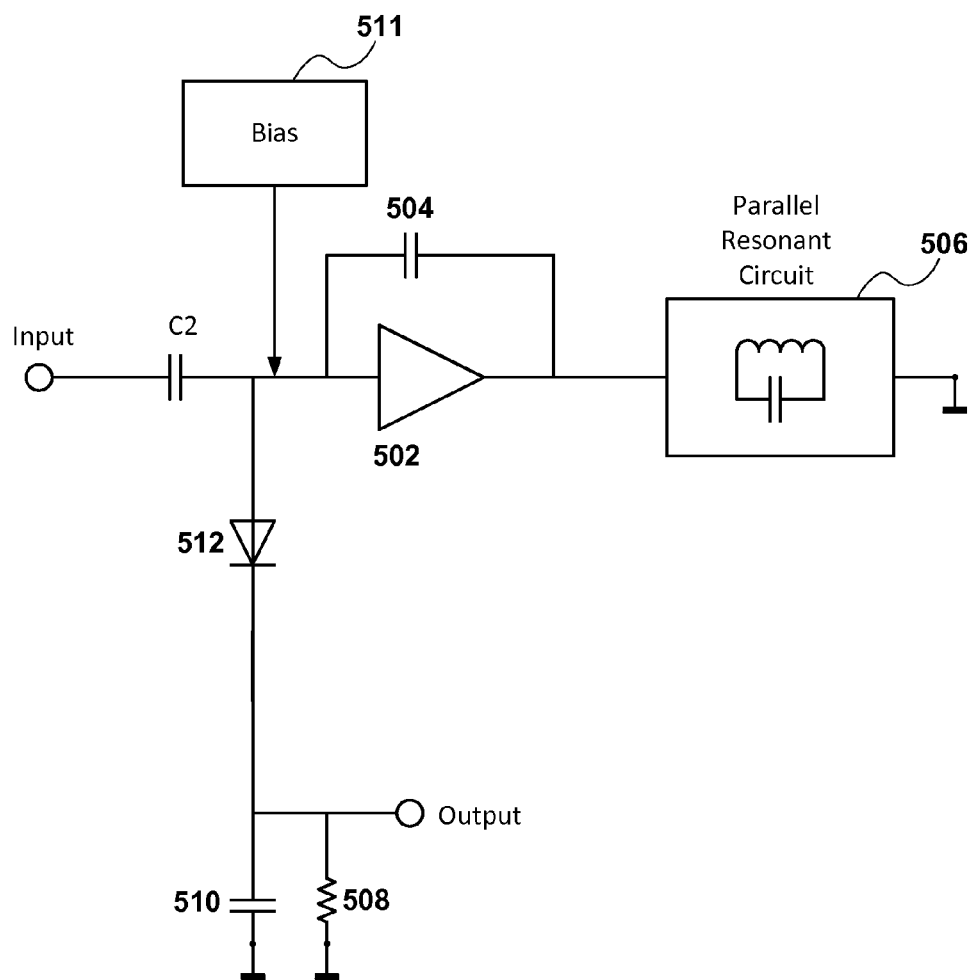
FIG. 5 is a block diagram illustrating a LDA with integral AM demodulation circuitry in accordance with an embodiment.

A schematic block diagram of a LDA with integral AM demodulation capabilities (AM-LDA) is illustrated in FIG. 5. The behavior principle of the illustrated circuit is as follows: An amplifier 502 is made to oscillate with the capacitor 504 through a feedback loop. The amplifier 502 may be a NPN, PNP transistor, a FET transistor, A MOS transistor, a dual gate FET transistor, etc. Also, the configuration of the active circuit can be Darlington, common-base, common collector, common emitter, cascade, differential pair, etc. Other types of amplifiers, such as single or multiple stage amplifiers and logic amplifier may be used. The manufacturing process can be Silicon, Bi-CMOS, GaAs, or any other process where an amplifier can be created.

The simplest implementation is to have a 180 degree phase shift from the input to the output of the amplifier 502 and the oscillation maintained by capacitor 504 as a gain limiting factor. A parallel resonant circuit 506, or generally a resonant quadripole circuit, may be added to the output of amplifier 502. Due to the lower attenuation in the passband of the circuit 506, the amplifier is made to resonate at or around a center frequency. The AC analysis response of the AM-LDA is typical of a parallel resonator connected to ground and looks approximately like a bell shape in the frequency domain.

The optimal AM or phase demodulation mode happens when the input signal frequency is adjusted to the center of the bell shape of the LDA. The LDA tends to regenerate any coherent signal within its frequency bandwidth; therefore the power may be increased in this bandwidth.

Another important piece of the AM-LDA behavior is the RC circuit, comprised of resister 508 and capacitor 510. When connected to the amplifier, the RC circuit charges cyclically and as its potential grows, the voltage across resistor 508 grows, which increases the output current of the amplifier 502. At the same time, the input bias current of the amplifier 502 reduces and at a given voltage threshold switches off the amplifier 502 and therefore the oscillations. At this point the charge accumulated into capacitor 510 discharges in resistor 508 and, as a consequence, the voltage on resistor 508 and capacitor 510 decreases to zero. The quenching cycle then restarts and since the potential on resistor 508 and capacitor 510 is low the amplifier bias current tends to increase and after a little period of time the oscillation builds up again.

The bias 511 for the amplifier 502 input may be designed to temperature compensate the amplifier 502. For instance, if the amplifier 502 is made of a bipolar transistor, its $V_{BE}$ will change with −2 mV/degree. If the DC bias voltage is made to decrease as well by −2 mV/degree, the DC voltage on the emitter will remain constant and therefore the DC current through the resistor 508 as well.

An alternative bias method is to feed the amplifier 502 or transistor circuit with a temperature compensated constant current. By doing so, and since the transistor is a current amplifier, the $V_{BE}$ variation with temperature becomes irrelevant and the collector current becomes temperature compensated as well, since equal to Beta multiplied by the base current. Also, a constant current bias provides a more linear behavior since the base voltage varies with time.

After low pass filtering, the signal on resistor 508 and capacitor 510 is the output repetition frequency and its shape resembles the envelope of the cyclic oscillation frequency shown in FIG. 4.

The diode 512 couples the amplifier to the RC circuit or resistor 508 and capacitor 510 and acts as a low pass filter with good RF behavior. Diode 512 has a low impedance when in conduction (positive half cycle of the input voltage) and high impedance when in non-conduction (negative half cycle of the input voltage). The input to the amplifier 502 is weakly coupled to the top of diode 512. Input matching is important and a good matching can improve the performance by a significant factor, as will be further discussed below. An optional capacitor, not shown, may be connected between the cathode of diode 512 and the bias of the amplifier 502 to increase the coupling and facilitate the repetitive cycling.

In another embodiment, the diode 512 may be replaced with an inductor of relatively high value, e.g., 10 uH to 1 mH. If the LDA oscillation operating frequency is too high, the parasitic may impact adversely the low pass effect and a more ideal component such as a diode may be used. In a further embodiment, diode 512 may be replaced by an active component such as a transistor that is properly biased.

Figure 6:
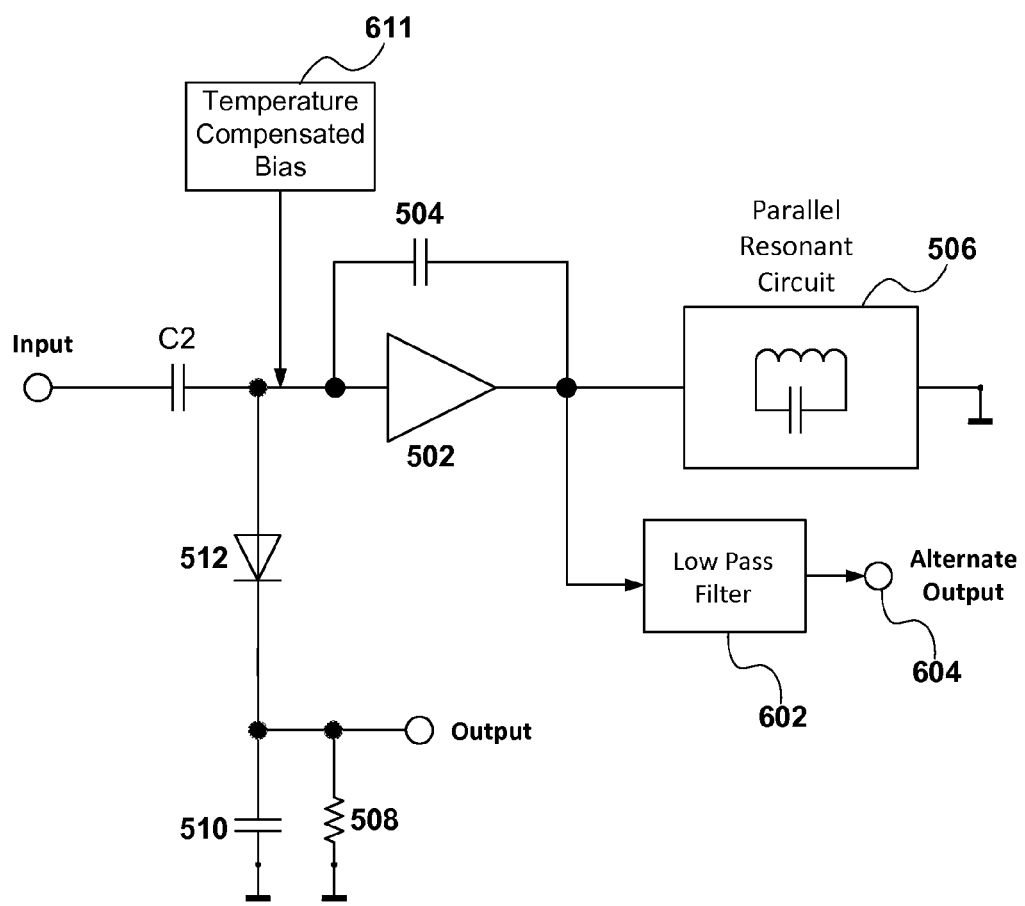
FIG. 6 is a block diagram illustrating a LDA with integral AM/ASK/OOK demodulation circuitry and alternative demodulation in accordance with an embodiment.

A further embodiment of a LDA with integral AM/ASK/OOK demodulation circuitry is illustrated in FIG. 6. FIG. 6 is essentially the same as FIG. 5, with like elements numbered the same, but with the addition of a low pass filter 602, generating an alternate output 604 and the bias 611 being temperature controlled. The signal on alternate output 604 may be substantially a regenerated time sampled copy of the input signal including any AM/ASK/OOK after the RF frequency component has been removed with low pass filter 602. A matching circuit (not shown in FIG. 6) may be added before the low pass filter 602 to isolate and maximize the transfer of energy.

Tapping of the output signal may be done in conducted mode, such as on the output of the amplifier, or wireless mode, such as magnetic coupling with mutual coupled inductance. Due to the time sampling, the frequency spectrum may look repetitive. In some cases, the quenching frequency pulses may be so little that the system acts as if there is no quenching frequency and the modulated signal on the output may appear continuous in time. However, tapping at the alternative output node 604 may alleviate this problem and provide a higher power output signal F_rep(t).

The frequency spectrum on alternate output 604 before the low pass filter contains the RF signal with modulation (if any), the repetition rate f_rep(t) frequency in an intermediate frequency IF with the modulation (if any), and the modulated signal in baseband at zero hertz (if any). At this point two cases are possible:

1. Low pass filter the RF signal and IF frequency (f_rep) and recover the baseband signal that has been regenerated/amplified. The baseband signal happens to be the demodulated AM output. Optional follow up with an anti-aliasing filter and ADC to create a digital signal v(k) is possible.
2. Low pass filter (or band pass filter) the RF signal and baseband (BB) frequency and recover the f_rep(t) signal that has been regenerated/amplified.
    a. Process f_rep(t) in an analog fashion with a frequency to voltage converter, f/v converter and improved amplifier to recover the baseband demodulated AM signal. Optional follow up with an anti-aliasing filter and ADC to create a digital signal v(k) is possible.
    b. Process f_rep(t) digitally with digital shaping, instantaneous frequency meter (or period meter followed by a digital 1/x function), and scaling to obtain the digital demodulated output signal.

Figure 7:
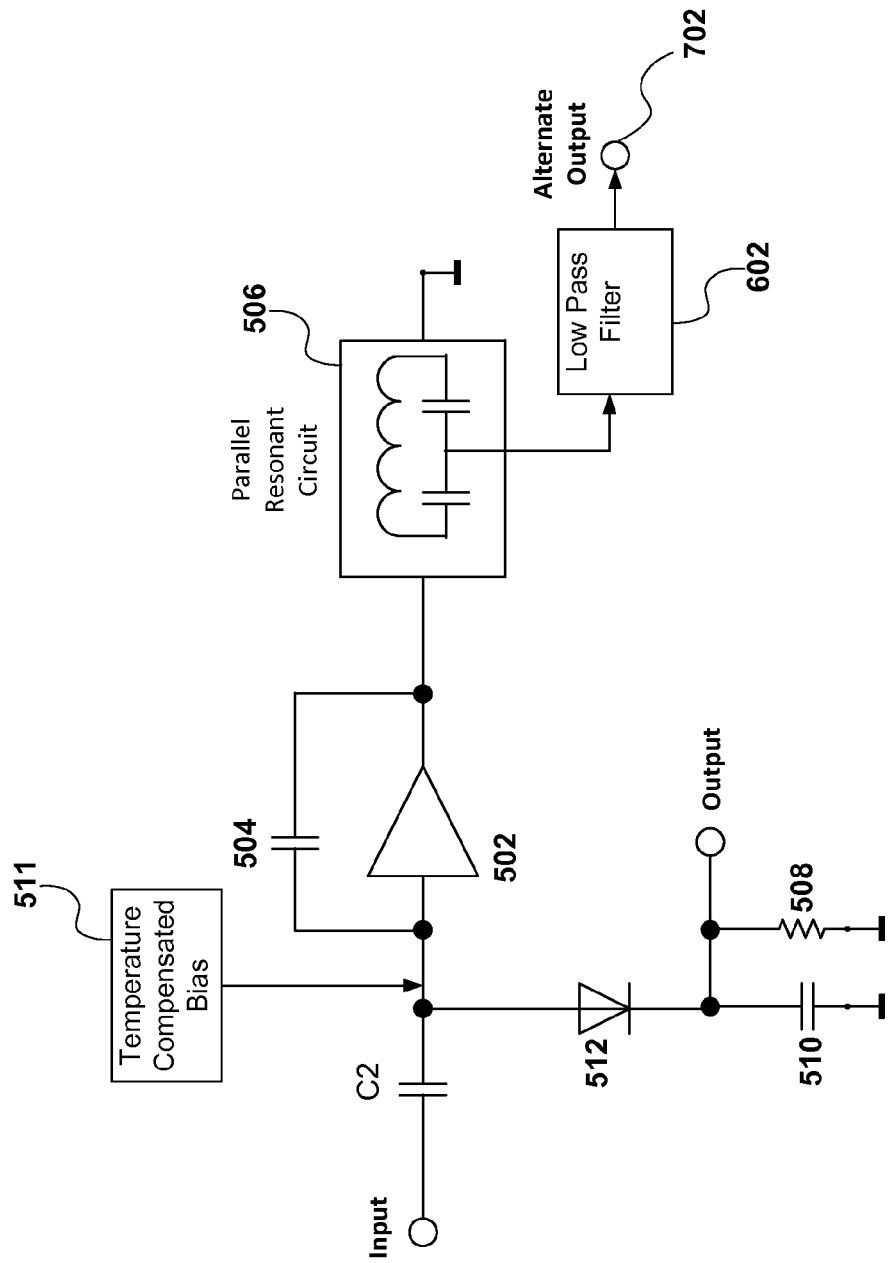
FIGS. 7 and 8 are block diagrams illustrating LDAs with integral AM/ASK/OOK demodulation circuitry and alternative demodulation configurations in accordance with an embodiment.

A further embodiment is illustrated in FIG. 7, with like elements to FIGS. 5 and 6 numbered the same. FIG. 7 illustrates a LDA with integral AM/ASK/OOK demodulation circuitry and an alternative demodulation repetition frequency F_rep(t) output taken from a node in the parallel resonant circuit. In accordance with the embodiment of FIG. 7, the output signal 702 is tapped from a node inside the parallel resonant circuit 506. Tapping may be in conducted mode, such as a middle point between the two capacitors of the circuit 506, or in wireless mode, such as magnetic coupling with mutual coupled inductance.

Figure 8:
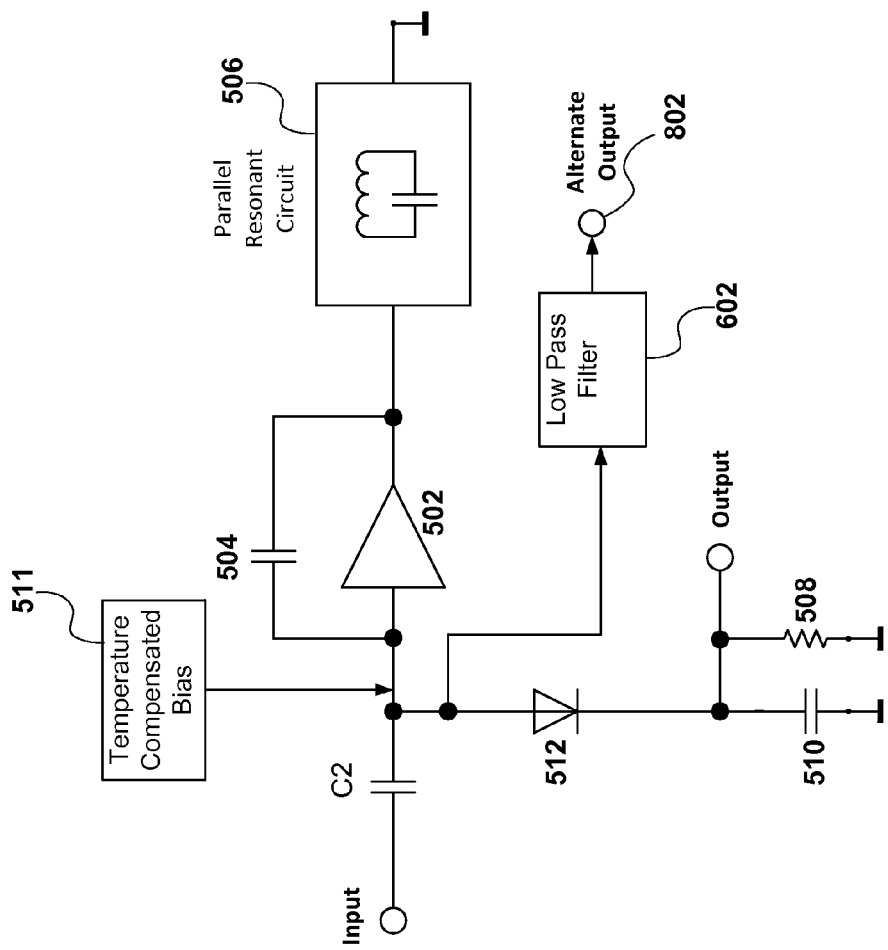

A further embodiment is illustrated in FIG. 8, with like elements to FIGS. 5 and 6 numbered the same. FIG. 8 illustrates a LDA with integral AM/ASK/OOK demodulation circuitry and a second alternative demodulation repetition frequency F_rep(t) output taken from the input of the amplifier. In this embodiment, the output 802 is tapped from the input of the amplifier 502. An optional matching circuit, not shown, could be placed before the low pass filter 602 to improve the isolation and maximize the energy transfer.

Figure 9:
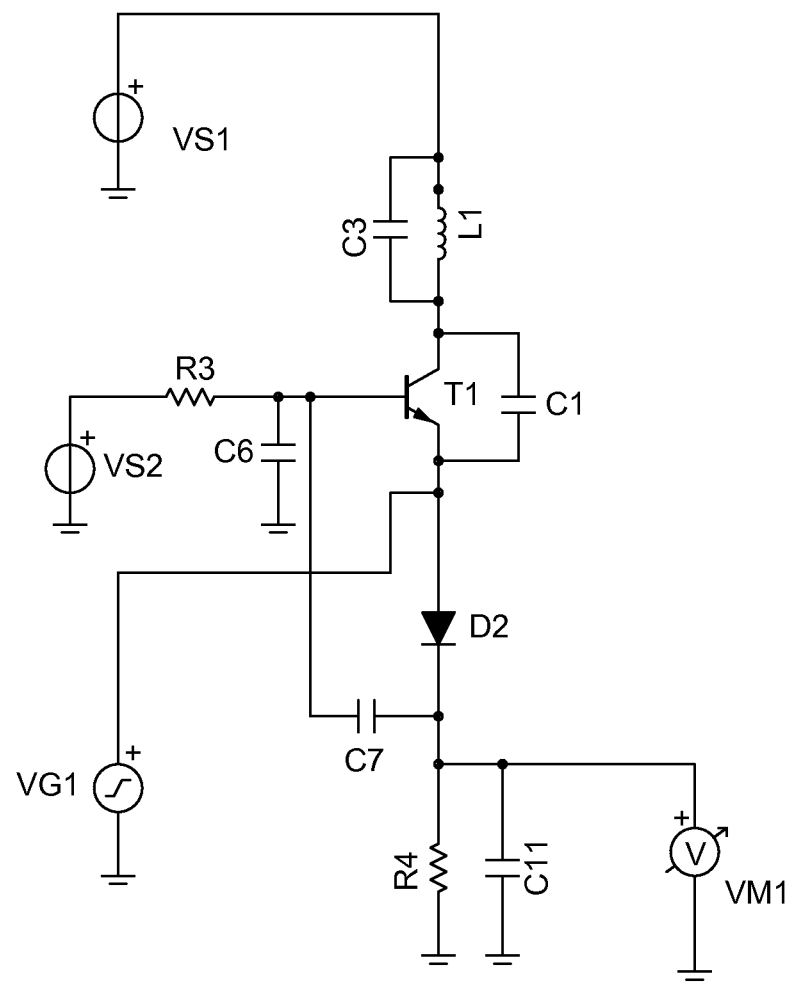
FIG. 9 is a schematic diagram illustrating a LDA with AM demodulation circuitry in accordance with an embodiment.

A typical implementation of the LDA with AM demodulation capability is shown in FIG. 9. The parallel and series resonators circuits L1, C3 are found on the collector of the amplifier T1, in this case a NPN transistor. The transistor T1 provides a 180 degree phase shift between the collector and the emitter. C1 is the feedback oscillator capacitor. VG1 is the input source signal coupled through a capacitor (not shown, but like capacitor C2 shown in FIGS. 5 to 8). The bias is VS2, R3, and C6. D2 is the diode coupling to the RC circuit R4, C11. The output is VM1. An optional C7 is shown for improving the quenching process.

Figure 10:
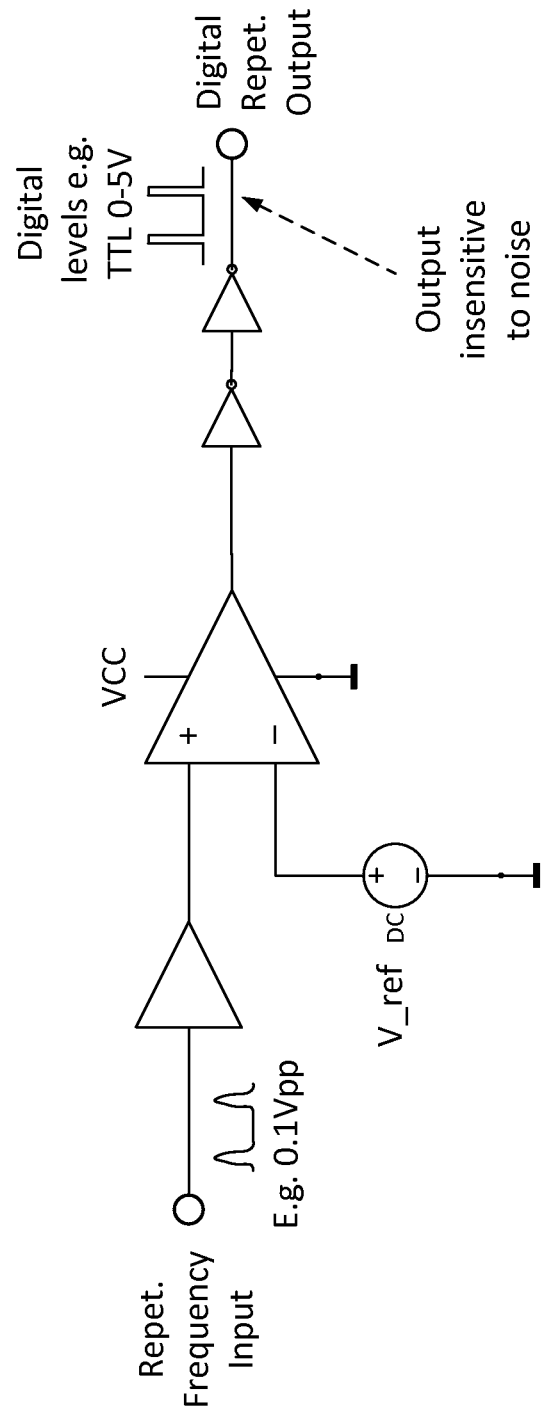
FIG. 10 is a block diagram illustrating conversion of a pseudo digital frequency input to a digital output pulse stream in accordance with an embodiment.

As previously discussed, the repetition frequency rate from the output, alternate output or second alternate output of FIGS. 5 to 8 is quasi-digital and needs little processing to be shaped into a digital signal. First, if the amplitude peak to peak is smaller than around 0.5 Vpp, the output needs to be amplified. If as shown in FIG. 10, the amplitude is 0.1 Vpp, the required gain is about 5 to 20. The amplification can be done in one step or several steps. Thereafter, the amplified signal may be compared with a reference voltage to create a logic "1" when V_ref, and to create a logic "0" otherwise. One or more logic gates may be added to provide sharp edges and a TTL level to the now digital signal. The digital repetition frequency output signal contains the information in phase and instantaneous frequency. As previously noted, this signal may be transmitted over long distance or in a noisy environment and is noise insensitive since the information is not in amplitude.

Figure 11:
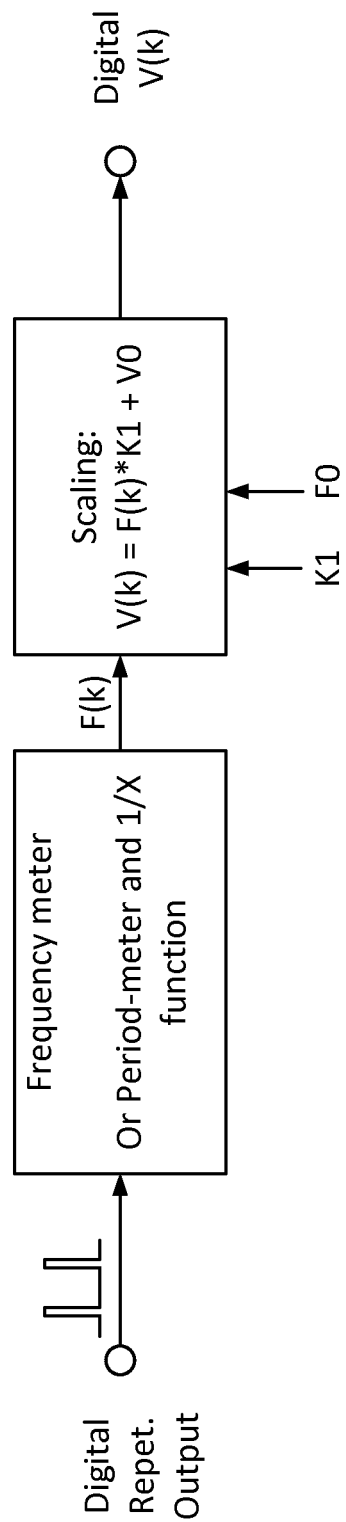
FIG. 11 is a block diagram illustrating conversion of a digital pulse stream to a digital equivalent voltage sample in accordance with an embodiment.

As illustrated in FIG. 11, the digital repetition frequency signal from the output, alternate output or second alternate output of FIGS. 5 to 8 may also be converted into a digital voltage V(k) signal by going through an instantaneous frequency meter. Alternatively, an instantaneous period meter followed by a digital inverse function may be used. The digital voltage V(k) is obtained after scaling as follow:

$$V(k)=F(k)*K1+V0$$

where:
F(k) is the kth sample of instantaneous frequency;
K1 is a constant in V/Hz; and
V0 is a constant offset voltage that corresponds to the voltage (frequency) generated when the LDA input is terminated on 50 ohm. V(0)=F(k)*K1 at 50 Ohm.

Figure 12:
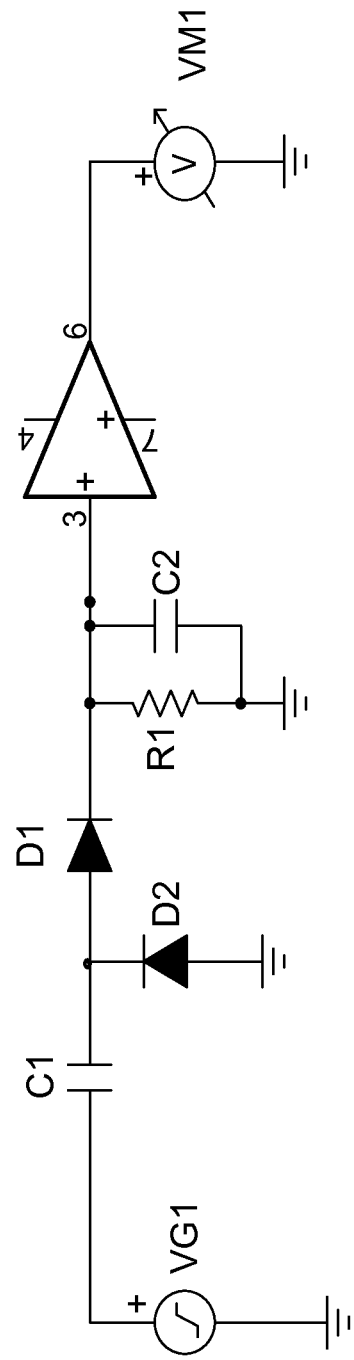
FIG. 12 is a block diagram illustrating an analog frequency to voltage converter in accordance with an embodiment.

As illustrated in FIG. 12, a frequency to voltage converter (FVC) may be used in conjunction with an AM-LDA. The converter connects to the repetition frequency output of the LDA and provides an output with a mean value of the converted voltage. Further low pass filtering may be added. FIG. 12 illustrates a simple FVC, but has some limitations due to the simplicity, i.e., the slew rate is slower than the previous digital approach for instance, and it typically requires a few pulses to settle to an accurate voltage value.

Figure 13:
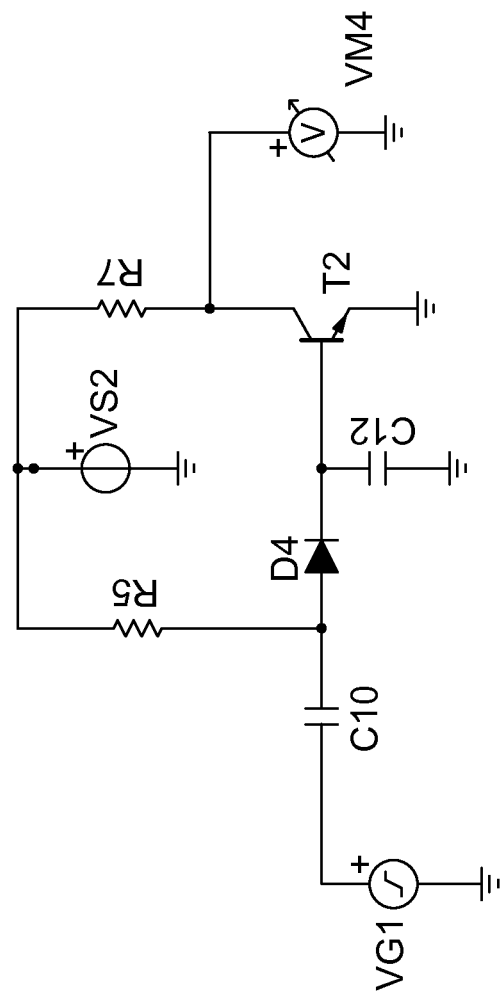
FIG. 13 is a schematic diagram illustrating an analog detector in accordance with an embodiment.

FIG. 13 illustrates an analog detector, which is another possible implementation embodiment involving the LDA. The analog detector may be connected to the repetition frequency output (VM1) of FIG. 9, or the input of the amplifier T1 of FIG. 9. Further low pass filtering and amplification may be added.

The AM-LDAs illustrated so far are operable, but not necessarily ideal as they may suffer from some weaknesses, namely a leak of RF energy from its oscillator throughout the input port. This is an aggravating factor for two key reasons:
1. When the LDA is used as the first stage in a RF receiver, the RF energy is fed backward to the antenna. This causes the antenna to radiate unwanted energy in possibly unintended frequency band(s) and cause EMI noise.
2. The leaking energy can be reflected back to the LDA input with a different phase versus the input signal, a fact that defeats the purpose of regeneration (regeneration is the slow buildup of a resonance phase coherent with the input signal). This reflection therefore reduces the RF sensitivity.

Also additional use of gain can be obtained when a low noise amplifier LNA precedes the log detector amplifier LDA. Indeed being a regenerative device and time variant circuit, the LDA may not fully be described by the noise law for linear circuits, such as in conventional receiver chain where the first amplifier of the chain is the key element in determining the noise figure of the receiver, as defined per the Friis' formula:

$$NF = 10*\log(F) \text{ in (dB) and}$$
$$F = F_{A1} + \frac{F_{A2}-1}{G_{A1}} + \frac{F_{A3}-1}{G_{A1}G_{A2}} + \ldots \text{ in(.)}$$

where
NF is the total noise figure, ratio in dB;
F is the total noise figure, ratio in linear;
$F_{Ai}$ is the linear noise figure of the $i^{th}$ amplifier of the amplifying chain; and
$G_{Ai}$ is the linear gain of the $i^{th}$ amplifier.

In the case of a regenerative log amp, the regenerative part can improve the SNR when placed in the first place or at any location in the receive chain. Therefore, the regenerative LDA can make good use of a preceding low noise amplifier even in a noise limited amplifier receiver chain. Such LDAs may amplify further a signal buried in the noise because the dynamic range is extended on the low side (noise level) of the signal. In such a noise limited receiver, but without the LDA, the hypothetic addition of a LNA would be of little use since the system would be noise limited. For example, adding a 20 dB gain LNA in front of a noise-limited receiver without LDA would barely increase the sensitivity level by 0 to 2 dB. On the other side, by using a log amp with regeneration factor of as much as 8 dB would improve the sensitivity by a factor of 6 to 8 dB.

Figure 14:
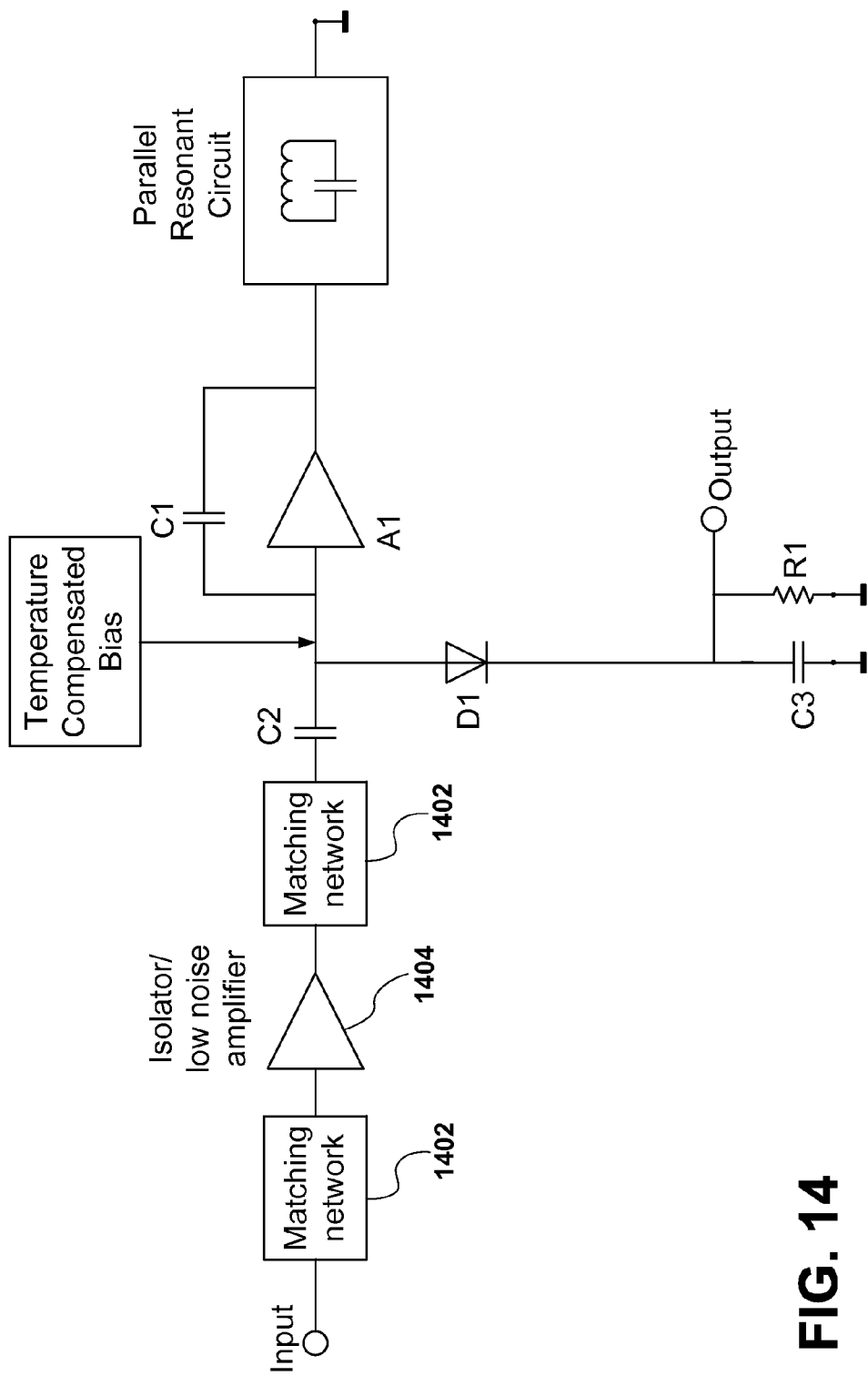
FIG. 14 is a block diagram illustrating a LDA in accordance with an embodiment.

Accordingly, as illustrated in FIG. 14, which is a modified version of FIG. 5, the addition of one or more matching networks/circuits 1402 at the input of the LDA may improve the coupling with the preceding circuit and reduce the input reflections. Furthermore, the addition of an isolator 1404 at the input, or in other words an amplifier with high factor of isolation, may further improve regeneration and gain opportunity.

Figure 15:
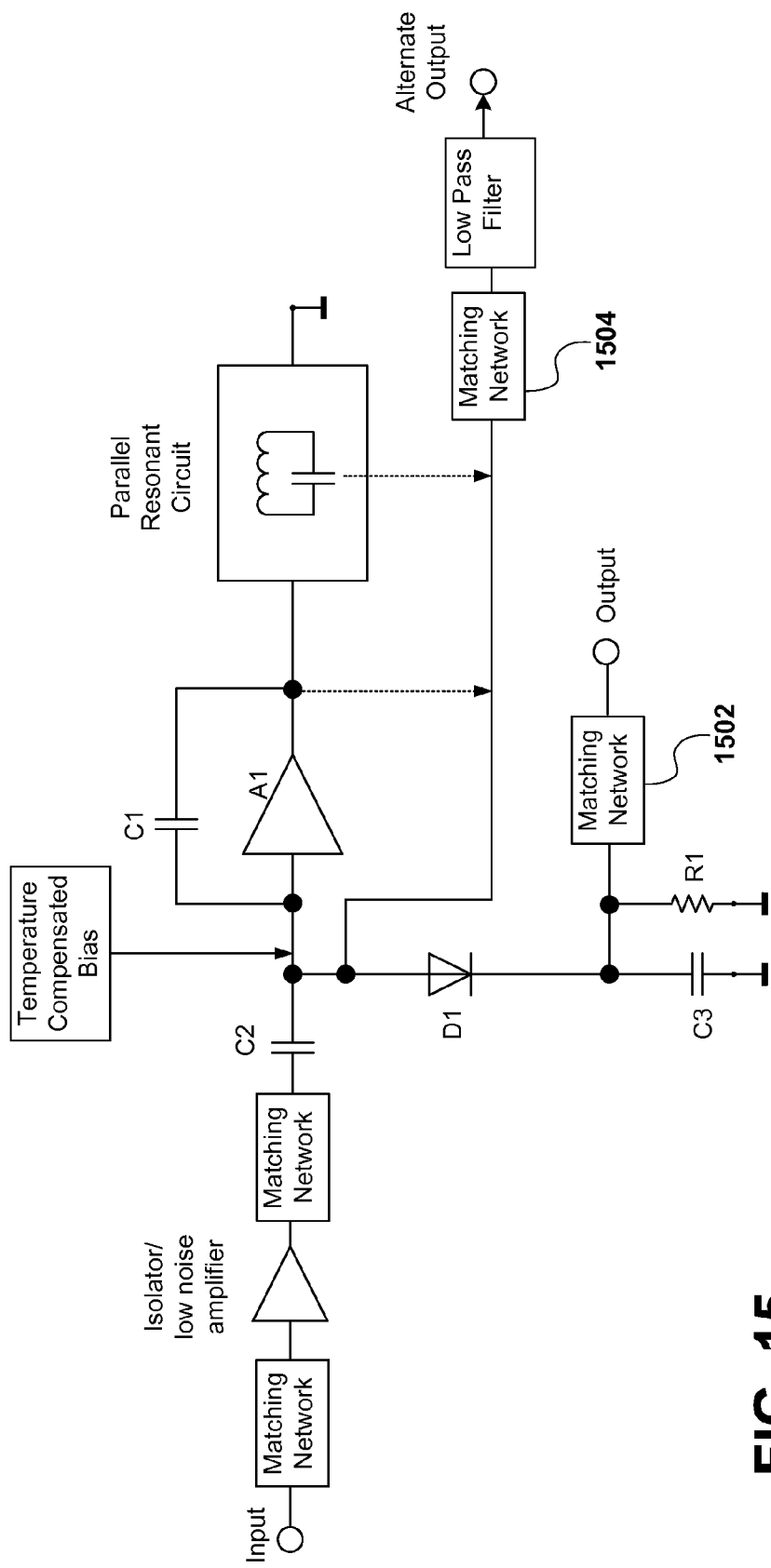
FIG. 15 is a block diagram illustrating a LDA with alternative outputs in accordance with an embodiment.

FIG. 15, takes FIG. 14 one step further. In FIG. 15, the f_rep(t) output can be tapped at various nodes, such as the output on R1, C3 after matching network 1502, or alternatively at the output of the amplifier or on a node or from the parallel resonator, followed by a matching network 1504, or alternatively on the input side of the amplifier, followed by matching network 1504.

As previously noted, the LDA can be regarded as a LC circuit with variable conductance, the later varying cyclically from positive to negative. Consequently, the input impedance varies with time and moves, e.g., on an arc in the low right quadrant of a Smith chart in relation with the LDA oscillation cycle. As a result, several input matching scenarios are envisioned:
1. A fix matched conjugate at the mean value;
2. A fix matched conjugate at the impedance value corresponding to the most interesting behavior point that is the signal buildup from the noise;
3. A fix matched conjugate at the maximum oscillation amplitude level (point in time where the threshold is reached);
4. A dual impedance matching at 1. and 2. above; and/or
5. Variable impedance, for example, in synchronicity with the LDA behavior cycle.

Figure 16A:
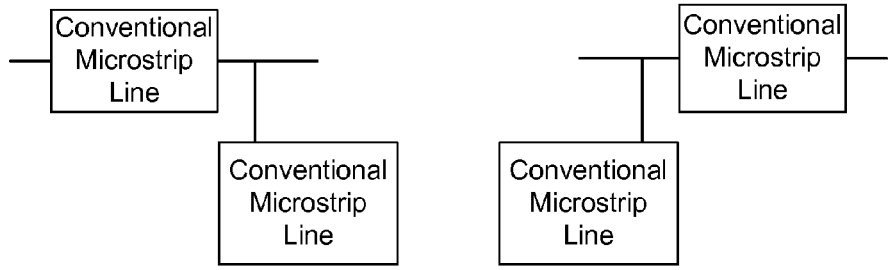
FIGS. 16A and 16B are a block diagrams illustrating solutions for matching two frequencies in accordance with an embodiment.

As illustrated in FIGS. 16A, 16B, 16C and 16D, in a conventional matching network designed with conventional microstrip lines, for example, the series microstrip line will change the real part of the impedance and the shunt stub will adjust the imaginary part. The shunt stub can be opened or shorted. As shown in FIG. 16A, the shunted stub can be placed before or after the series microstrip line depending on where the normalized load impedance is situated on the Smith chart. If the normalized load impedance is inside the 1+jx circle on the Smith chart then the stub should be placed after the series microstrip line and if the normalized load impedance is outside the 1+jx circle on the Smith chart then the shunted stub should be placed before the series microstrip line.

Figure 16B:
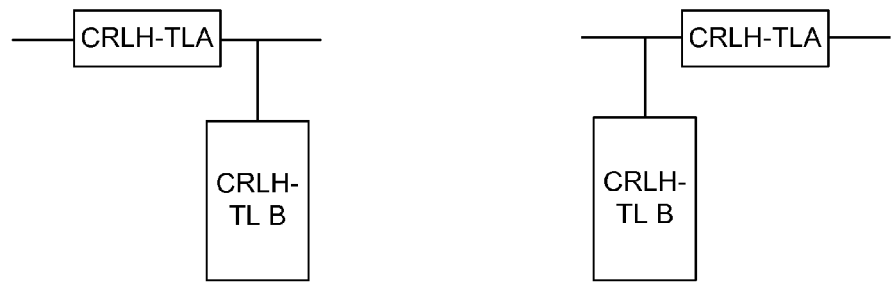
Figure 16C:
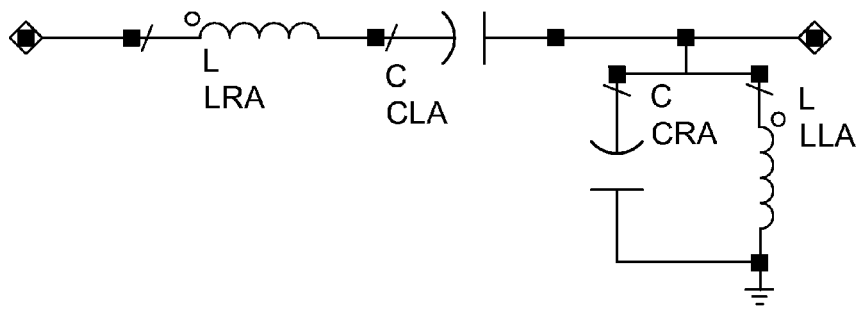
FIGS. 16C and 16D are schematic diagrams illustrating solutions for matching two frequencies in accordance with an embodiment.

As Illustrated in FIG. 16B, it is possible to replace these conventional microstrip lines with composite right-left handed transmission lines (CRLH-TLs) in order to control different impedances at different frequencies. The CRLH-TL B may be opened ended or short-circuited. In embodiments illustrated in FIGS. 16C and 16D, the topology can be slightly modified for similar results. In one case, the CLA may be moved to the right of CRA and LLA. Alternatively, the CLB may be moved to the right of CRB and LLB. For example, the CRLH-TL A can be designed to have a frequency f1 with a phase Φ1 and a frequency f2 with a phase Φ2. A CRLH-TL is designed by using, for example, a series inductor LRA, a shunt capacitor CRA, a series capacitor CLA and a shunt inductor LLA. The CRLH-TL B will have, for example, a series inductor LRB, a shunt capacitor CRB, a series capacitor CLB and a shunt inductor LLB. The impedances of the CRLH-TL A and CRLH-TL B are defined by:

$$ZA = \sqrt{\frac{L_{RA}}{C_{RA}}} = \sqrt{\frac{L_{LA}}{C_{LA}}}$$

$$ZB = \sqrt{\frac{L_{RB}}{C_{RB}}} = \sqrt{\frac{L_{LB}}{C_{LB}}}$$

The series CRLH-TL A may define the real part of the impedance and the shunt CRLH-TL B may define the imaginary part. It is also possible to design variable impedances by replacing the fixed components LRA, CRA, LLA, CLA and LRB, CRB, LLB, CLB by variable/tunable capacitors and variable/tunable inductors. Therefore, the impedances can be changed accordingly to the frequency of operation. For example, these variable impedances can be inserted at the input and output of the LDA, between the LNA output and the LDA input. A variable matching can be inserted at the output of the repetition frequency. Or, in order to have a variable/tunable LDA, it is possible to tune the oscillation frequency to different values by replacing the fixed values of the inductor and the capacitor by variable ones. Different implementations are possible. For example, it is possible to have a fixed CRLH-TL A with a variable CRLH-TL B or a variable CRLH-TL A with a fixed CRLH-TL B or a variable CRLH-TL A and a variable CRLH-TL B.

Figure 16D:
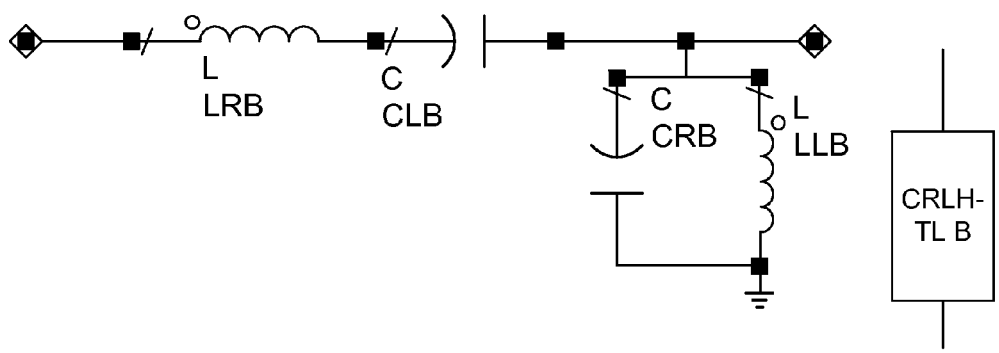
Figure 17:
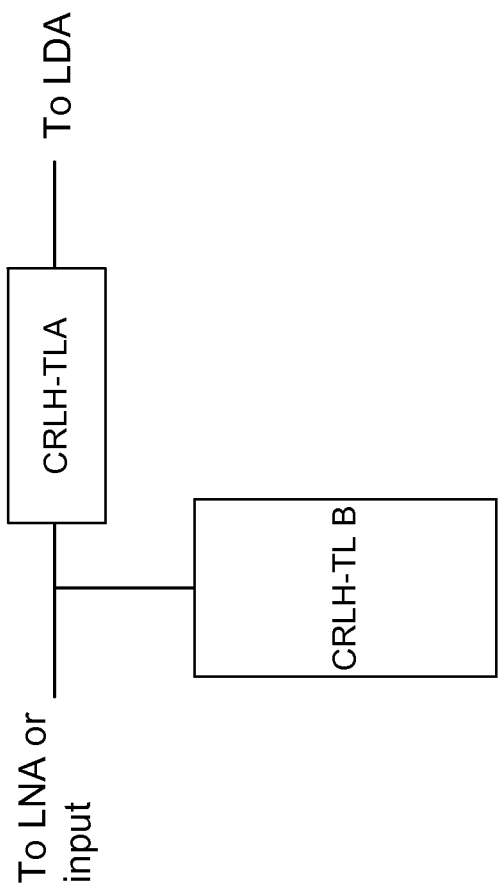
FIG. 17 is an illustration of how a series branch CRLH-TL A may be connected to a LDA and a parallel CRLH-TL B may be connected to a LNA in accordance with an embodiment.

An embodiment of an implementation is illustrated in FIG. 17, where a series branch CRLH-TL A is connected to the LDA and a parallel CRLH-TL B is connected to the LNA and a branch is left open at the bottom where the topology of FIGS. 16D and 16D were modified, such as moving the CLA to the right of CRA (toward LDA).

Figure 18:
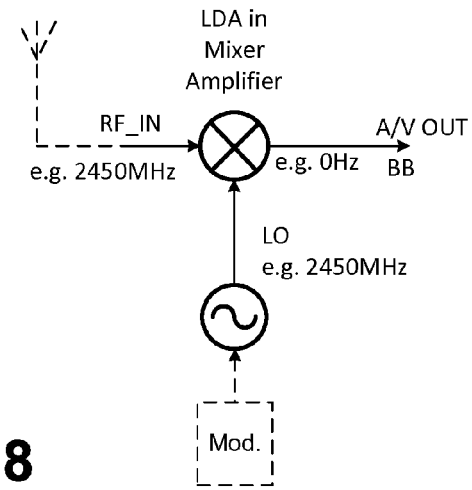
FIG. 18 is a block diagram illustrating a LDA as mixer in accordance with an embodiment.

As illustrated in FIG. 18, the LDA may also be used as a mixer. Prior art embodiments of mixers include a double balanced mixer and a Gilbert cell active mixer. A double balanced mixer typically has high local oscillator (LO) power required, e.g., +3 dBm, a poor noise figure (NF), e.g., 5-6 dB, loss of a minimum of 5 dB versus gain, and limited isolation between the RF, LO & IF ports, e.g., 35 dB LO-RF, 25 dB LO-IF. Gilbert cell active mixers typically require six or more transistors, have limited gain, NF and isolation, have lower LO that is generally internally amplified, and are not suitable as a LNA. An embodiment of a LDA as mixer is illustrated in FIG. 18. This embodiment may be small, affordable and require a low component count. Low LO power is required, e.g., −40 dBm. There is high gain versus loss, e.g., +25 dB. Regeneration of the LDA provides high RX sensitivity and very low NF. There is also excellent isolation LO to IF, e.g., 60 dB and a good isolation LO to RF_IN with a matching network. Last but not least, the embodiment includes a simple and on the flight method to adjust the LDA-mixer balance, if needed.

In addition most of the previous features of the LDA may be retained, which makes this configuration very useful in that it has high sensitivity, regeneration that permits extraction of a weak input signal from the noise, high amplification with low noise figure, low power consumption, frequency selectivity with high skirt ratio, out-band rejection, and a mixer function that frequency down-converts the input RF signal in a manner that is phase related with the input signal and, at the same time, synchronized or sampled with the local LO frequency. Such an LDA-mixer may readily demodulate a PM signal since the corresponding phase change created at each half cycle of the LO will generate a voltage change after demodulation (issued after f_rep and f/v converter).

In embodiments to be described below, two such LDA-mixers may be driven by a LO with 0 degree and 90 degree phase difference, which permits demodulation of a quadratic modulation, such as QPSK or more complex modulations, such as n-ary AM or PM such as n-PSK and n-QAM.

Figure 19:
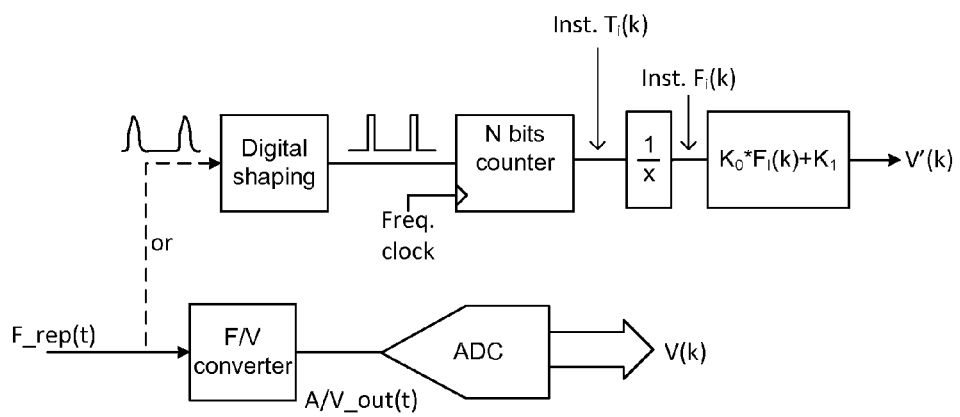
FIG. 19 is a block diagram illustrating how a LDA can generate an analog output or a semi-digital output in accordance with an embodiment.

This embodiment may also operate as a RF transmitter: In this configuration a modulated transmit signal modulates the local oscillator in RF and feeds the LDA-mixer with the same connectivity as a receiver and down converter. In this mode, the A/V OUT output is un-used and the RF_IN port of the LDA-mixer becomes the RF output. The output frequency may be substantially equal to the frequency of the LO and may be modulated as the LO. In the process, the signal may be amplified in the LDA and transmitted to an antenna. This embodiment may also work as a half duplex TX, half duplex RX, or full duplex RX+TX (signal received while another signal is transmitted). Apart from full-duplex or half duplex (TDD), other behavioral modes may be supported, such as simultaneous FDD (one or more simultaneous transmissions and receptions in different frequency channels) and simultaneous CDMA (one or more simultaneous transmissions and receptions at the same frequency with different PN sequence codes). These embodiments have low IF or zero IF. As illustrated in FIG. 19, the LDA can generate an analog A/V output v(t) or a semi-digital IF out from F_rep(t).

Figure 20:
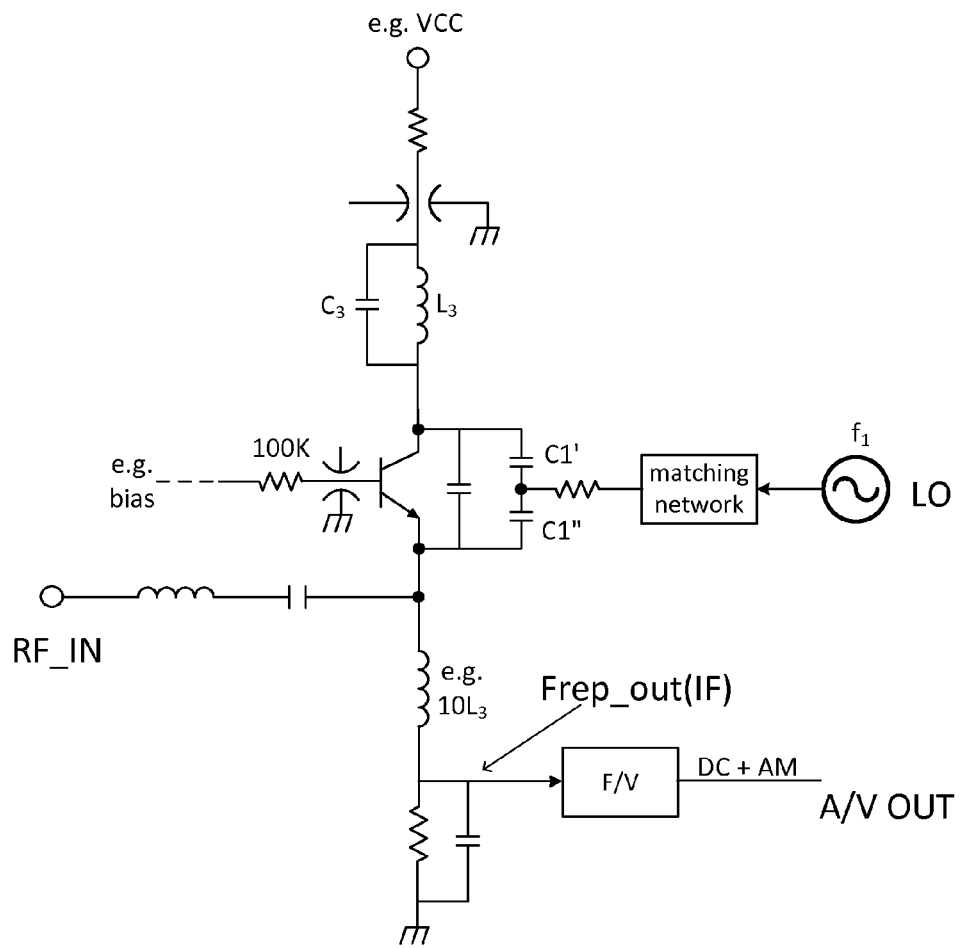
FIG. 20 is a diagram illustrating a second embodiment of a LDA as a mixer in accordance with an embodiment.

A second embodiment of a LDA as a mixer is illustrated in FIG. 20. In this embodiment, the loop gain capacitor C1, is split in to C1' and C1", the feed LO is tightened to the balanced middle point of C1' and C1", the input includes a matching network and the output on the Frep node includes a matching circuit. Frep_out(IF) may be passed through a F/V converter to get a BB A/V_out signal v(t) and passed through an ADC for digital signal v(k). Alternatively, Frep_out(IF) (same as F_rep) may be digitally shaped, frequency metered and scaled to get v'(k), with v'(k) substantially v(k). This embodiment makes balance adjustment possible with adjusting C1' or C1". For example, if the LDA-mixer is perfectly balanced, a modulated signal on the LO may create no variation on the F_rep(t) output that may equate to a constant A/V output voltage. However if the LDA-mixer is unbalanced, the modulation on LO may be present on F_rep(t) and create instantaneous changes of frequency in the F_rep(t) signal since it tends to demodulate the input or LO signal. After digital or analog f/v conversion (demodulation) the A/V signal v(t) or counterpart digital v(k) will carry the undesirable modulated signal with an amplitude that may be proportional to the level of the imbalance.

One method for calibrating such a mixer is through modulating the LO to get a constant F_rep, which can be an all integrated calibration. When the LDA-mixer works in receive or down-converter, it may be dynamically balanced by modulating the LO and therefore creating an undesirable f_rep(t) variation until the LDA mixer has been well balanced. In transmit mode, the same can be done for balancing the LDA-mixer.

From the above, it should be apparent that an adjustment of C1', C1" or an uneven adjustment of both C1' and C1" may correct dynamically the mixer unbalance. For this effect, one or more variable capacitor circuits may be used and controlled by the circuit or a controlling unit in the communication unit. In one embodiment, one or more varicap(s) is used replacing or in parallel with C1', C1" and controlled by an analog voltage. In another embodiment, one or more digital controlled bank of capacitors in binary progression (1, 2, 4, 8, ..., n) is used, and connected similarly, and permitted to generate any capacitance value from (1 to 2n−1)*Cref.

Figure 21:
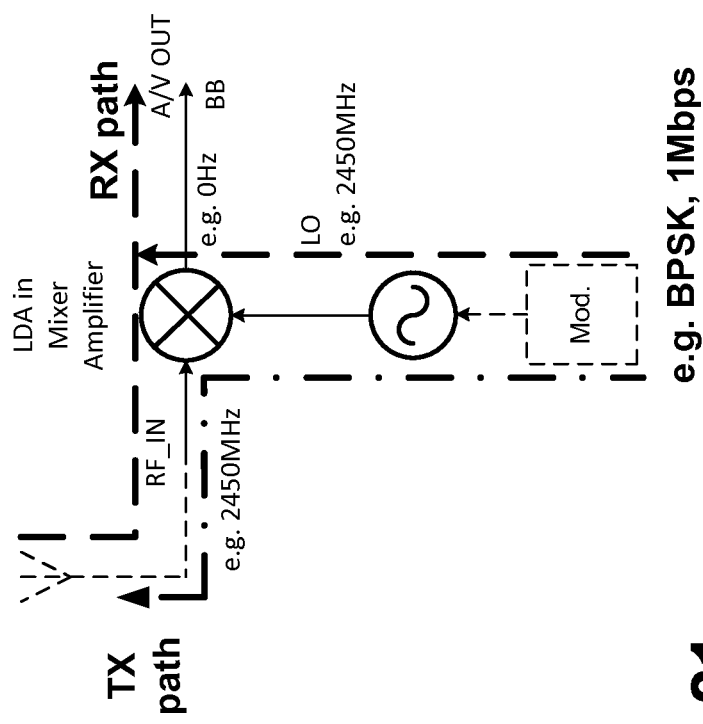
FIG. 21 is a diagram illustrating a third embodiment of a LDA as a mixer in accordance with an embodiment.

A third embodiment of the LDA as a mixer is illustrated in FIG. 21, which further illustrates the LDA's bidirectional operation in a mixer. In receive mode, the RF input signal is received from the antenna feeds of the RF_IN port of the mixer. The LO is provided to the LDA and in down-conversion mode. The output is A/V_out in baseband (0 Hz) after F/V conversion or f_rep in intermediate frequency (IF), i.e., semi-digital, e.g., at 5 MHz. In transmit mode, the input signal modulates the LO and is transmitted in reverse to the antenna with higher power. In this embodiment, full duplex (TX and RX) or half duplex (TX or RX) are possible.

Figure 22:
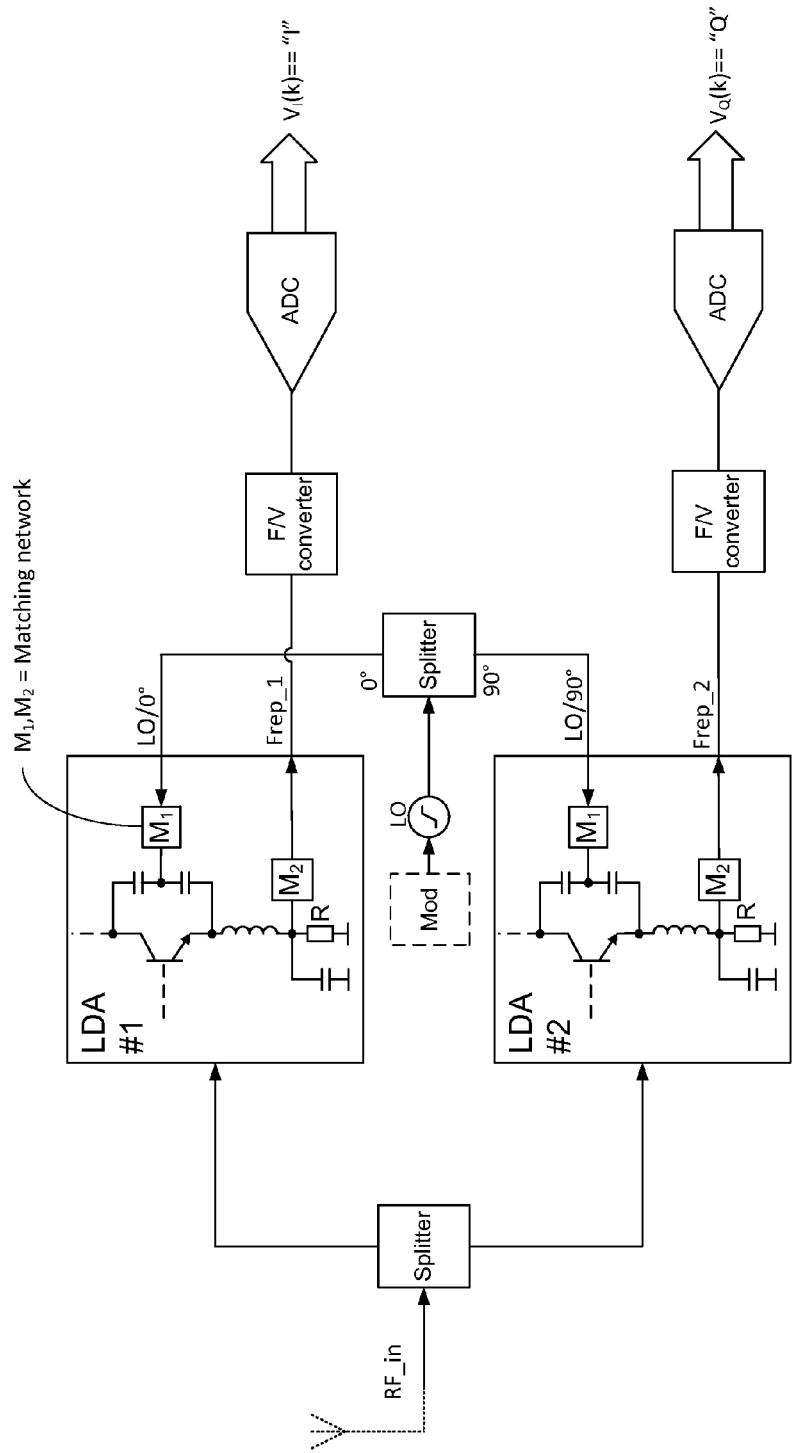
FIG. 22 is a block diagram illustrating a LDA mixer implemented as a QPSK demodulator with analog I, Q outputs in accordance with an embodiment.

LDA mixers may be used in a number of different applications. FIG. 22 illustrates an LDA mixer implemented as a QPSK demodulator with analog I, Q outputs. This embodiment has a simple topology with a low component count, making it more affordable, and can be implemented in an integrated circuit. In this embodiment, the LDA is combined as a narrow band (NB) LNA and NB mixer. This provides a high integration of functions, such as LNA, mixer, RX chain, and homodyne conversion. The LO injection is made through a 90 degree splitter or 2*LO through a digital divider by 90 degrees.

Figure 23:
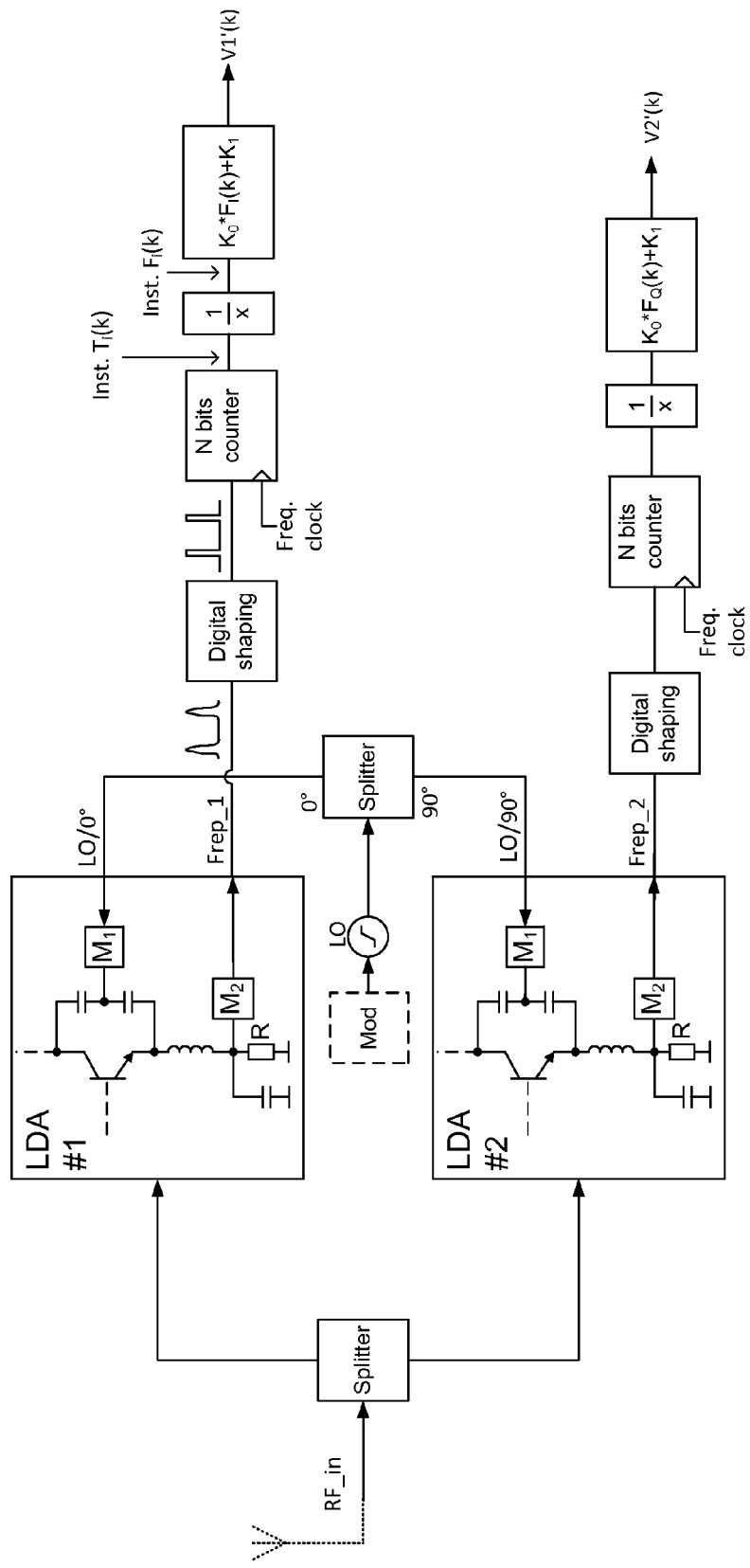
FIG. 23 is a block diagram illustrating a LDA mixer implemented as a QPSK demodulator with digital I, Q outputs in accordance with an embodiment.

FIG. 23 is similar to FIG. 22, but in this case, the LDA mixer is implemented as a QPSK demodulator with digital I, Q outputs. In this embodiment, the F_rep(t) carries the data as instantaneous frequency (or the inverse of the elapsed time from pulse to pulse) and F_rep(t) is semi-digital, i.e., is digitally shaped, and feeds a N bits counter with a high speed clock configured in period-meter. The output of the counter is digitally inverted to F(k) and rescaled to $$v(k)'=CF*F(k)+K0$$

where,
    CG and KO are constants; and
    v(k)' is substantially equal to v(k), which is obtained with an ADC.
In the embodiment, one path $v_I'(k)$ give I and the other path $v_Q'(k)$ gives Q.

Whether the LDA mixer is used as a QPSK demodulator with analog or digital I, Q outputs, the simple topology of either embodiment has a low component count that can be affordably produced and implemented in integrated circuits. As noted, the LDA can be a combined NB LNA and NB mixer. The high integration functions include LNA, mixer, RX chain, low IF conversion. In the Digital I/Q version, the ADCs may be replaced by fast counters, which may save power and a substantial area of the chip size, and enables the removal of anti-aliasing ADC filters and buffers. As noted, the LO injection may be done through a 90 degree splitter or through a digital divider by 90 degrees.

Figure 24:
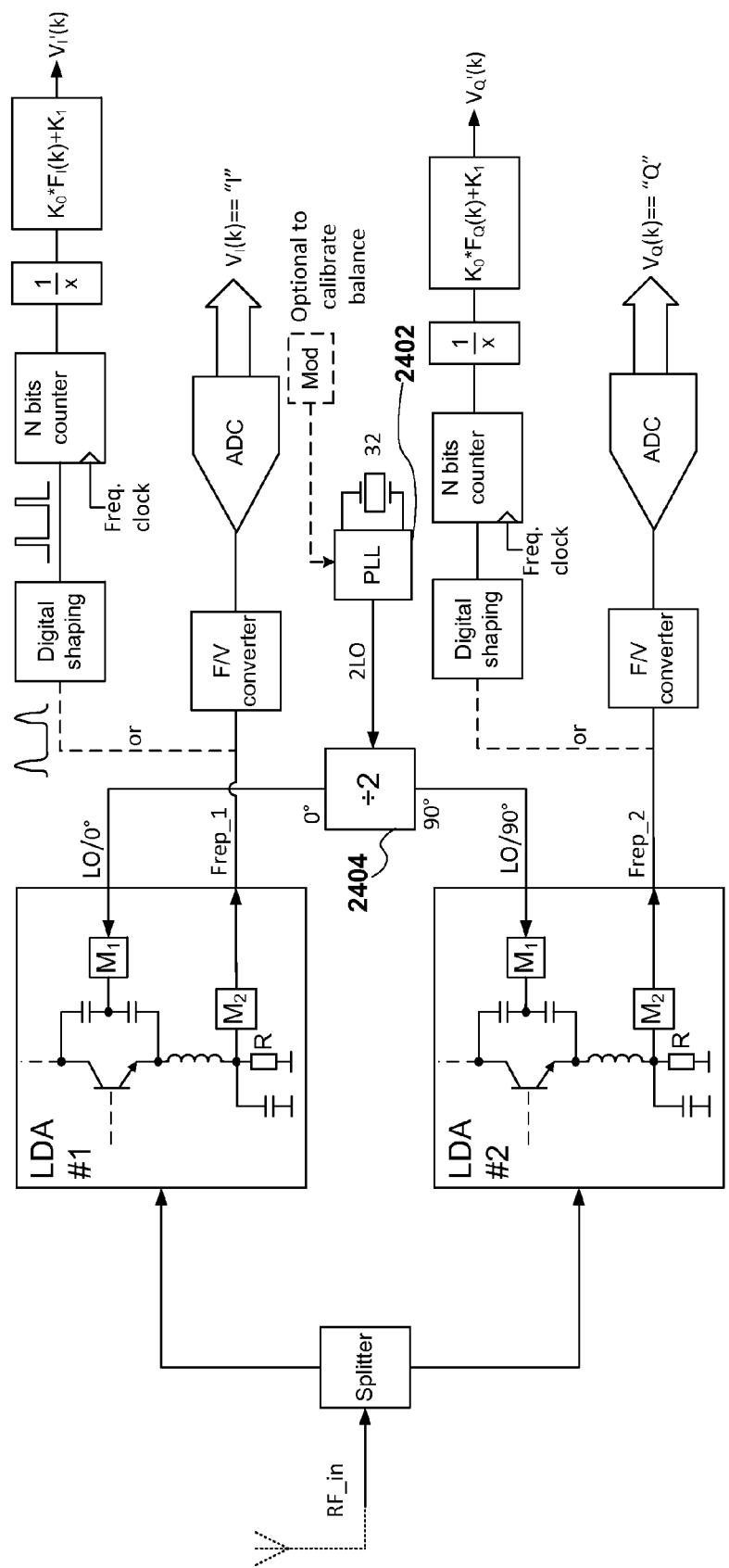
FIG. 24 is a block diagram illustrating a variation to the LO implementation of a dual LDA mixer in accordance with an embodiment.

In such an embodiment, the RF input splitter can use various known power combiner techniques: Resistive splitter, Wilkinson splitter, hybrid splitter, coupler, meta-material splitter, and so on. A resistive splitter creates 6 dB attenuation and manages a limited isolation from LDA#1 to LDA#2 inputs and vice versa of only 6 dB. A coupler suffers excess attenuation as well. A Wilkinson splitter causes between 3 and 4 dB loss, but can provide a high isolation in the order of 20 to 35 dB. An active splitter based on the LDA may be a differential output amplifier or LNA. This implementation may replace the use of a passive splitter, reduce size (since it can be integrated in an integrated circuit) and provide a good isolation from LDA#1 to LDA#2 inputs, and also from LDA#1,2 to the RF input. On the other side, low power consumption and low NF may be challenging. In a receiver design, the EMI leaking backwards to the antenna may be problematic when in restricted bands. Also the LDA needs an excellent low level of reflection at the input for best regeneration performance. Other splitter techniques can be used that are well known in the RF engineering. FIG. 24 illustrates another variation to the LO implementation, where a PLL 2402 with LO at 2*fo is input to a 2 by digital divider 2404 with a 0 and 90 degree phase shift.

Figure 25:
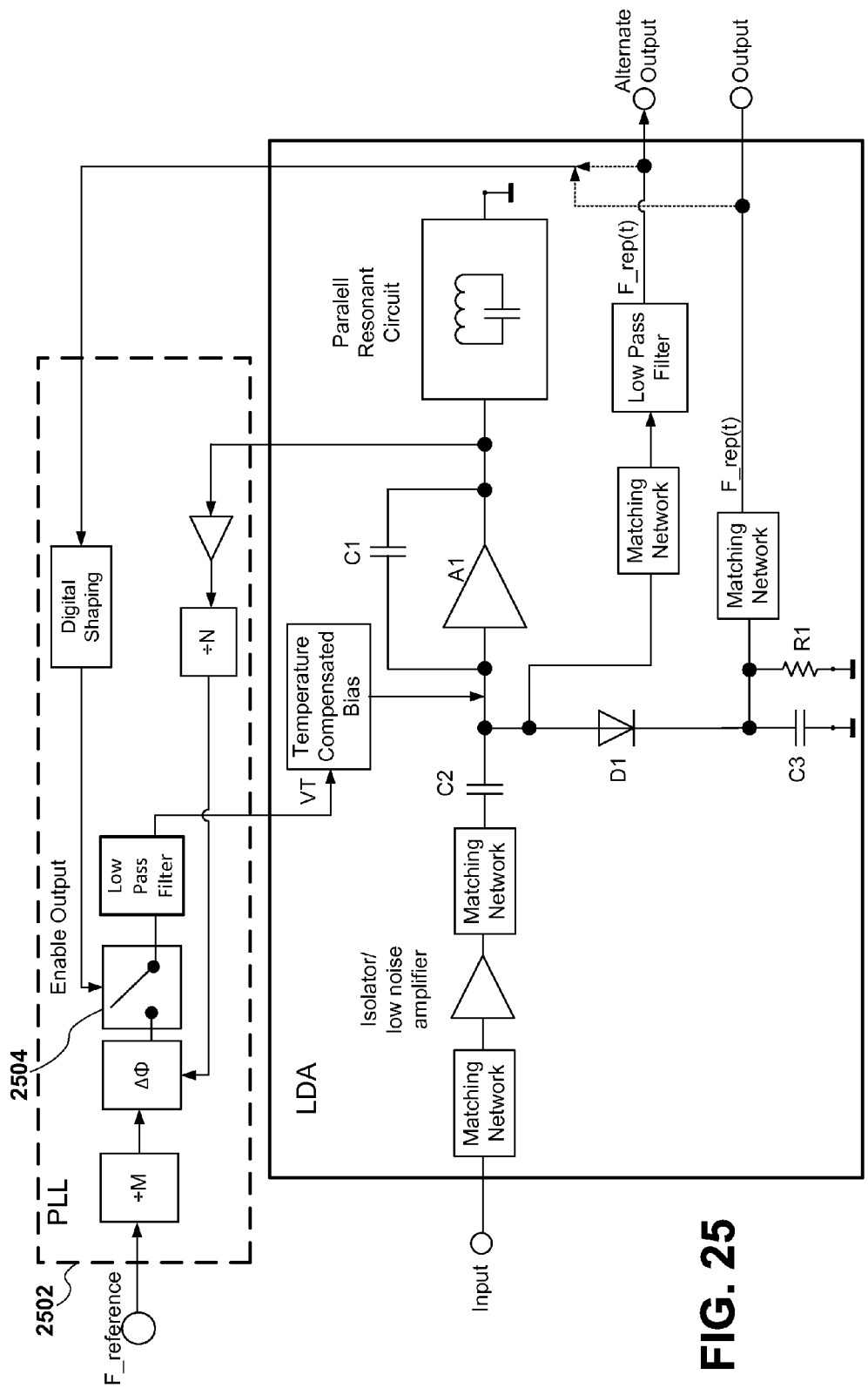
FIG. 25 is a block diagram illustrating a LDA as an AM demodulator with alternative outputs.

The LDA may also be implemented as an AM demodulator. An embodiment of this implementation based on FIG. 15 is illustrated in FIG. 25. A PLL 2502 is added to the LDA in order to lock precisely the central oscillation frequency of the LDA to the one of an accurate reference frequency F_reference with $$F\_LDA=(F\_ref/N)*M$$

In this embodiment, the LDA is stabilized in a PLL with low response time and used like a slow time response voltage controlled oscillator: The LDA's oscillation frequency is locked into the PLL so that it can be accurate and substantially identical to the central frequency of the input signal, for instance a specific channel in a frequency band. The LDA can also overcome temperature drift or tolerance of components. A copy of the output f_rep(t) coming from the output or alternate output or second or third alternate output (as described in FIGS. 6, 7 and 8) can be used to control a sampler in the PLL 2502. The switch 2504 enables the output fo. The switch 2504 is open when the phase comparator is disconnected and no quench pulse is present and is closed when a quenching pulse appears. On the other side, the time sampled output frequency from the amplifier output A1 is divided by N and feeds the phase/frequency comparator. The other input of the comparator is fed from a ref frequency divided by M. The output of the phase comparator is followed by the switch and a low pass filter and feeds the input control of the VCO, Vt, in this case the LDA. The control input Vt can be either changing the bias conditions of the amplifier and therefore slightly changing the LDA oscillation frequency or attached to a variable capacitance varicap in the resonator to directly change the oscillation frequency. The demodulated AM signal can be derived from the output or one of the alternate outputs as described in FIGS. 6, 7 and 8. In this embodiment the PLL time response is designed to be slower than the data rate so that the control of the LDA central frequency is slow and transparent for an incoming modulated signal. PLL time response may be adjusted by several parameters: the divider factor N, the low pass filter cut frequency, the gain of the phase comparator, among others.

In yet another embodiment, an AM-LDA may be used to combine receive LNA pre-amplification and QPSK/n-QAM demodulation methods. This combined LDA and universal demodulation circuitry may use one or more LDAs. In particular, the technology may demodulate QPSK, a digital form of phase modulation (PM) used by such devices as wireless routers, with numerous dB improvement in receive sensitivity, interference rejection, skirt ratio, low power consumption and reduction of components in a receiver. A few schematic variations will be explained in detail below, including a QPSK demodulator with polar coordinates, a QPSK demodulator with Cartesian coordinates, a QPSK demodulator with the LDA as a mixer and Cartesian coordinates, and variation of these two key topologies.

Figure 26:
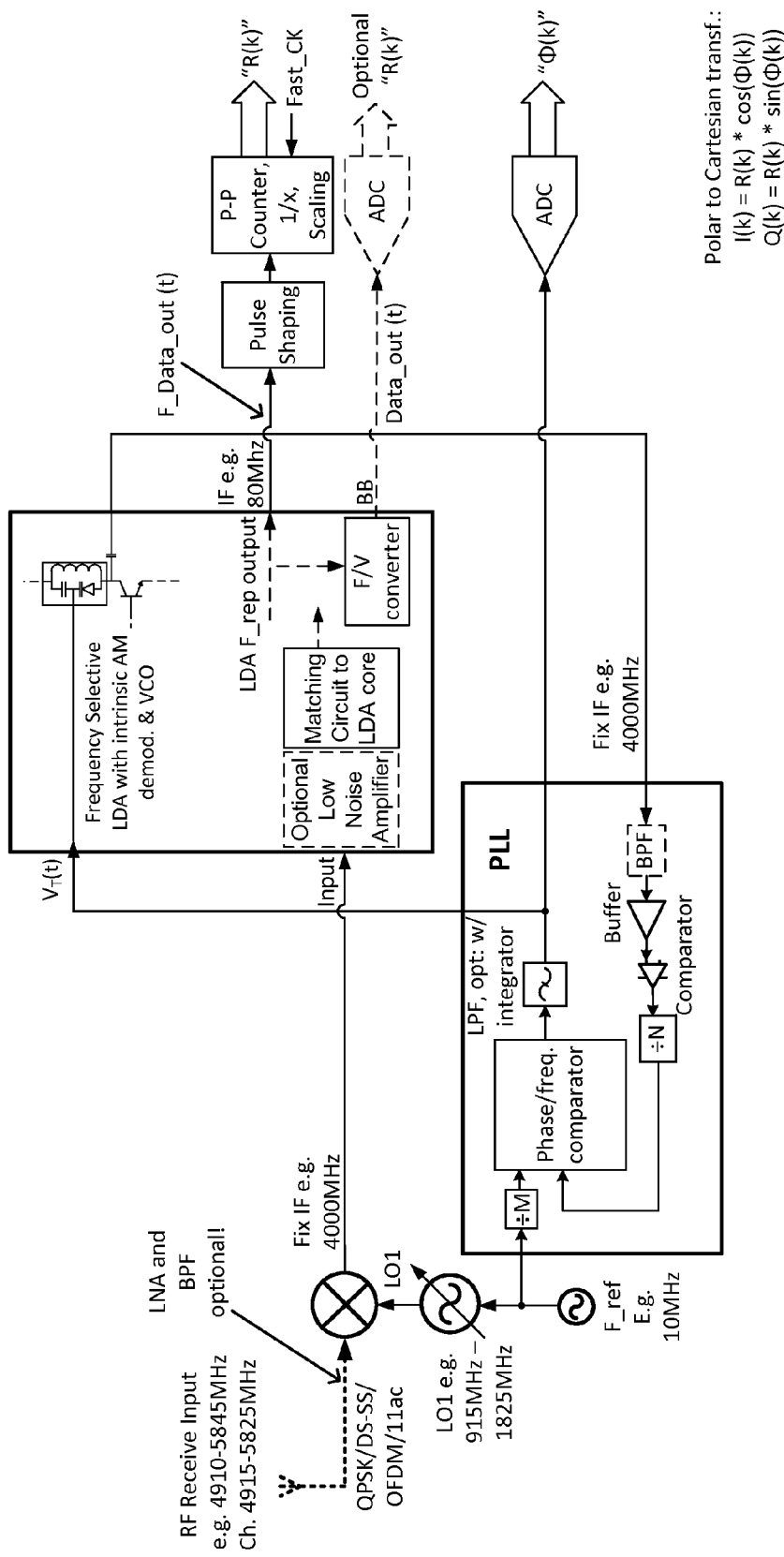
FIG. 26 is a block diagram illustrating a super-heterodyne AM-LDA LNA/QPSK/M-QAM demodulator with polar modulation outputs in accordance with an embodiment.

FIG. 26 illustrates a standard super-heterodyne topology followed by an AM-LDA in a polar configuration. In this configuration, the module and the phase rather than I and Q are generated. I and Q can be computed by the digital processor as shown in FIG. 26. The LDA receives the input signal in a fix IF frequency. The LDA down converts this signal in a low IF F_data_out(t). After some limited pulse shaping, the repetition frequency rate signal is digital and the instantaneous frequency holds the data module information. In one implementation, a pulse to pulse period meter, clocked by a fast clock, measures the period from pulse to pulse continuously. The result is inverted to get the frequency and scaled to find the module R(k). Optionally, the repetition frequency rate signal F_data_out(t) is converted to a baseband signal Data_out(t) with a simple frequency to voltage converter, and finally sampled with an ADC to create the module R(k).

The phase information is obtained with a PLL in a FM/phase demodulation configuration. The phase happens to be the correction voltage that feeds the VCO (LDA oscillator). Of course, the PLL loop bandwidth must be designed properly, and in this demodulation configuration must be faster than the incoming data rate. Finally an ADC converts the phase into a digital word Phase(k). The last step is the computation of I and Q with:

$$I(k)=R(k)*\cos(\text{Phase}(k))$$

$$Q(k)=R(k)*\sin(\text{Phase}(k))$$

This circuit brings very high sensitivity due to the regenerative nature of the LDA. Selectivity is better than a standard super-heterodyne circuit because of the superior skirt ratio of the LDA. Therefore, no band pass filter may be required before the input mixer or if present, degraded. Also, no input LNA is required since the regenerative factor of the LDA and the input isolator contribute to a high sensitivity. Furthermore, no receive chain is required, nor are two ADCs, since the output is already at a high level and quasi-digital. Finally, it is a relatively simple circuit and has low power consumption.

A LNA/isolator and a conjugate matching circuit directly at the input of the LDA may be used in order to avoid LC energy from leaking out to the input port and being reemitted on the antenna (EMI problems), and the effect of the regeneration behavior of the LDA itself by being reflected to the input with a non-coherent phase (which defeats the purpose of regeneration). In other words, an isolator, of e.g., 20 to 50 dB isolation, is desirable at the input of the LDAs. Due to the time variant regeneration process, its position before the LDA does not decrease the SNR after regeneration.

Figure 27:
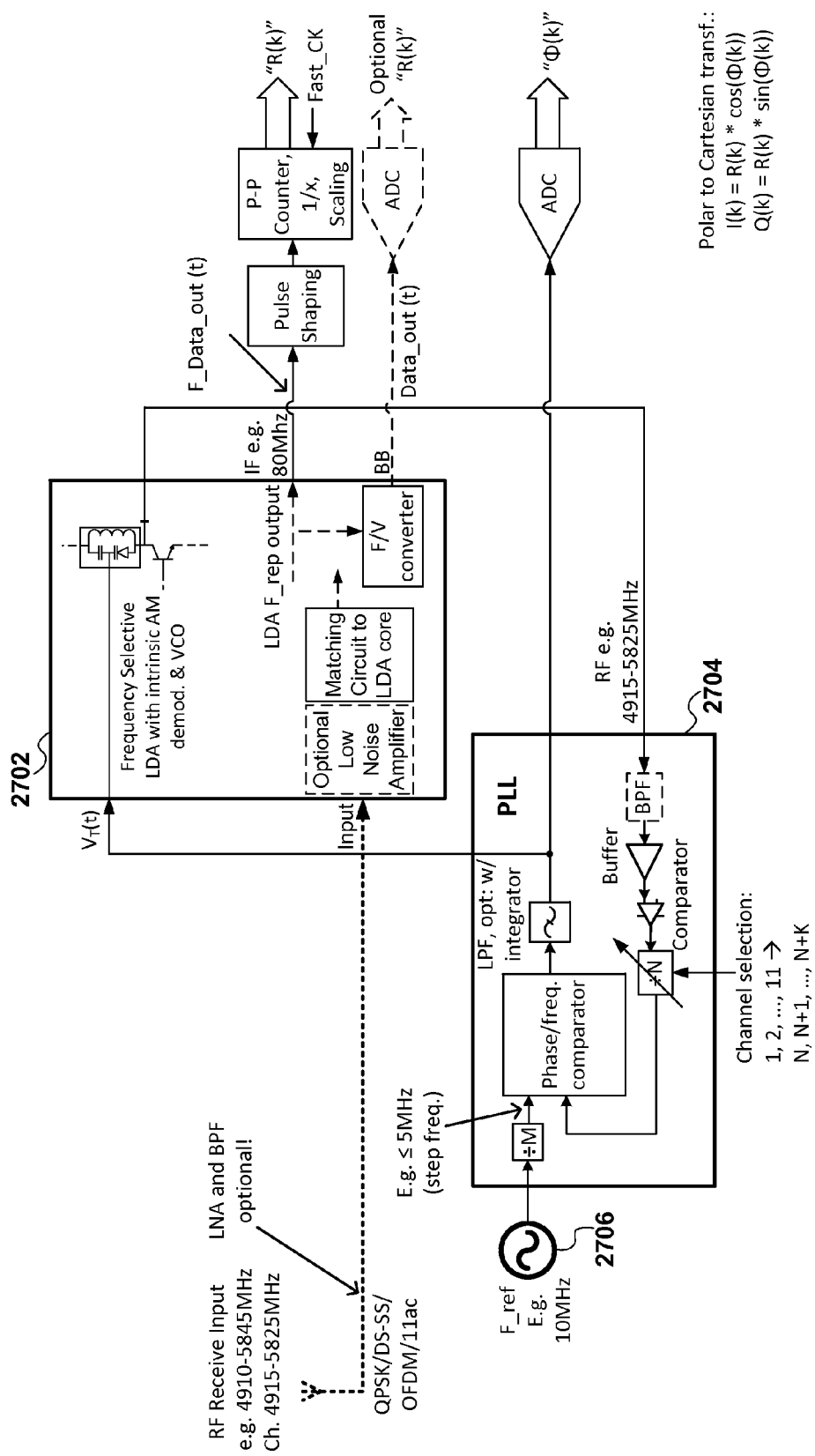
FIG. 27 is a block diagram illustrating an AM-LDA LNA/QPSK direct demodulator with polar modulation outputs in accordance with an embodiment.

FIG. 27 is similar to the circuit illustrated in FIG. 26 and illustrates an embodiment of an AM-LDA with LNA/QPSK direct polar coordinates demodulation. In FIG. 27, the circuit provides a demodulated signal as a polar coordinate signal module plus phase. In this embodiment, however, there is no super-heterodyne stage at the input to the LDA 3202 so the LDA 2702 does the down converting at an adjustable frequency, as required to tune to the right input channel, with the help of PLL 2704 and a local reference frequency 2706. The LDA 2702 is put into the PLL 2704 to lock to the desired channel. A further difference between the circuit of FIG. 27 and FIG. 26, is that the LDA 2702 of FIG. 27 sees the input noise bandwidth of the entire frequency band of interest, not just the selected channel. This may result in some reduction of receive sensitivity and less selectivity.

Figure 28:
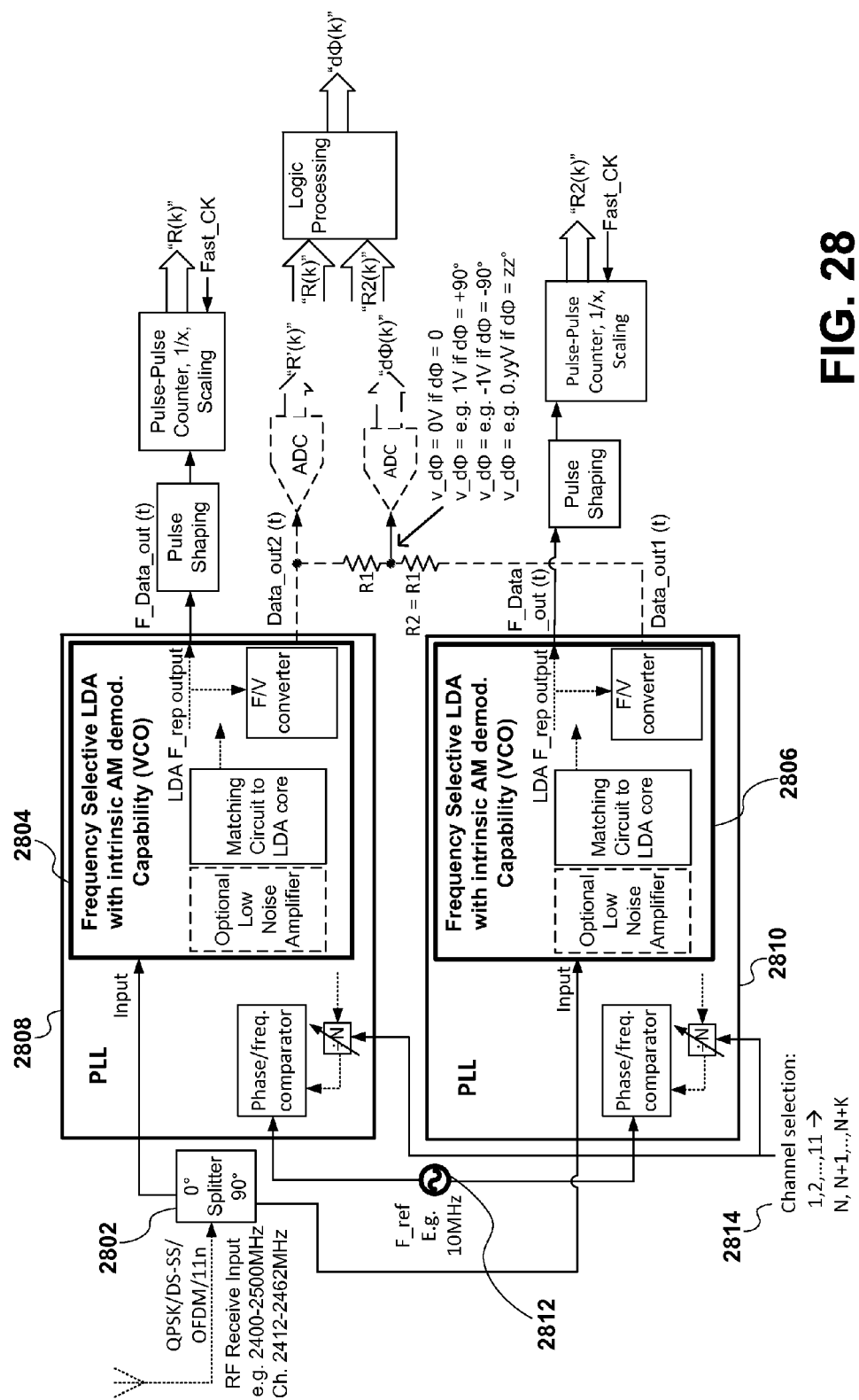
FIG. 28 is a block diagram illustrating another AM-LDA LNA/QPSK direct demodulator with polar modulation outputs in accordance with an embodiment.

In FIG. 28, yet another implementation of an AM-LDA with LNA/QPSK direct polar coordinates demodulation is illustrated. The circuit depicted in FIG. 28 includes a quadratic splitter 2802 (shown at 0 to 90 degrees phase shift, but which could also be +45 to −45 degrees phase shift) on the input, two AM-LDAs 2804 and 2806 locked each in its own PLL 2808 and 2810, respectively. Each PLL 2808 and 2810 is fed with the same reference frequency 2812 and the same channel selection 2814. Other functions and characteristics of the circuit in FIG. 28 are similar to those of the circuit illustrated in FIG. 26, except the output functions, which include digital processing options and analog processing options.

For digital processing, R(k) and R2(k) are gathered from both LDAs 2804 and 2806, respectively, and the phase information is extracted from the difference between them as follows:

$$\text{Phase}(k)=K*R(k)-R2(k)+\text{Phase}(0)$$

A mapping table and scaling can be derived to determine K and Phase(0). Since Phase(k) is digital, an optional look up table may be added to correct non-linearity in the transfer function dPhase(k)_out vs. [R(k)−R2(k)]. At the end R(k) and dPhase(k) are resolved and I and Q can be computed as earlier discussed. This implementation removes the need to use two high performance fast ADC, which may be expensive components.

For analog processing, the voltage at the midpoint of the resistive divider R1, R2 is fed by Data_out2(t) on the output of LDA 2804 and by Data_out1(t) on the output of LDA 2806 so as to provide a zero voltage difference when the phase difference is zero between I and Q. All combinations of phase/voltage can be addressed through this arrangement, as illustrated in FIG. 28 with the notes regarding v_dPhi with respect to the four quadrants data out. At the end R(k) and dPhase(k) are provided and I and Q can be computed as earlier discussed.

Figure 29:
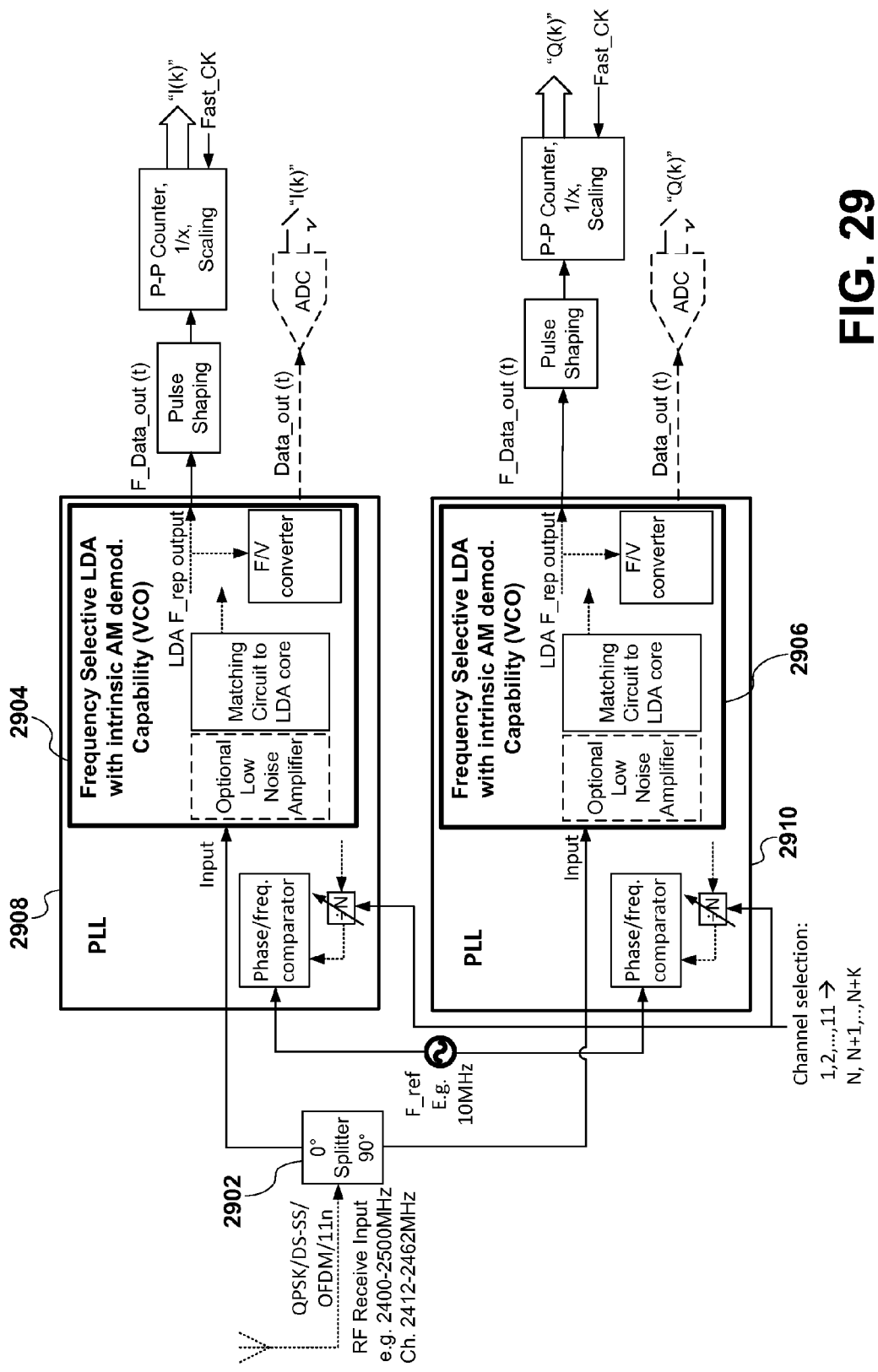
FIG. 29 is a block diagram illustrating an AM-LDA LNA/QPSK direct demodulator with a quadrature splitter and dual PLLs in accordance with an embodiment.

FIG. 29 discloses an embodiment of an AM-LDA with LNA/QPSK direct demodulation with a quadrature splitter and dual PLLs. As illustrated, FIG. 29 shows the quadratic splitter 2902 splitting the signal in zero and 90 degree phase shift. The top LDA 2904 and the bottom LDA 2906 are locked separately into a dual PLL 2908 and 2910, respectively, to the desired channel. As previously discussed, the outputs I and Q are obtained from the repetition frequency F_Data_out(t) of the branches I and Q and similarly digitized or using two FN converters to create I and Q Data_out(t). The other characteristics of the circuit illustrated in FIG. 29 are similar to the circuit illustrated in FIG. 26, except that the LDAs 2904 and 2906 see the input noise bandwidth of the entire frequency band of interest, not just the selected channel. The result may be some reduction of receive sensitivity and a little less selectivity.

Figure 30:
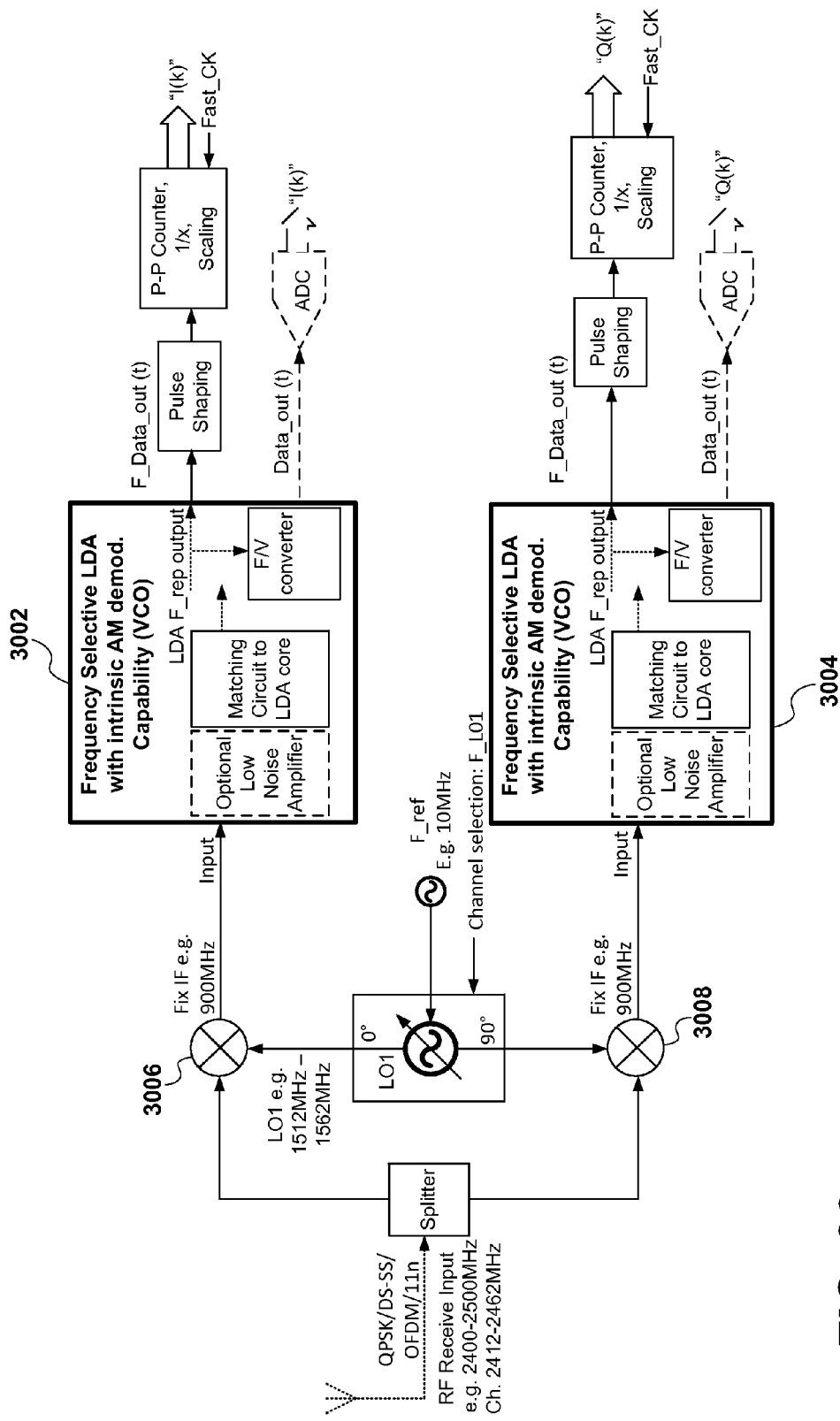
FIG. 30 is a block diagram illustrating a super-heterodyne AM-LDA LNA/QPSK demodulator with QPSK as first stage in accordance with an embodiment.

Another embodiment of an AM-LDA is illustrated in FIG. 30. This embodiment is similar to the embodiment of FIG. 26, except that I and Q are created directly in Cartesian coordinates. This requires two LDAs, 3002 and 3004, and a front end to each LDA that starts with a standard super-heterodyne stage 3006 and 3008, respectively. The rest of the circuit is similar to FIG. 26 with each LDA demodulating either I or Q and no PLL. The embodiment of FIG. 30 may be interesting from the perspective that both ADCs may be replaced by fast counters, fast clock, and some simple digital processing.

Figure 31:
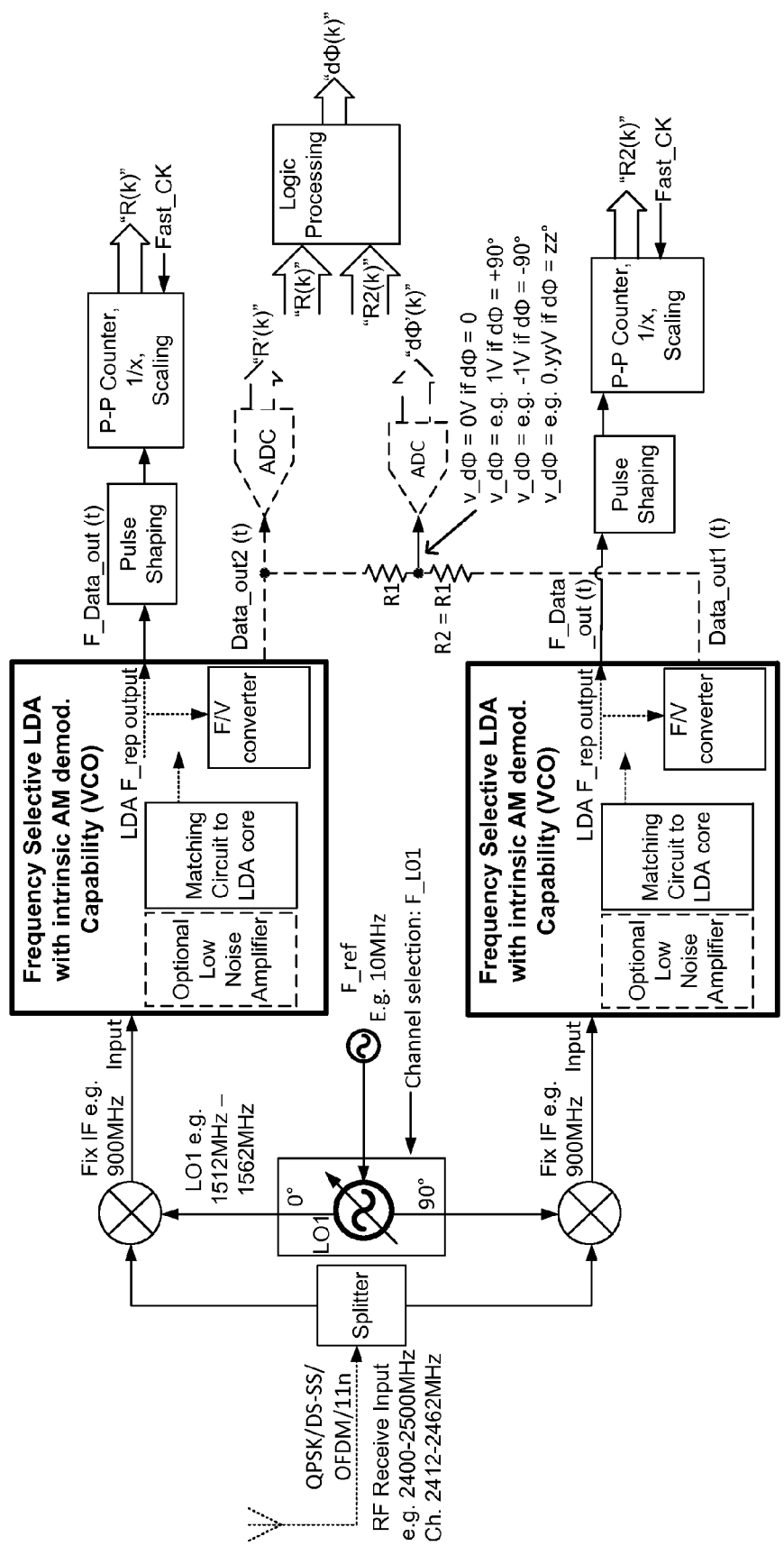
FIG. 31 is a block diagram illustrating a super-heterodyne AM-LDA LNA/QPSK demodulator with polar modulation computation outputs and QPSK as first stage in accordance with an embodiment.

A further embodiment of a super-heterodyne AM-LDA with LNA/QPSK demodulation and with polar modulation computation outputs and QPSK as the first stage is illustrated in FIG. 31. This embodiment includes Cartesian I/Q coordinate demodulation with a super-heterodyne circuit on the input side followed by a pair of LDAs working in a fix IF. Both LDAs are paired (all active components of both LDAs are on the same silicon substrate), thereby providing a matched behavior if variation or drift happen with temperature or from other parameters. As with FIG. 28, the analog or digital output processing, and other characteristics, are the same as those described in reference to that figure.

Figure 32:
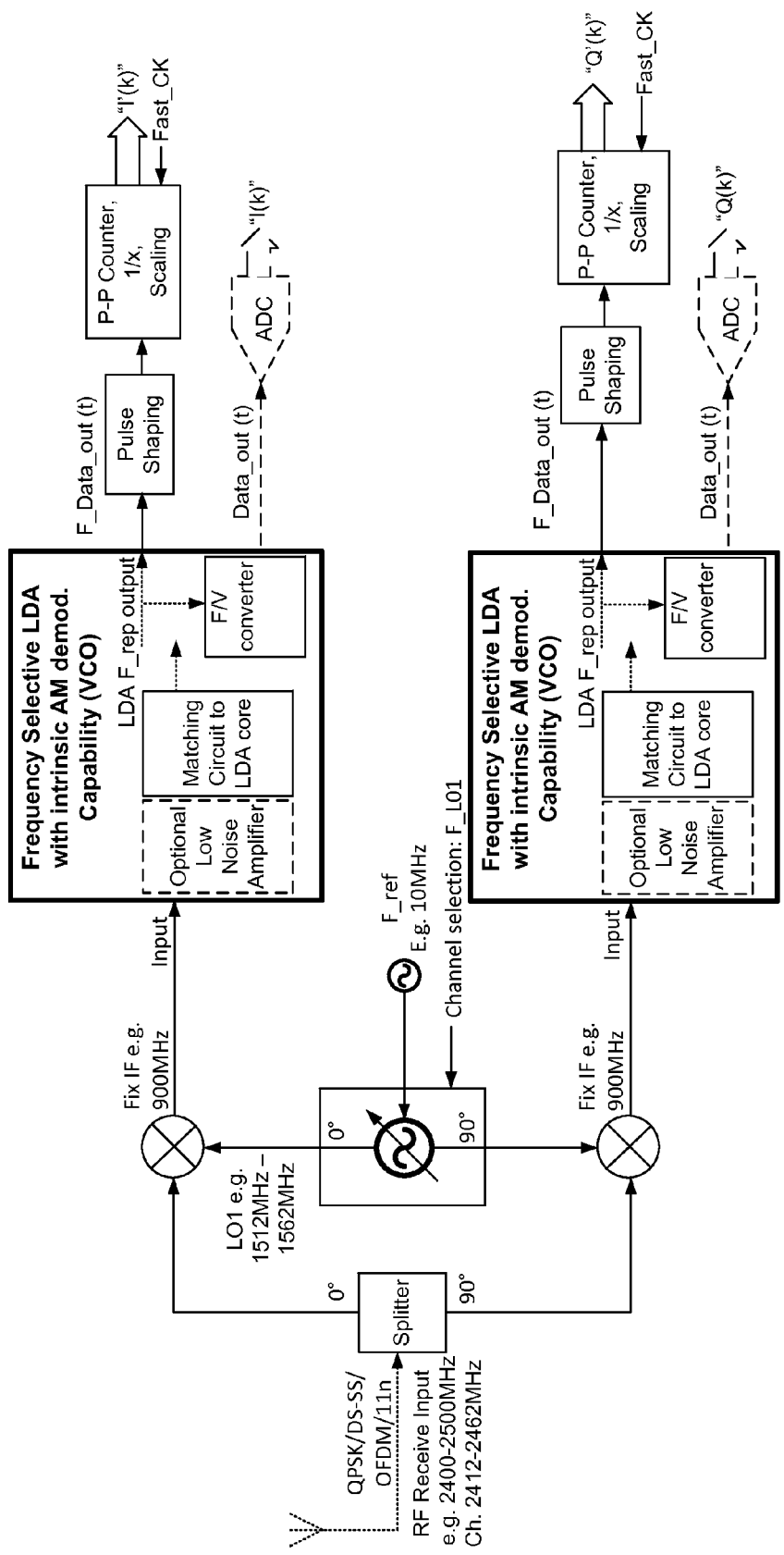
FIG. 32 is a block diagram illustrating a super-heterodyne AM-LDA LNA/QPSK demodulator with QPSK as first stage and a quadrature splitter in accordance with an embodiment.

FIG. 32, which is also a variant of the circuit described in FIG. 28, illustrates a super-heterodyne AM-LDA with LNA/QPSK demodulation and with QPSK as first stage with quadrature splitters. In this embodiment, each front splitter is a quadrature splitter that creates a phase delay of 90 degrees between the two branches, while the LO provides the same signal to the two mixers. This embodiment may simplify practical implementation of this type of embodiment.

Figure 33:
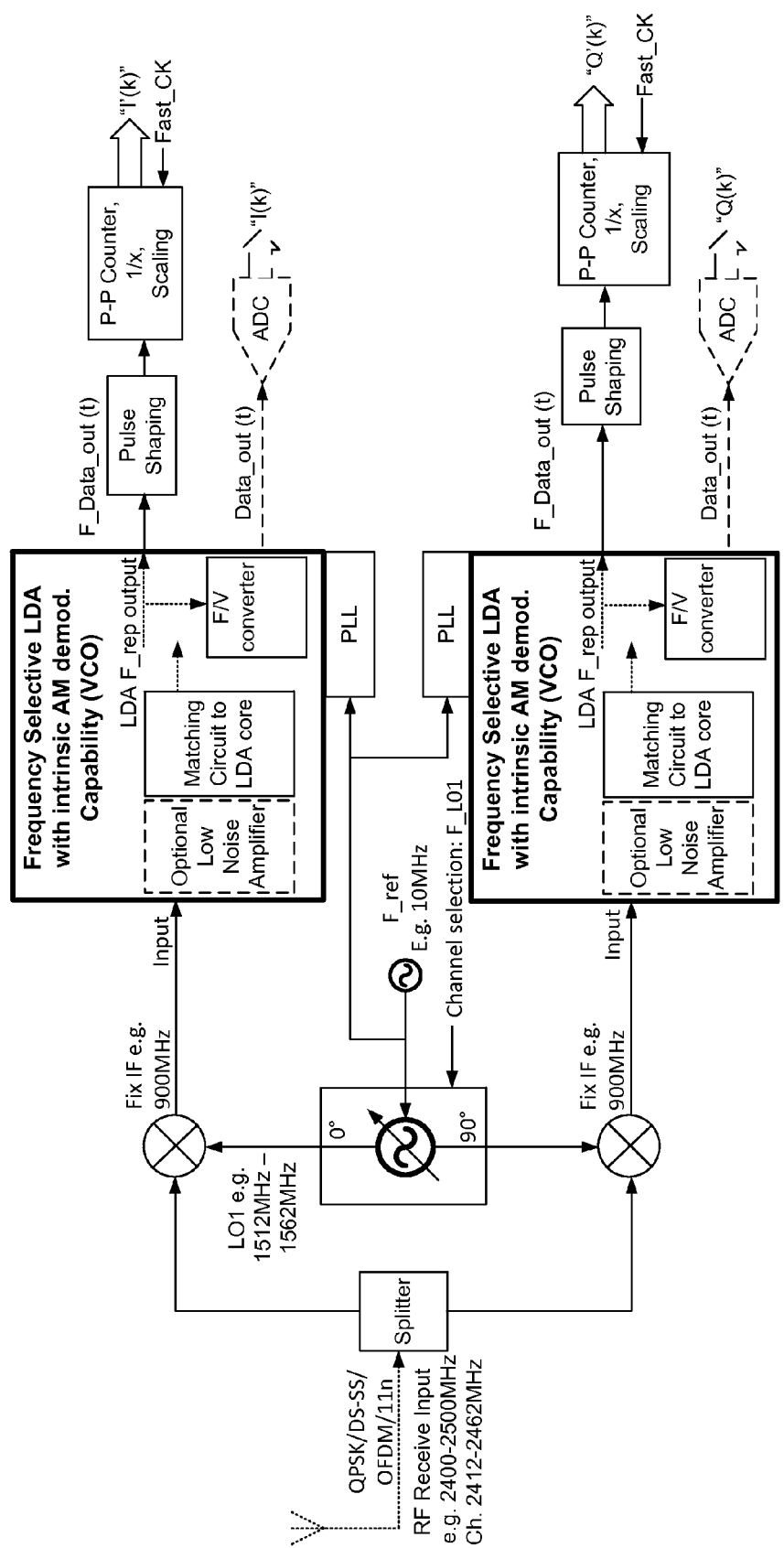
FIG. 33 is a block diagram illustrating a super-heterodyne AM-LDA LNA/QPSK demodulator with QPSK as first stage and dual PLLs in accordance with an embodiment.

FIG. 33 illustrates yet another embodiment that is similar to that illustrated in FIG. 29, except that one PLL per LDA is added. Each PLL locks the LDA to a precise frequency and may prevent possible variation (drift) with temperature or other parameters. The other characteristics of this embodiment are similar to the circuit described with respect to FIG. 26.

Figure 34:
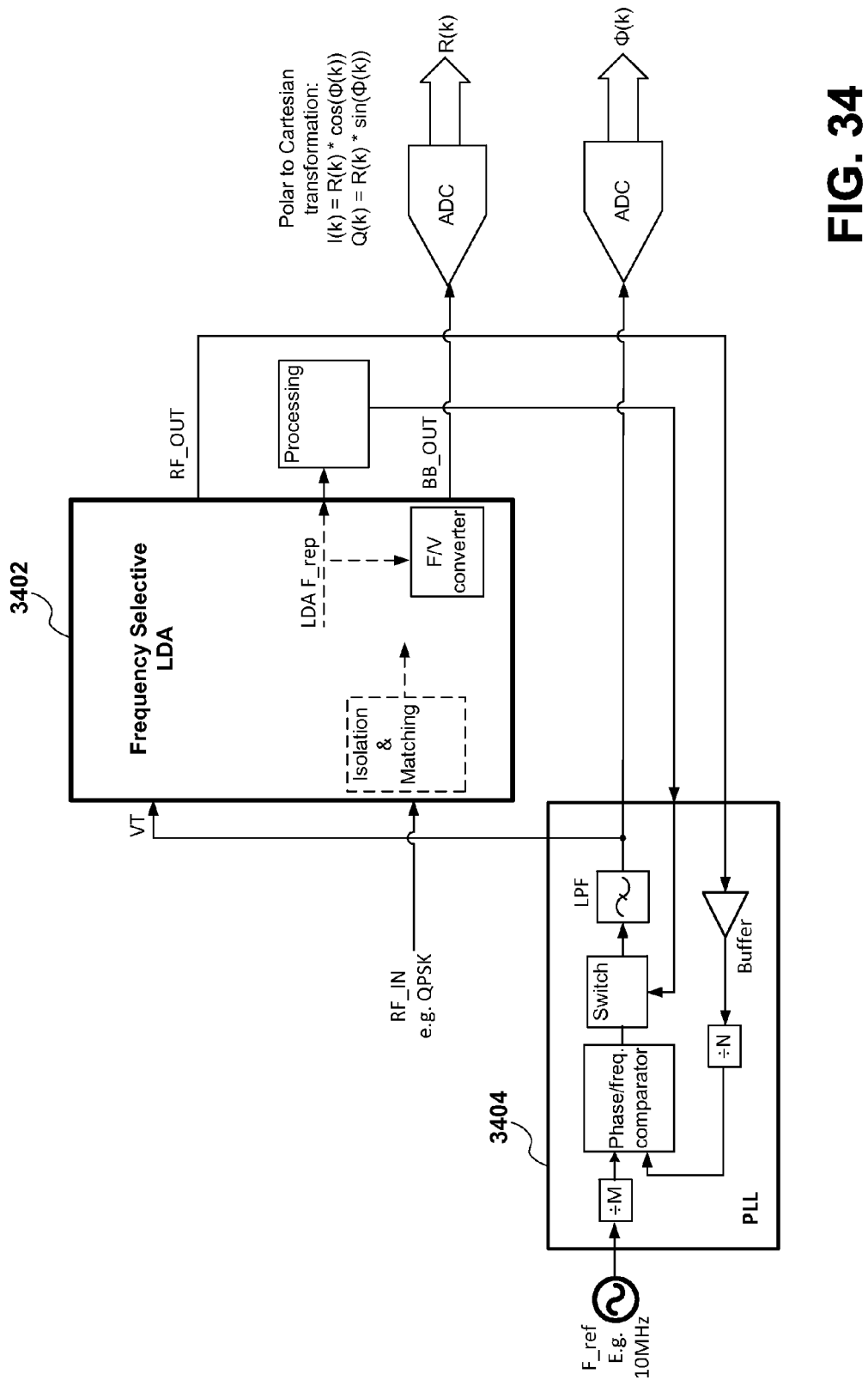
FIGS. 34, 35 and 36 are block diagrams illustrating a LDA as a QPSK demodulator, each in accordance with an embodiment.
Figure 35:
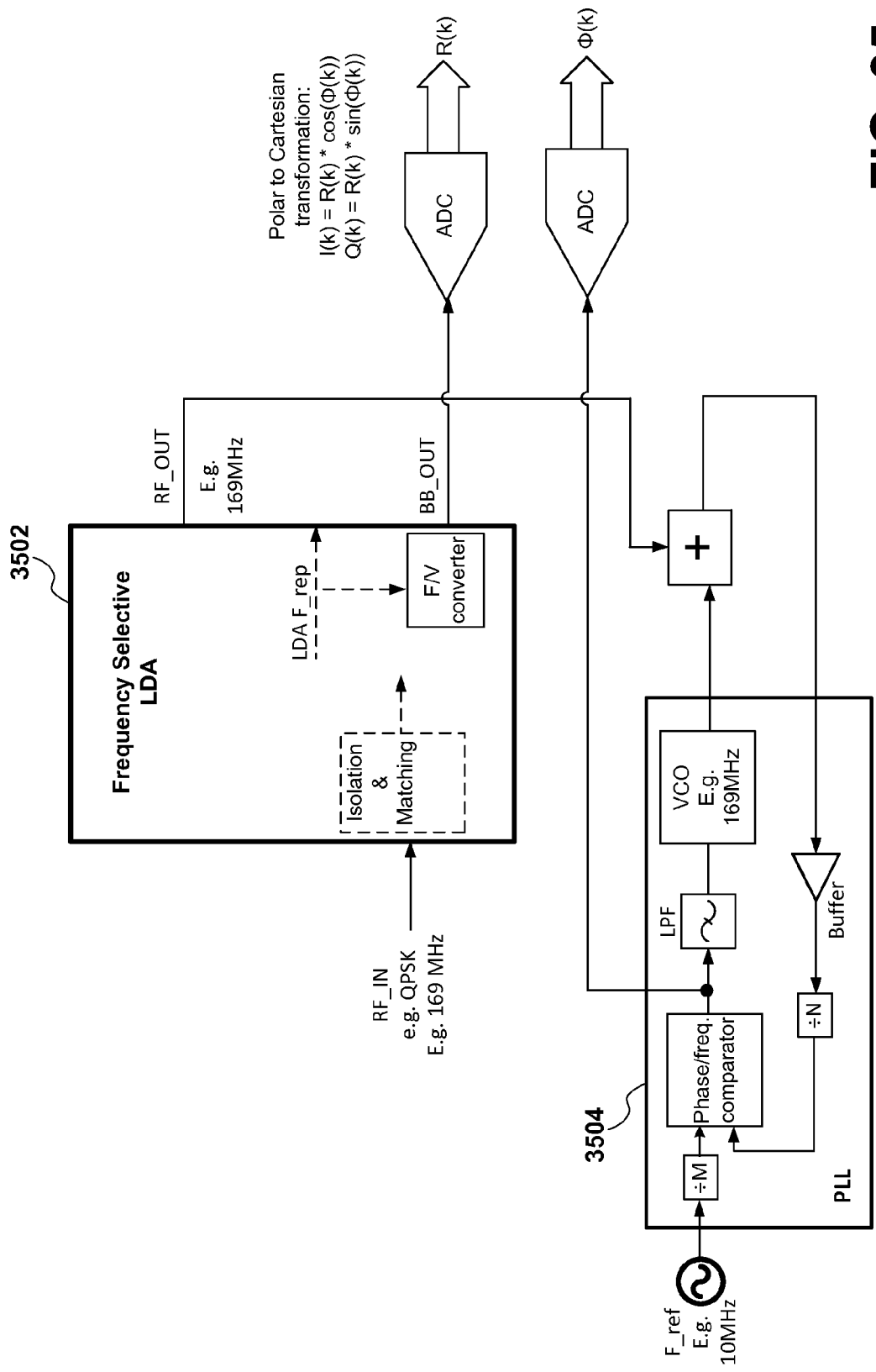
Figure 36:
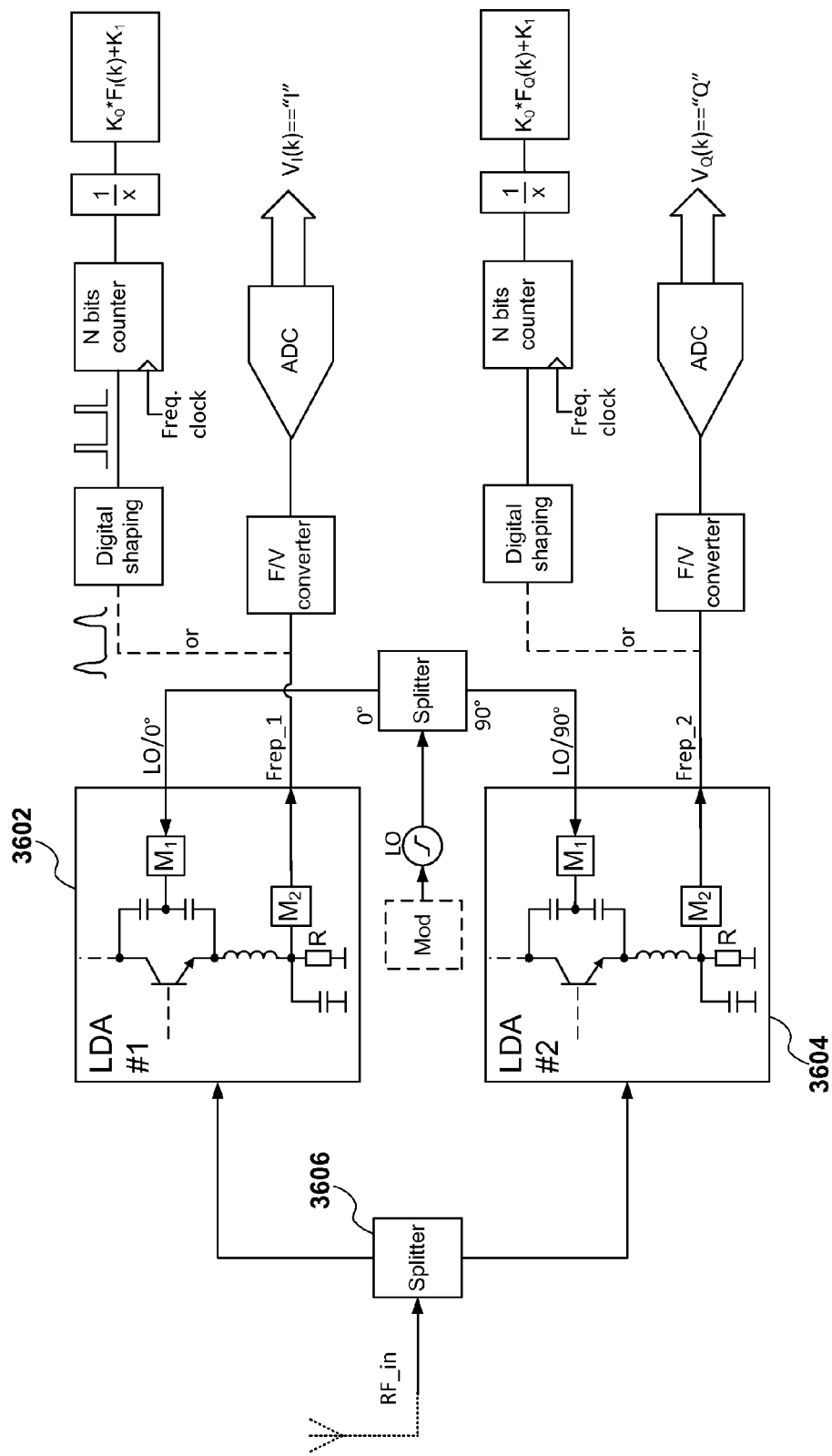

Referring now to FIGS. 34, 35 and 36, the LDAs described herein may also be implemented as QPSK demodulators. In the embodiment illustrated in FIG. 34, the frequency selective LDA 3402 is coupled with PLL 3404 so as to demodulate by phase. The output is module and phase (polar) and may be computed to I and Q based on the polar to Cartesian transformation formulas:

$$I(k)=R(k)*\cos(\Phi(k))$$

$$Q(k)=R(k)*\sin(\Phi(k))$$

The timing of the illustrated circuit is sensitive and the PLL 3404 needs to be enabled with the right timing. Receive (RX) sensitivity may be limited due to the PLL's limited sensitivity.

The embodiment of FIG. 35 is similar to FIG. 34, in that it may also provide RX sensitivity, but the timing is not as sensitive. In this embodiment, the LDA 3502 is coupled with the PLL 3504 so as to demodulate phase. The output is module and phase (polar) and can be computed to I and Q based on the same transformation formulas described with respect to FIG. 34. With respect to FIG. 35, RX sensitivity may be limited due the PLL's limited sensitivity.

A further embodiment of a QPSK demodulator is illustrated in FIG. 36. As previously described, this embodiment includes analog and/or semi-digital outputs that can provide I and Q in either analog or semi-digital form. The LDA1 3602 and LDA2 3602 may be combined as a NB LNA and ND demodulator, and include matching circuits M1/M2. The LO injection is through the 90 degree splitter 3606, or as previously described, through a 2*LO through a digital divider (not shown here, but described above). The 0 or 90 degree splitting can be done at two different points, as is convenient, such as the input splitter or the LO to LDA1 3602 and LDA2 3604 splitter. This embodiment provides a simple topology with a low component count that may be affordable to manufacture, including as an IC, and provides a high integration of functions, such as LNA, mixer, RX chain and homodyne conversion.

Figure 37:
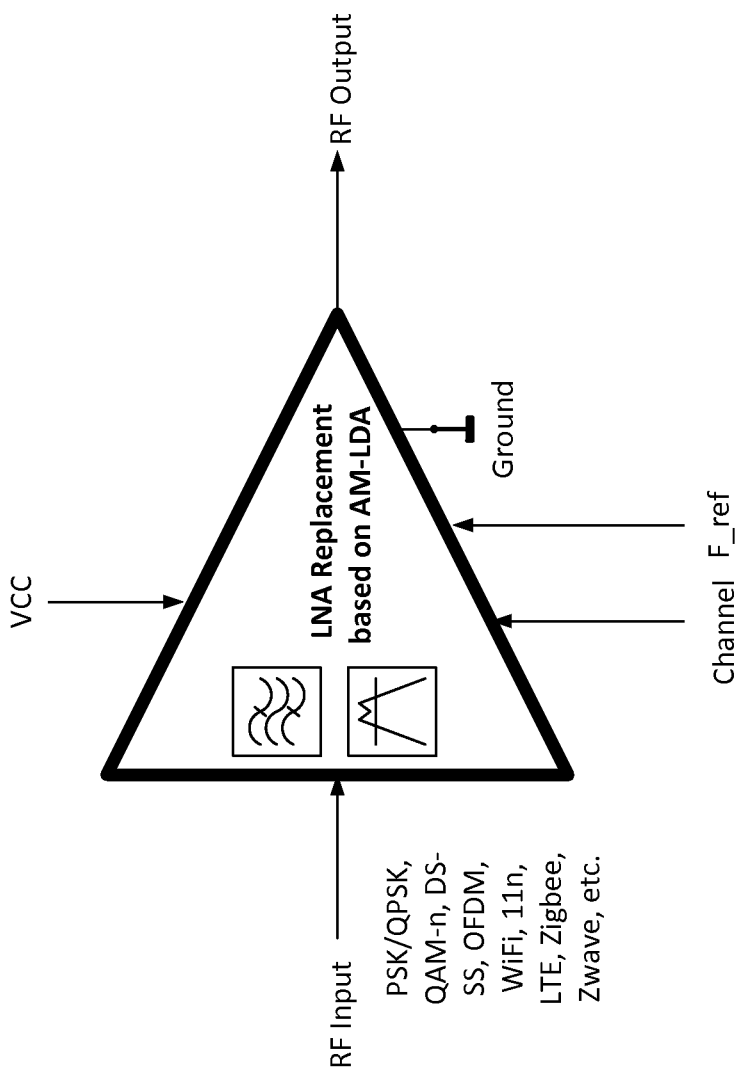
FIG. 37 is a diagram illustrating a model for an AM-LDA replacement for a LNA.

The LDA, in the form on an AM-LDA, may also be used to replace a LNA, especially low noise RF receive LNAs. A conceptual embodiment of such an AM-LDA is illustrated in FIG. 37. Due to the regenerative properties of the LDA, the SNR of the AM-LDA amplifier would be better. Such a device would also have high sensitivity and a high output level and could be used to replace the most expensive LNAs in the RX chain. Other benefits that an AM-LDA has over a low noise LNA include: high level of amplification (e.g., as much as 100 dB versus a LNA with only 12-20 dB), low power, high selectivity to the frequency band and the channel (with no need for a band pass filter), superior interference rejection (versus none of a LNA), a high skirt ratio (i.e., the ability to distinguish a weak channel from a strong channel nearby, versus no such ability), resilience to near far effect (i.e., saturation due to interference, versus low resilience), and a high dynamic range and log conversion (i.e., output level is constant over a large dynamic range). As previously discussed, the RF output may be semi-digital, which enables synchronization with a baseband block, output in quasi digital pulses, and synchronization with symbol rate.

Figure 38:
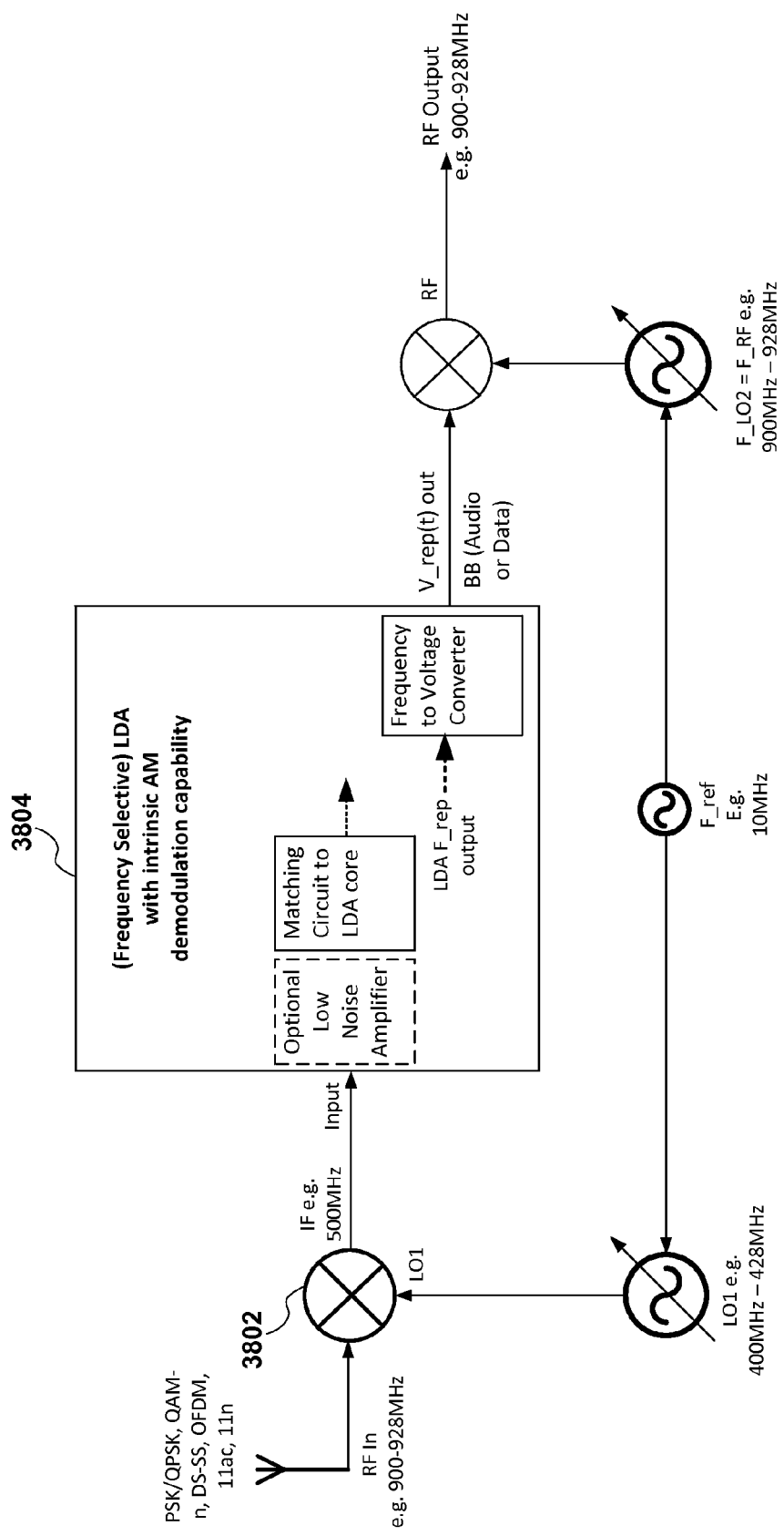
FIG. 38 is a block diagram illustrating a super-heterodyne AM-LDA replacement for a LNA in accordance with an embodiment.

One implementation embodiment of the AM-LDA, as described with respect to FIG. 37, is illustrated in FIG. 38. This implementation includes a standard super-heterodyne 3802 at the first stage that brings the RF signal to a fix IF. The LDA 3804 may be a frequency selective LDA with intrinsic AM demodulation capabilities (also referred to as a LDA with universal demodulation). The output of the LDA may be down converted first in a low IF at the repetition rate F_rep_out(t) and later in baseband BB v_rep(t), at which point the signal still carries the amplitude and phase information. Thereafter, the baseband signal may be up-converted to the former RF frequency.

An advantage of the AM-LDA circuit illustrated in FIG. 38 is that the band pass filter (BPF) can be removed (at a saving of some $0.25 per circuit in volume) since the LDA is already frequency selective. This LNA replacement also has higher sensitivity than that of a regular LNA due to the regenerative properties of the LDA's regenerative signal. This LNA replacement may also reject interferences (co-channel or adjacent) since it is locked to the wanted channel in phase. Other characteristics of the AM-LDA are similar to the circuit of FIG. 36 previously discussed.

Figure 39:
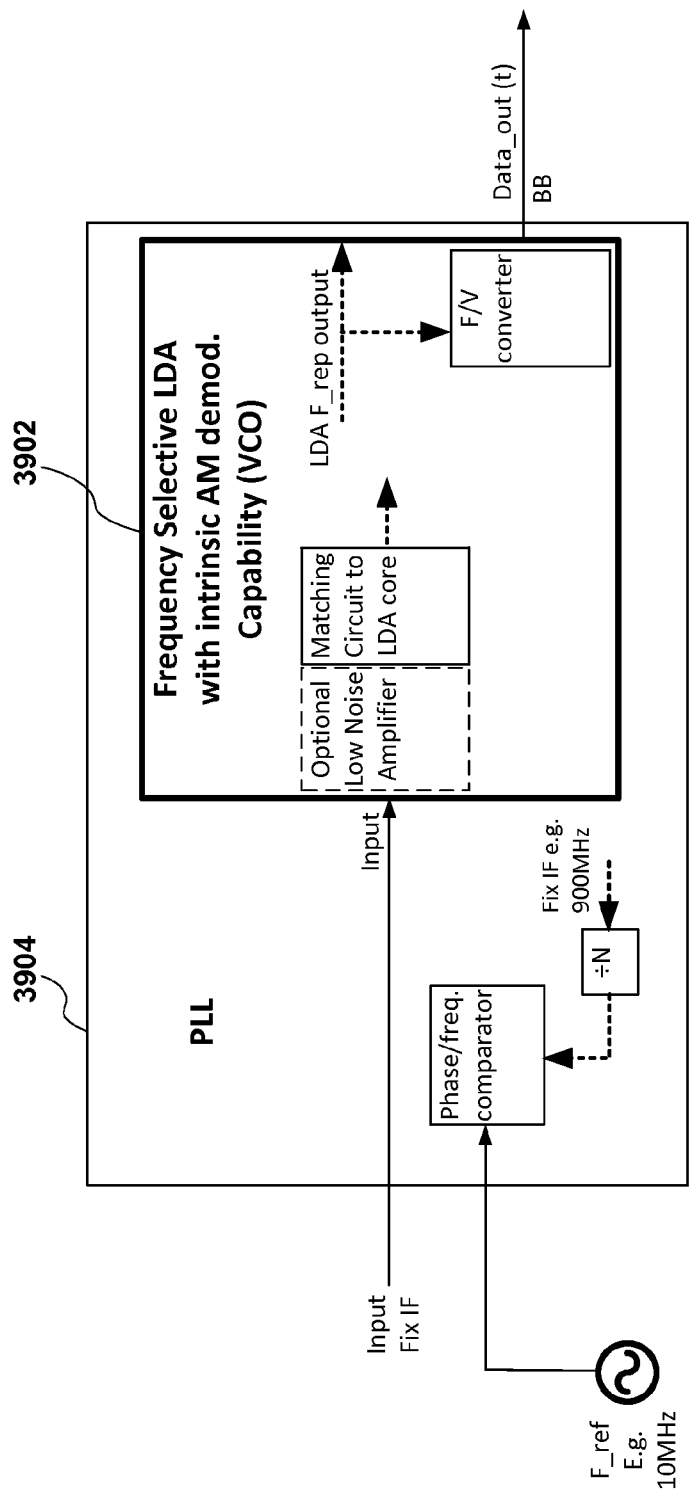
FIG. 39 is a block diagram illustrating an AM-LDA and PLL replacement for a LNA in accordance with an embodiment.

Another embodiment of the LNA replacement AM-LDA described with respect to FIG. 38 is illustrated in FIG. 39. The block schematic of this embodiment is identical to that of FIG. 38, except that the AM-LDA 3804 is replaced by a AM-LDA 3902 with a PLL 3904. The addition of the PLL 3904 serves to stabilize the LDA'S VCO accurately to a stable local frequency reference and helps to avoid variations, such as drift with temperature.

Figure 40:
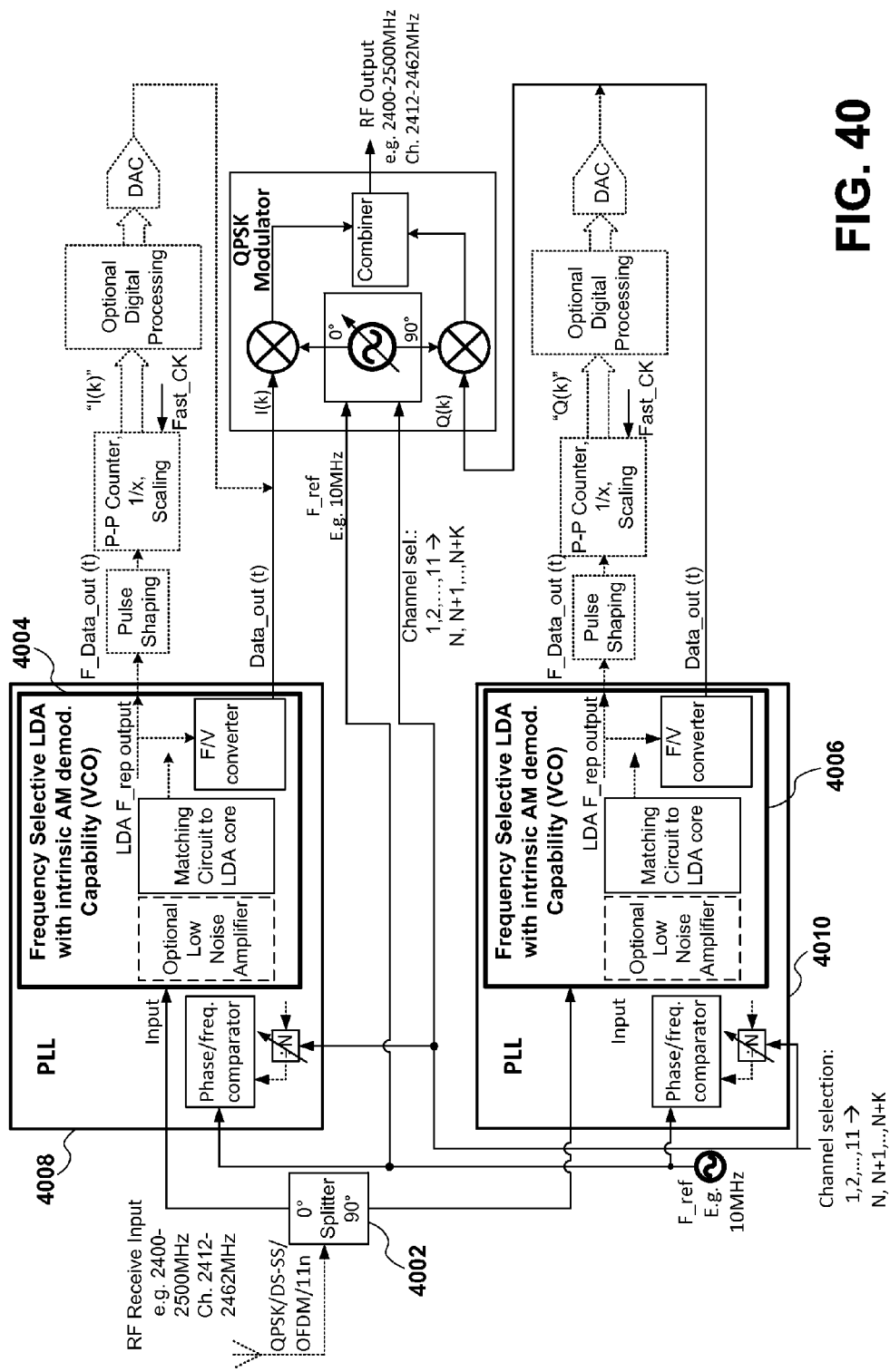
FIG. 40 is a block diagram illustrating a replacement for a LNA based on a quadratic splitter, dual AM-LDAs and PLLs for a complex modulation QPSK, n-PSK or n-NQAM in accordance with an embodiment

A further embodiment of a LNA replacement is illustrated in FIG. 40. The topology for this embodiment uses QPSK demodulation and QPSK re-modulation. The input RF signal is split with a quadrature splitter 4002 to create the 0 and 90 degree components. A dual LDA arrangement, with each LDA 4004 and 4006 locked into a PLL 4008 and 4010, respectively, is used. Each PLL 4008 and 4010 uses the same reference oscillator and each PLL receives the channel information to which to lock.

The output of each LDA 4004 and 4006 may use the BB demodulated data_out(t) and feed the I and Q inputs ports of a QPSK modulator. The end result is the same RF signal as the input but with higher receive levels, higher selectivity, and higher sensitivity.

In an another embodiment, the repetition frequency F_data_out(t) of each LDA may be processed digitally in accordance with the same methods described above to measure the instantaneous frequency and reconvert it in analog form, which can then be processed by the QPSK modulator.

Figure 41:
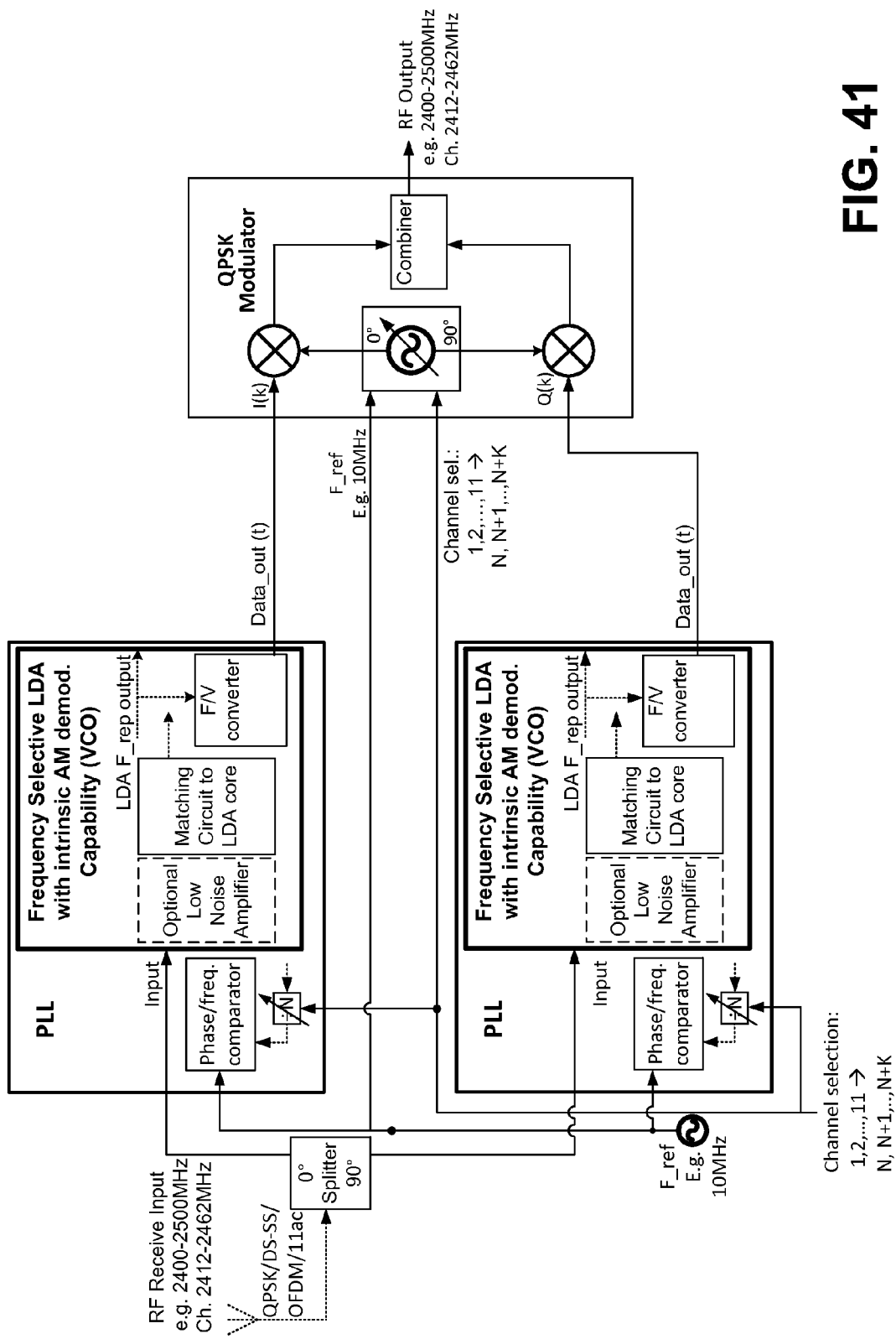
FIG. 41 is a block diagram illustrating a replacement for a LNA based on a quadratic splitter, dual AM-LDAs and PLLs, without output options, for a complex modulation QPSK, n-PSK or n-NQAM in accordance with an embodiment

FIG. 41 illustrates one further embodiment of the LNA replacement, which is the same as FIG. 40, but where the LDA analog outputs are utilized.

Figure 42:
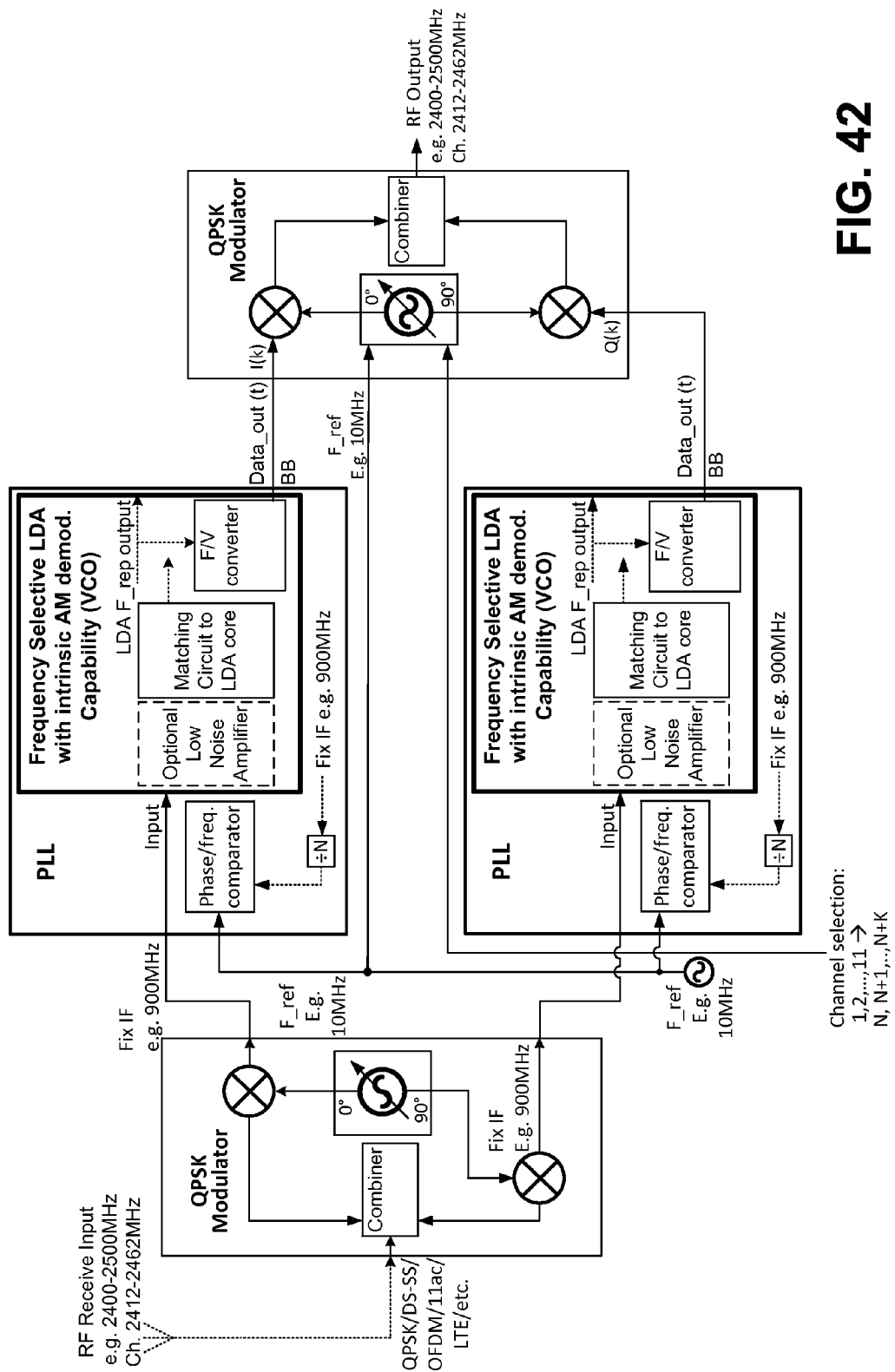
FIG. 42 is a block diagram illustrating a replacement for a LNA based on a QSPK demodulator as front end and dual AM-LDAs and PLLs for a complex modulation QPSK, n-PSK or n-NQAM in accordance with an embodiment.
Figure 43:
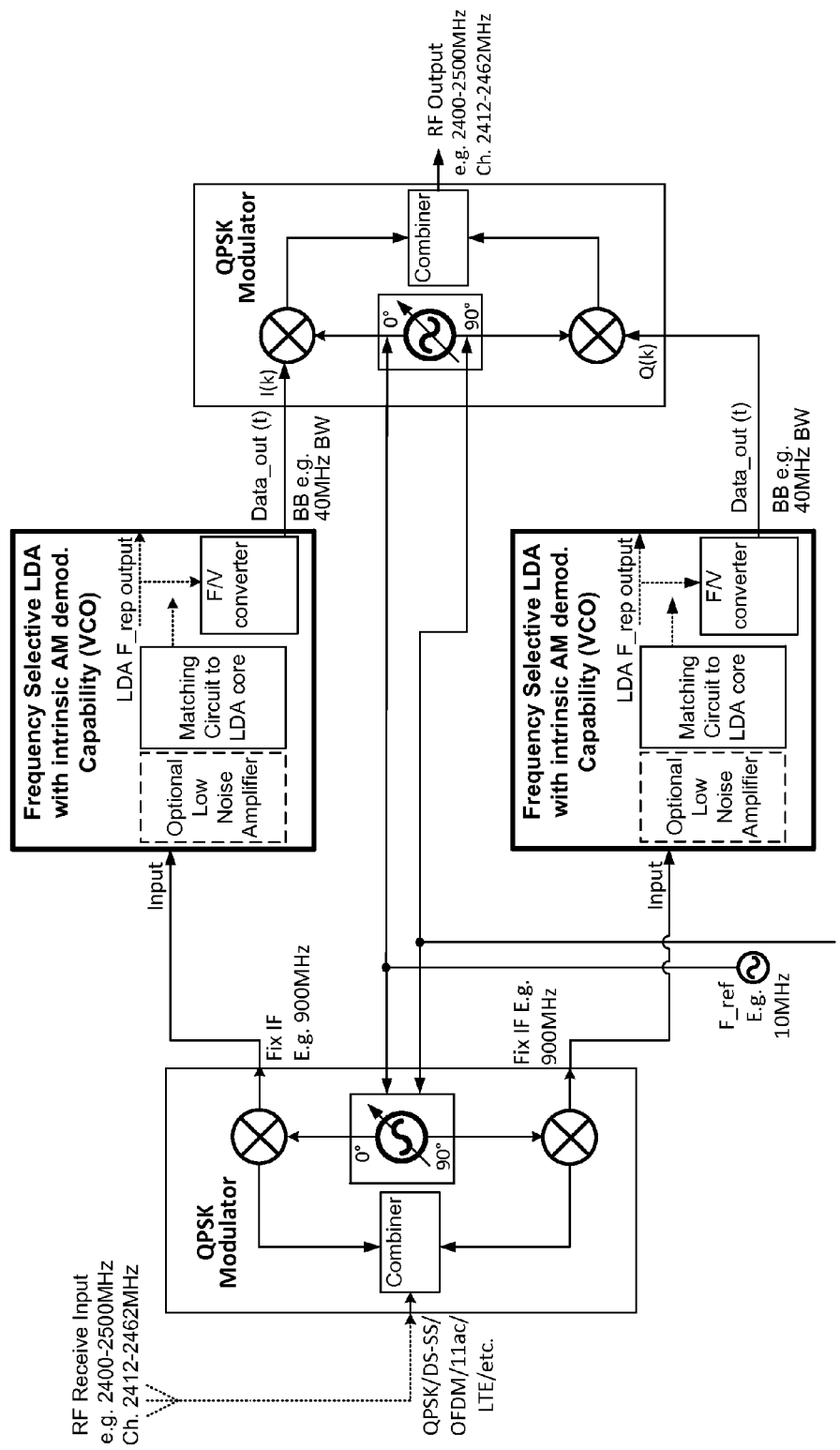
FIG. 43 is a block diagram illustrating a replacement for a LNA based on a QSPK demodulator as front end and dual AM-LDAs for a complex modulation QPSK, n-PSK or n-NQAM in accordance with an embodiment.

FIGS. 42 and 43 illustrate two embodiments of a LNA replacement based on a QPSK demodulator, but similar in other respects to FIG. 40. In the embodiment of FIG. 42, a QPSK demodulator and modulator are used in conjunction with dual LDAs, both of which are further locked in a PLL to avoid any variation due to temperature or other parameters. In the embodiment of FIG. 43, a QPSK demodulator and modulator are used in conjunction with dual LDAs, but the LDAs do not require PLLs, based on the assumption that there may be only small variations or drift due to temperature or other parameters.

Figure 44:
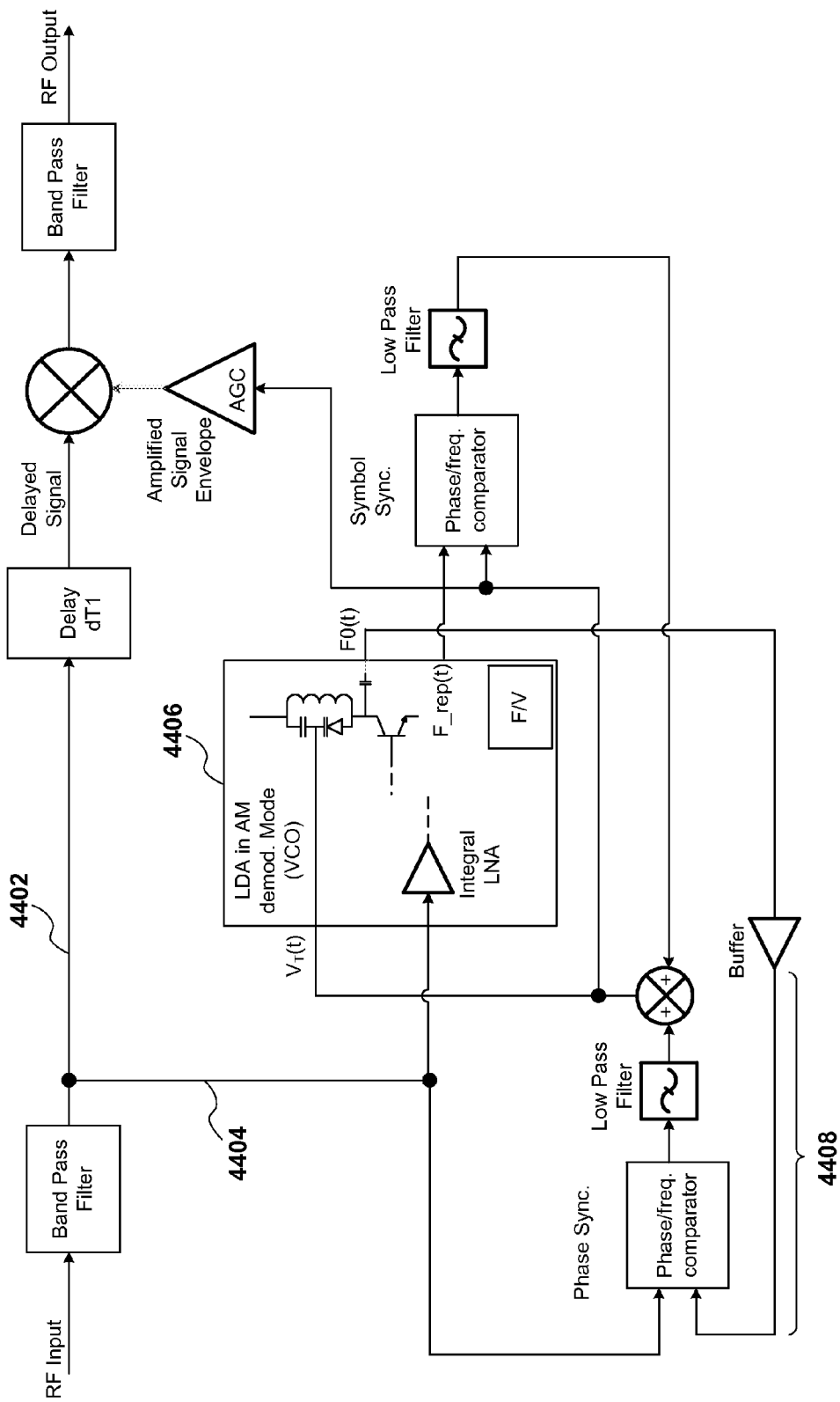
FIG. 44 is a block diagram illustrating a replacement for a LNA based on a AM-LDAs and envelope elimination restoration EER in accordance with an embodiment.

A final embodiment of a LNA replacement is illustrated in FIG. 44. In this embodiment, the input signal is split in two and multiplied to form, after a BPF, an output signal that is similar to the input signal, but significantly amplified with a very low NF exhibiting superior RF RX sensitivity. In the first branch 4402, the RF input signal is delayed by a fixed delay. In the second branch 4404, the envelope of the input signal is extracted with a LDA 4406 connected in a double loop PLL 4408. The first loop of the PLL 4408 locks in phase the LDA to the phase of the input CW signal. The second loop of the PLL 4408 locks the PLL to the modulation (envelope) of the input signal in phase. The envelope signal is shaped correctly (1 or 0) and feeds the multiplier of the first branch. If the amplitude of the envelope is G time higher than the input envelope, the output signal is then multiplied by a gain of value G.

Figure 45:
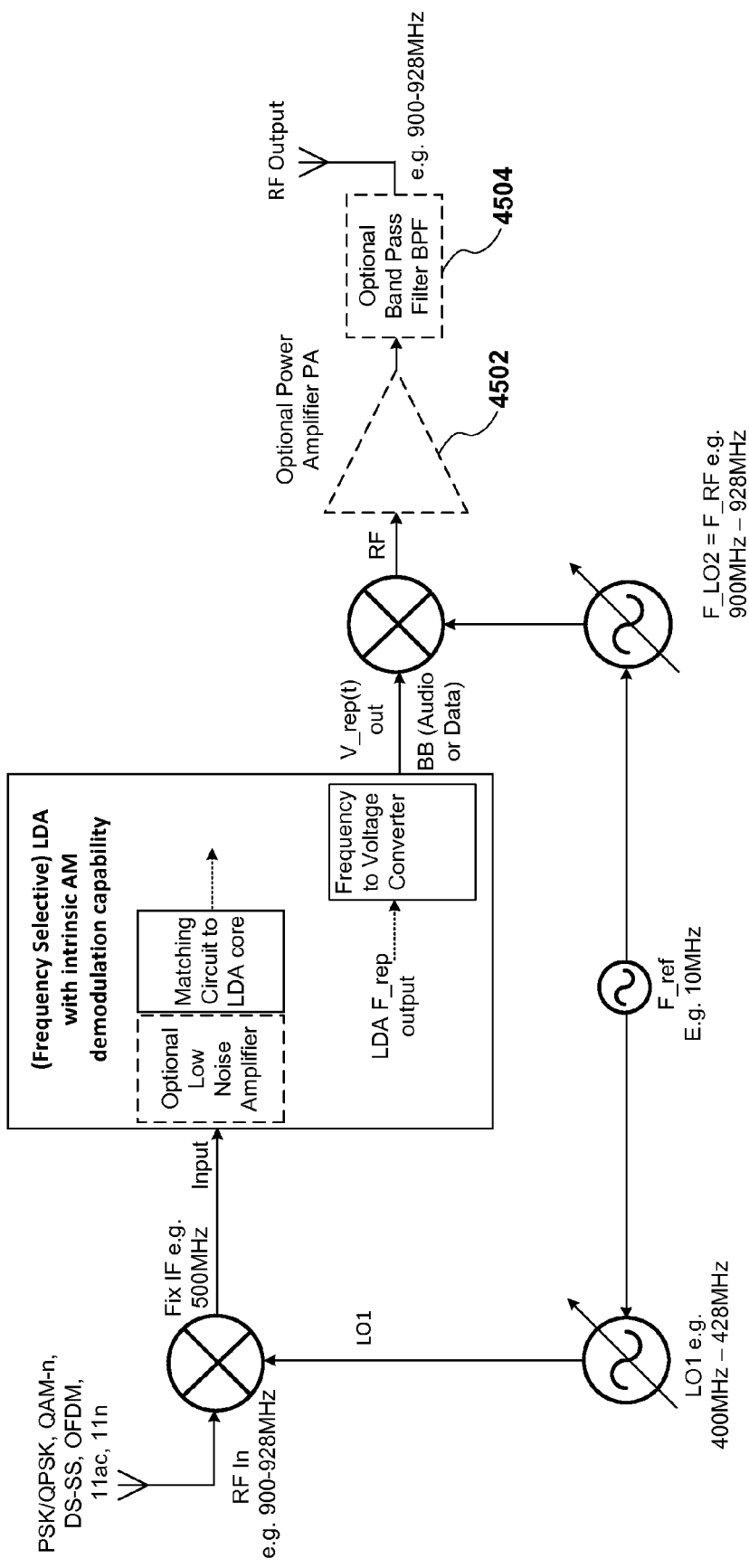
FIG. 45 is a block diagram illustrating a super-heterodyne wireless repeater in accordance with an embodiment.

As illustrated with respect to FIG. 45, the AM-LDA may also be implemented as a wireless repeater. The block schematic for the wireless repeater is very similar to the LNA replacement embodiments illustrated and described above with respect to FIGS. 37 to 44. In fact, any of the embodiments described above in FIGS. 37 to 44 may be used for a repeater with a few modifications. First, the mixer output is followed by an optional power amplifier 4502 and an optional band pass filter 4504. Second, the signal feeds the antenna and is transmitted by wireless. In any such wireless repeater embodiment, the RF output frequency is not the same as the source, if simultaneous repeating occurs. In other word, the output channel cannot be the same as the input channel.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

In general, the various features and processes described above may be used independently of one another, or may be combined in different ways. All possible combinations and subcombinations are intended to fall within the scope of this disclosure. In addition, certain methods or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. The example systems and components described herein may be configured differently than described. For example, elements may be added to, removed from, or rearranged compared to the disclosed examples.

While certain example or illustrative examples have been described, these examples have been presented by way of example only, and are not intended to limit the scope of the subject matter disclosed herein. Indeed, the novel methods and systems described herein may be embodied in a variety of other forms. The accompanying claims and their equivalents are intended to cover such forms or modifications as would fall within the scope and spirit of certain of the subject matter disclosed herein.

What is claimed:

1. A logarithmic amplifier, comprising:
    an amplifier circuit configured to receive an input signal at an amplifier input, oscillate the input signal, and generate a first output signal at an amplifier output, wherein the input signal includes a modulated signal to be detected and electrical noise;
    a feedback circuit coupled to the amplifier output and the amplifier input and configured to establish a 180 degree phase shift between the input signal and the first output signal, the feedback circuit including a single capacitor configured to maintain oscillation of the input signal;
    a parallel resonant circuit directly connected to the amplifier output and configured to cause the amplifier circuit to resonate at or around a center frequency; and
    a controller circuit directly connected to the amplifier input and configured to cyclically terminate oscillation of the input signal each time a pre-determined threshold of voltage is detected, the controller circuit including a low pass filter configured to generate a second output signal having a repetition frequency.

2. The logarithmic amplifier of claim 1, wherein the modulated signal is amplitude modulated or phase modulated, wherein the first output signal has an approximate bell shape in the frequency domain, and wherein the modulated signal is demodulated when a frequency of the input signal is adjusted to a center of the bell shape.

3. The logarithmic amplifier of claim 1, wherein the controller circuit includes an RC circuit and the low pass filter is a combination of a RC circuit and a diode coupled between the amplifier input and the RC circuit.

4. The logarithmic amplifier of claim 1, wherein the controller circuit includes an RC circuit and the low pass filter is a combination of a RC circuit and an inductor coupled between the amplifier input and the RC circuit.

5. The logarithmic amplifier of claim 1, further comprising a bias coupled to the amplifier input.

6. The logarithmic amplifier of claim 5, wherein the bias is configured to temperature compensate the amplifier circuit.

7. The logarithmic amplifier of claim 5, wherein the bias is a temperature compensated constant current feed.

8. The logarithmic amplifier of claim 1, further comprising a low pass filter coupled to the amplifier output and configured to generate a third output signal that is a substantially regenerated time sampled copy of the envelope of the input signal including any modulation after any RF frequency component has been removed.

9. The logarithmic amplifier of claim 8, further comprising a temperature controlled bias coupled to the amplifier input.

10. The logarithmic amplifier of claim 8, further comprising a matching circuit coupled between the amplifier output and the low pass filter.

11. The logarithmic amplifier of claim 8, further comprising an anti-aliasing filter and an analog-to-digital converter coupled to an output of the low pass filter.

12. The logarithmic amplifier of claim 8, further comprising a frequency to voltage converter, an anti-aliasing filter, and an analog-to-digital converter coupled to an output of the low pass filter.

13. The logarithmic amplifier of claim 8, further comprising a digital shaper, a frequency meter, and a scaling circuit coupled to an output of the low pass filter.

14. The logarithmic amplifier of claim 1, further comprising one or more matching circuits coupled to the input of the amplifier input.

15. The logarithmic amplifier of claim 14, further comprising an isolator coupled to the amplifier input or coupled between the one or more matching circuits.

16. The logarithmic amplifier of claim 15, further comprising a matching network and a low pass filter coupled to the amplifier output and configured to generate a third output signal.

17. The logarithmic amplifier of claim 15, further comprising a matching network and a low pass filter coupled to the amplifier input and configured to generate a third output signal.

18. The logarithmic amplifier of claim 15, further comprising a matching network and a low pass filter coupled to the parallel resonant circuit and configured to generate a third output signal.

19. The logarithmic amplifier of claim 15, further comprising a matching network coupled to the low pass filter and configured to generate the second output signal.

20. The logarithmic amplifier of claim 1, further comprising:
    a super-heterodyne stage coupled to the amplifier input, configured to translate the input signal to an intermediate frequency; and
    a phase locked loop (PLL) coupled to the amplifier circuit, configured to voltage feed the oscillations of the input signal, and configured to output phase information of the input signal at a PLL output.

21. The logarithmic amplifier of claim 20, further comprising:
    an analogue to digital converter (ADC) coupled to the PLL output, configured to convert the phase information to quadrature information.

22. The logarithmic amplifier of claim 20, further comprising:
    one or more matching circuits coupled in between the super-heterodyne stage and the amplifier input; and
    an isolator coupled to the amplifier input or coupled between the one or more matching circuits.

23. The logarithmic amplifier of claim 1, further comprising:
    a phase locked loop (PLL) coupled to the amplifier circuit, configured to voltage feed the oscillations of the input signal, and configured to output phase information of the input signal at a PLL output.

24. The logarithmic amplifier of claim 20, further comprising:
    an analogue to digital converter (ADC) coupled to the PLL output, configured to convert the phase information to quadrature information.

25. The logarithmic amplifier of claim 1, further comprising:
    a phase locked loop (PLL) coupled to the amplifier output, configured to output module and phase information of the input signal at a PLL output.

26. The logarithmic amplifier of claim 25, wherein the PLL is configured to voltage feed the oscillations of the input signal, and wherein the PLL further comprises a switch that is fed by the second output signal of the amplifier circuit.

27. The logarithmic amplifier of claim 25, wherein the PLL further comprises:
    a feedback loop coupled with the amplifier output; and
    a phase/frequency comparator, wherein the PLL output is coupled to the phase/frequency comparator.

28. An amplitude demodulator, comprising:
    a logarithmic amplifier detector (LDA) circuit, including:
        an amplifier circuit configured to receive an input signal at an amplifier input, oscillate the input signal, and generate a first output signal at an amplifier output, wherein the input signal includes a modulated signal to be detected and electrical noise;
        one or more matching circuits coupled to the input of the amplifier input;
        an isolator coupled to the amplifier input or coupled between the one or more matching circuits;
        a feedback circuit coupled to the amplifier output and the amplifier input and configured to establish a 180 degree phase shift between the input signal and the first output signal, the feedback circuit including a single capacitor configured to maintain oscillation of the input signal;
        a parallel resonant circuit connected to the amplifier output and configured to cause the amplifier circuit to resonate at or around a center frequency; and
        a controller circuit connected to the amplifier input and configured to cyclically terminate oscillation of the input signal each time a pre-determined threshold of voltage is detected, the controller circuit including a low pass filter configured to generate a second output signal having a repetition frequency; and
    a phase lock loop (PLL) circuit coupled to the LDA circuit and configured to lock the center frequency of the LDA circuit to a reference frequency.

29. The amplitude demodulator of claim 28, wherein the LDA circuit further includes a temperature compensated bias coupled to the amplifier input.

30. The amplitude demodulator of claim 29, wherein the PLL circuit includes a sampler coupled to a controller of a switch, a comparator coupled to a first side of the switch, and a low pass filter to a second side of the switch, wherein the first output signal or the second output signal is coupled to the sampler, wherein the switch is open when the comparator is disconnected and a quenching pulse is not present and the switch is closed when the comparator is connected and the quenching pulse is present, wherein the switch enables the low pass filter to couple the PLL to an input of the temperature compensated bias, and wherein the comparator is fed by the amplifier output divided by N and is fed from the reference frequency divided by M.

* * * * *